United States Patent [19]

Sakaguchi et al.

[11] Patent Number: 5,439,843
[45] Date of Patent: Aug. 8, 1995

[54] METHOD FOR PREPARING A SEMICONDUCTOR SUBSTRATE USING POROUS SILICON

[75] Inventors: Kiyofumi Sakaguchi; Takao Yonehara, both of Atsugi; Mamoru Miyawaki, Isehara, all of Japan

[73] Assignee: Canon Kabushiki Kaisha, Tokyo, Japan

[21] Appl. No.: 301,263

[22] Filed: Sep. 6, 1994

Related U.S. Application Data

[63] Continuation of Ser. No. 11,221, Jan. 29, 1993, abandoned.

[30] Foreign Application Priority Data

Jan. 31, 1992 [JP] Japan ................. 4-040584
Jan. 31, 1992 [JP] Japan ................. 4-046303
Jan. 31, 1992 [JP] Japan ................. 4-046304
Jan. 31, 1992 [JP] Japan ................. 4-046305

[51] Int. Cl.[6] .......................... H01L 21/20
[52] U.S. Cl. ......................... 437/71; 437/83; 437/84; 437/86; 437/62
[58] Field of Search ............ 437/62, 83, 84, 71, 437/86, 974; 148/DIG. 135

[56] References Cited

U.S. PATENT DOCUMENTS

| | | | |
|---|---|---|---|
| 3,997,381 | 12/1976 | Wanlass | 156/3 |
| 4,380,865 | 4/1983 | Frye et al. | 156/603 |
| 4,459,181 | 7/1984 | Benjamin | 205/124 |
| 4,649,627 | 3/1987 | Abernathey et al. | 148/DIG. 135 |
| 4,743,568 | 5/1988 | Wood | 148/DIG. 135 |
| 4,800,527 | 1/1989 | Ozaki et al. | 365/182 |
| 4,868,140 | 9/1989 | Yonehara | 437/109 |
| 5,010,033 | 4/1991 | Tokunaga et al. | 437/83 |
| 5,010,033 | 4/1991 | Tokunaga et al. | 437/83 |
| 5,013,681 | 5/1991 | Goodbey et al. | 437/83 |

FOREIGN PATENT DOCUMENTS

| | | | |
|---|---|---|---|
| 53-45675 | 12/1978 | Japan . | |
| 55-16464 | 2/1980 | Japan . | |
| 0149749 | 9/1982 | Japan | 437/71 |
| 0197740 | 11/1983 | Japan | 437/71 |
| 0018656 | 1/1984 | Japan | 437/71 |
| 0018657 | 1/1984 | Japan | 437/71 |
| 0144149 | 8/1984 | Japan | 437/71 |
| 0292935 | 12/1986 | Japan | 437/71 |

OTHER PUBLICATIONS

"Crystalline Quality of Silicon Layer Formed by Fipos Technology", K. Imai et al., Journal of Crystal Growth, vol. 63, No. 3, Oct. 11, 1983, pp. 547–553.

"Electrolytic Shaping of Germanium and Silicon", A. Uhlir, Jr., The Bell System Technical Journal, Mar. 1956, pp. 333–347.

"Formation Mechanism of Porous Silicon Layer by Anodization in HF Solution", T. Unagami, Journal of the Electrochemical Society, vol. 127, No. 2, Feb. 1980, pp. 476–483.

"A New Dielectric Isolation Method Using Porous Silicon", K. Imai, Solid State Electronics, vol. 24, 1981, pp. 159–164.

L. Vescan et al., "Low–Pressure Vapor–Phase Epitaxy of Silicon on Porous Silicon", Materials Letters, vol. 7, No. 3, Sep. 1988, pp. 94–98.

J. Crystal Growth, vol. 63, No. 3, Oct. 1983, pp. 429–590.

Primary Examiner—Robert Kunemund
Assistant Examiner—Ramamohan Rao
Attorney, Agent, or Firm—Fitzpatrick, Cella, Harper & Scinto

[57] ABSTRACT

A semiconductor substrate comprises an insulating layer and a compound semiconductor monocrystal thin film formed on said insulating layer, the thermal expansion coefficient of said insulating layer being in the range of 60%–140% of that of said monocrystal thin film.

15 Claims, 16 Drawing Sheets

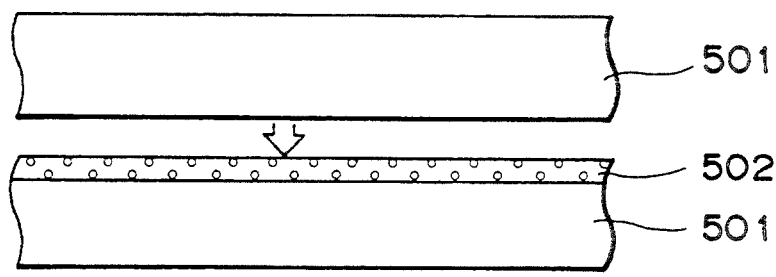
FIG. 16A
FIG. 16B
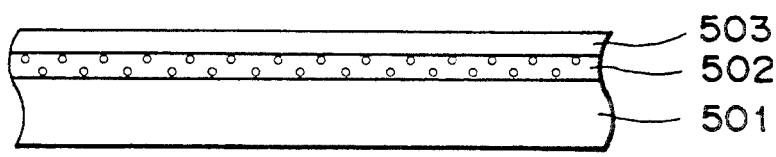
FIG. 16C
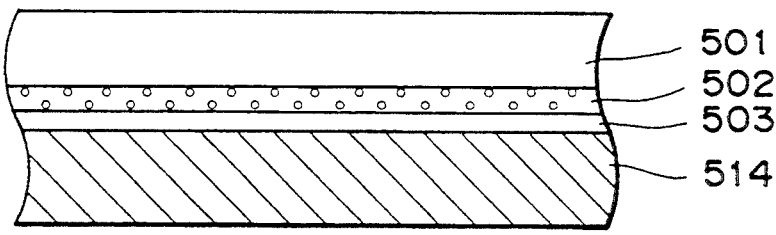
FIG. 16D
FIG. 16E
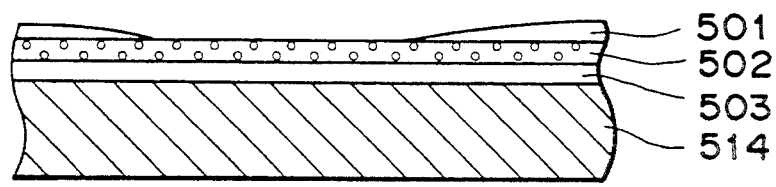
FIG. 16F
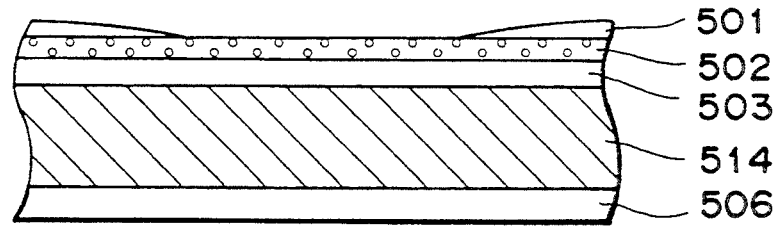
FIG. 16G
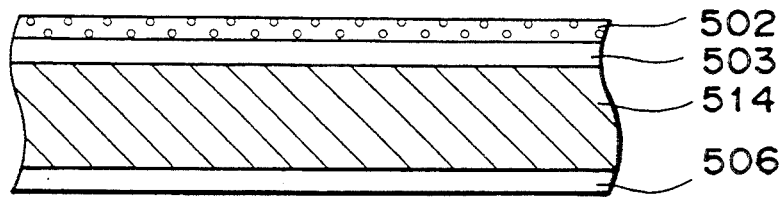
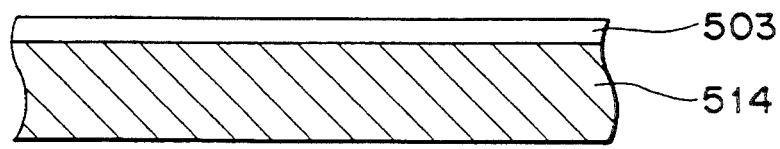

METHOD FOR PREPARING A SEMICONDUCTOR SUBSTRATE USING POROUS SILICON

This application is a continuation of application Ser. No. 08/011,221 filed Jan. 29, 1993, now abandoned.

BACKGROUND OF THE INVENTION

1. Field of the Invention

The present invention relates to a semiconductor substrate and a method for preparing the same. More specifically, it relates to a semiconductor substrate suitable for dielectric isolation, or an electronic device or an integrated circuit formed in a monocrystalline semiconductor layer on an insulator, and a method for preparing the semiconductor substrate.

2. Related Background Art

It is widely known that the formation of a monocrystalline semiconductor layer on an insulator is accomplished by a silicon on insulator (SOI) technique. A device formed by the utilization of the SOI technique has various advantages which cannot be achieved by a bulk Si substrate for use in the manufacture of a usual Si integrated circuit, and for this reason, many researches have been conducted. That is, by utilizing the SOI technique, the following advantages can be obtained:
1. dielectric isolation is easy, and high integration is possible,
2. excellent radiation resistance can be obtained,
3. floating capacity can be reduced, and speed up is possible,
4. a well step can be omitted,
5. latch up can be prevented, and
6. a complete depletion type field effect transistor can be obtained by the formation of a thin film.

In order to realize the above-mentioned many advantages based on device characteristics, research has focused on made about formation methods of the SOI structure over the last several decades. The content of the research is summarized in the following literature.

Special Issue: "Single-crystal silicon on non-single-crystal insulators"; edited by G. W. Cullen, Journal of Crystal Growth, Volume 63, No. 3, pp. 429–590 (1983).

From old times, SOS (silicon on sapphire) has been known which can be formed by the hetero-epitaxy of Si on a monocrystal sapphire substrate by the use of CVD (chemical vapor deposition). This has succeeded for the present as the best SOI technique. In this case, however, many crystal defects are formed owing to lattice mismatch in the interface between the Si layer and an underlying sapphire substrate. However, the Si layer tends to be contaminated with alumina coming from the sapphire substrate. Above all, the substrate of SOS is expensive and the development of area enlargement is slow, which prevents the expansion of its application. In relatively recent years, it has been attempted to realize the SOI structure without using the sapphire substrate. Attempt can be classified into the following three categories.

(1) After the surface oxidation of a Si monocrystal substrate, a window is formed to partially expose the Si substrate, and epitaxial growth is then carried out in a lateral direction, using the exposed portion as a seed, to form a Si monocrystal layer on $SiO_2$ (in this case, a Si layer is simultaneously deposited on $SiO_2$).

(2) The Si monocrystal substrate itself is used as an active layer, and $SiO_2$ is then formed under the same (in this procedure, no Si layer is deposited).

(3) After the epitaxial growth of Si on the Si monocrystal substrate, dielectric isolation is carried out (this method is accompanied by the deposition of the Si layer).

However, Si is an indirect transition type semiconductor, and in order to form an optical device such as a light emitting element, a monocrystal layer of the III–V group, particularly GaAs or the like of a direct transition type is required.

A method for preparing the monocrystal thin film of the III–V group comprises first forming a nucleus for the lattice information of the crystal or a stripe-like pattern from SiN or the like, and then growing it in accordance with MBE (molecular beam epitaxy) or MOCVD (metal organic CVD). However, the monocrystal region is limited to a region of at most several $\mu m$, and since a crystal direction is unsettled, it is difficult to apply the monocrystal thin film to semiconductor to provide still more integrated circuits.

In the case that a compound semiconductor such as GaAs is epitaxially grown on the Si substrate, the grown film is poor in crystallinity because of the difference between the lattice constant and the thermal expansion coefficient, and therefore it is very difficult to apply the grown film to devices.

SUMMARY OF THE INVENTION

An object of the present invention is to provide a III–V group monocrystalline substrate formed on an insulating layer which can solve the above-mentioned problems and meet the above-mentioned requirements, and to provide a method for preparing the substrate.

Another object of the present invention is to provide a method for preparing a semiconductor substrate which permits economical manufacture of a monocrystal compound semiconductor having a large area with high productivity and high uniformity under high control, and to provide the semiconductor substrate prepared by this method.

Still another object of the present invention is to provide a semiconductor substrate which comprises an insulating layer and a III–V group monocrystal thin film formed on the insulating layer, the thermal expansion coefficient of the insulating layer being in the range of 60%–140% of that of the monocrystal thin film; and a method for preparing a semiconductor substrate which comprises the steps of forming a III–V group monocrystal semiconductor thin film on a porous monocrystal semiconductor substrate via a semiconductor monocrystal thin film having the same properties as in the porous monocrystal, bonding another member to the III–V group monocrystal semiconductor thin film of the above-mentioned member via an insulating layer having a thermal expansion coefficient in the range of 60%–140% of the thermal expansion coefficient of the III–V group monocrystal semiconductor, and then removing the porous monocrystal and the monocrystal thin film having the same properties as in the porous monocrystal by etching.

BRIEF DESCRIPTION OF THE DRAWINGS

Each of FIGS. 1 to 16 is a schematic view illustrating one embodiment of a method for preparing a semiconductor substrate of the present invention.

DETAILED DESCRIPTION OF PREFERRED EMBODIMENTS

Figure 1A:
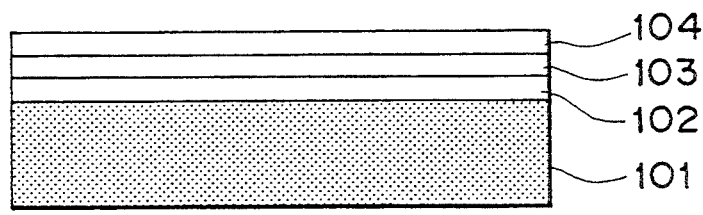

Preferable aspects regarding a semiconductor substrate of the present invention are as follows. That is, a semiconductor substrate of the present invention comprises an insulating layer and a compound semiconductor monocrystal thin film formed on the insulating layer, the thermal expansion coefficient of the insulating layer being in the range of 60%–140% of that of the monocrystal thin film.

A first aspect of a method for preparing a semiconductor substrate of the present invention comprises the steps of forming a monocrystal compound semiconductor thin film on a porous monocrystal semiconductor substrate via a semiconductor monocrystal thin film of the same kind of material as the porous monocrystal, thereby preparing a first member, bonding a second member to the monocrystal compound semiconductor thin film of the first member via an insulating layer having a thermal expansion coefficient in the range of 60%–140% of the thermal expansion coefficient of the monocrystal compound semiconductor, and then removing the porous monocrystal and the monocrystal thin film of the same kind material as the porous monocrystal by etching.

A second aspect of the method for preparing the semiconductor substrate of the present invention comprises the steps of making a surface layer porous on at least the main surface side of a first Si substrate, oxidizing the inside walls of the pores of the porous Si layer, forming a monocrystal compound semiconductor layer on the porous Si layer, a bonding the surface of the monocrystal compound semiconductor layer to the main surface of a second substrate other than the first Si substrate, a first etching step of removing the first Si substrate by selective etching after the bonding step, and a second etching step of removing the exposed porous Si layer by selective etching with an etching solution having a high Si etching rate to the compound semiconductor after the first etching step.

The present invention covers a semiconductor substrate obtained by the method for preparing the semiconductor substrate.

The semiconductor substrate of the present invention has an excellent monocrystal compound semiconductor region having a long carrier life time, extremely few defects and a uniform film thickness on the insulator, and thus it is applicable to various semiconductor devices. Furthermore, the semiconductor member of the present invention can be applied to semiconductor devices having high responsiveness and high reliability.

The preparation method of the semiconductor member of the present invention is excellent in productivity, uniformity, controllability and economy in obtaining, on the insulator, the monocrystal compound semiconductor layer in which crystallinity is so excellent as to be comparable to a monocrystal wafer.

The preparation method of the semiconductor member of the present invention permits doing the treatment effectively in a short period of time, and so it is excellent in productivity and economy, as described in detail in the undermentioned examples.

Furthermore, in the present invention, the selective etching is carried out in two steps, and therefore the monocrystal compound semiconductor layer can be easily obtained which is uniform and flat over a large area and which has extremely excellent crystallinity.

Now, the present invention will be described in reference to embodiments.

Embodiment 1

As shown in FIG. 1A, a p-type Si monocrystal substrate is first prepared, and all of the same is then made porous. Next, epitaxial growth is carried out on the surface of the resultant porous substrate by a molecular beam epitaxy method, a plasma CVD method, a low pressure CVD method, an optical CVD method, a liquid phase growth method, a bias sputter method or a growth method suitable for a crystal capable of growing at a low temperature, thereby forming a Si monocrystal thin film 102. The p-type Si substrate is made porous by an anodization method using an HF solution. The density of this porous Si substrate 101 can be adjusted in the range of 1.1–0.6 g/cm$^3$ by changing the concentration of the HF solution to 50–20% as compared to the monocrystal Si density of 2.33 g/cm$^3$.

Afterward, GaAs having a thickness of 1.0—2.0 μm is formed on the Si thin film 102 by an OMVPE (organometallic vapor-phase epitaxy) method. In this case, a film 103 having a thickness of 100 Å is first formed at a low temperature of 450° C. as shown in FIG. 1A, and the temperature is raised to 680° C. and a film 104 having a thickness of 0.98–1.99 μm is then formed as shown in FIG. 1A. In consequence, a defective layer which is an interface between Si and GaAs is joined to GaAs at the initial step (low-temperature growth), and the other layer is the good GaAs monocrystal layer.

Next, another Si substrate 105 is prepared, and its surface is then oxidized to form an SiO$_2$ layer 106. Afterward, the Si substrate 105 having the SiO$_2$ layer 106 thereon is bonded to the GaAs monocrystal layer 104 on the porous Si substrate.

Furthermore, the Si monocrystal thin layer 102 is removed with a Si etchant having a high etching selection ratio between GaAs and Si, and GaAs 103 is successively removed, so that the good GaAs monocrystal layer 104 is formed on the insulating layer.

In the present invention, the uniformly thinned and flat monocrystal layer having a large area all over the wafer is formed on the SiO$_2$ layer 106 which is the insulator. The thus obtained semiconductor substrate can be suitably used to manufacture dielectrically isolated electronic elements.

In order to form a thin film semiconductor device from the above-mentioned semiconductor monocrystal layer, the thickness of the non-porous semiconductor crystal layer which is formed on the porous semiconductor substrate is preferably 50 μm or less, more preferably 20 μm or less.

Furthermore, bonding the III–V group monocrystal thin film to the substrate having the insulating material surface is preferably achieved in nitrogen, an inert gas, a mixed gas atmosphere thereof, or an atmosphere containing the inert gas or nitrogen, and further suitably under heating.

As the etchant by which the above-mentioned porous semiconductor substrate is selectively etched so as to leave the non-porous semiconductor monocrystal layer, for example, an aqueous sodium hydroxide solution, an aqueous potassium hydroxide solution or a hydrofluoric acid-nitric acid-acetic acid mixing solution can be enumerated.

The substrate having an insulating material which can be used in the present invention may be a substrate in which at least its surface is made up of the insulating material, or a substrate all comprising the insulating material. Examples of the substrate whose surface is made of the insulating material include monocrystal or polycrystal Si substrates having the oxidized surfaces, and conductive or semiconductive substrates having a layer of an insulating material such as an oxide, a nitride or a boride thereon. Moreover, examples of the substrate all comprising the insulating material include substrates comprising insulating materials such as quartz glass and calcined alumina. Furthermore, this insulating material has a thermal expansion coefficient in the range of 60%–140%, preferably 80–120% of that of the III–V group monocrystal semiconductor to be bonded thereto. Examples of the usable insulating layer include $Al_xN_{1-x}$, $SiO_yN_{1-y}$, zinc borosilicate glass and borosilicate glass. By the use of these materials, a thermal expansion coefficient of $4-8\times10^{-6}/°$ C. can be achieved which is substantially equal to that of the GaAs semiconductor.

In this Embodiment 1, it has been explained that the non-porous semiconductor monocrystal layer is formed on the porous semiconductor substrate, but this embodiment is not limited. For example, a substrate having a monocrystal layer comprising a material which is scarcely made porous (e.g., n-type silicon) and a layer comprising a material which is easily made porous (e.g., p-type silicon) may be first subjected to a porous structure formation treatment, whereby the porous semiconductor substrate having the non-porous semiconductor monocrystal layer thereon may be formed.

In the etching treatment step in which the porous semiconductor substrate is removed by etching, the non-porous semiconductor monocrystal layer and the substrate having the insulating material surface, except the porous semiconductor substrate, may be covered with an etching-resistant material so as not to be affected by the etchant.

In the thus formed III–V group monocrystal layer on the insulator, crystal defects are remarkably inhibited, and in the semiconductor monocrystal layer, the unevenness of the layer thickness is also extremely controlled.

Next, reference will be made to a method for preparing a GaAs layer which is different from the above-mentioned process, in reference to FIGS. 2A to 2D. The same and corresponding members will be represented the same numerals, and the description about these members will be omitted.

A Si monocrystal thin film 102 is grown on a porous Si substrate 101 by a low-temperature epitaxial method, and a GaAs layer having a thickness of 0.8–1.5 μm is then formed by an OMVPE method. In this case, the first film is grown as thick as 100–200 Å at a low temperature of 450° C. as represented by 102 in FIG. 2A, and afterward the temperature is raised to 680° C., and the remaining GaAs layer is then grown as represented by 103 in FIG. 2B.

Next, a gas is switched, and an $Al_xGa_{1-x}As$ ($0.1\leq x\leq0.35$) thin film 201 having a thickness of 500–1,000 Å is grown on the GaAs layer 104. Afterward, the gas is switched again, and a GaAs thin film 202 is then grown as thick as 1.0–2.0 μm.

Figure 2A:
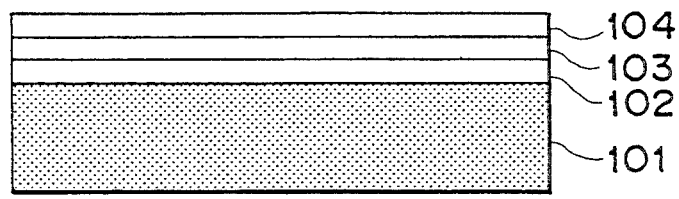
Figure 2B:
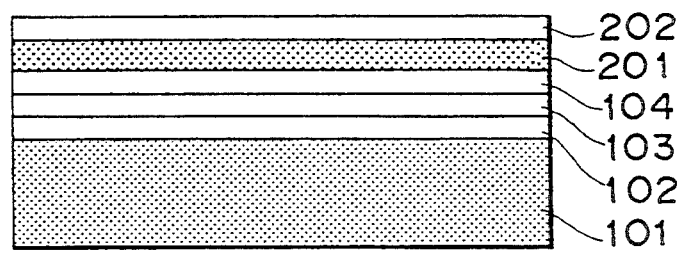
Figure 2C:
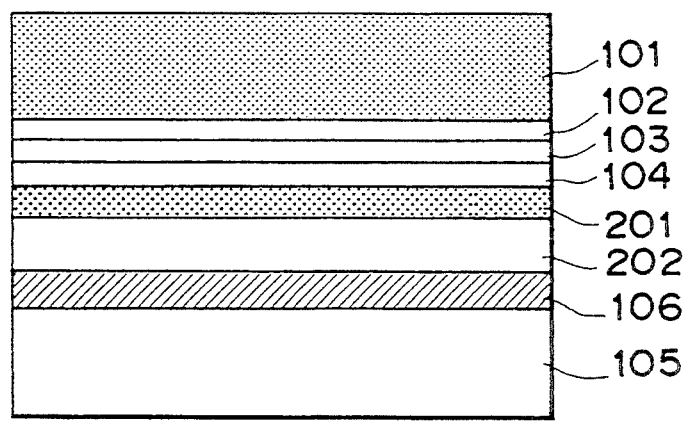

Next, as shown in FIG. 2C, another Si substrate 105 is prepared, and a $SiO_2$ layer 106 is then formed on the surface of the Si substrate 105. Afterward, the GaAs layer 202 is bonded to the $SiO_2$ layer 106.

Figure 2D:
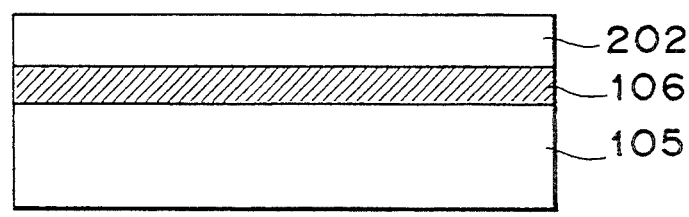

Afterward, by the use of the same procedure as in the above-mentioned formation process of the GaAs layer, the porous Si and the monocrystal Si layer are etched with an etchant having a high selection ratio to GaAs, and afterward the GaAs layers 103 and 104 are removed with a GaAs etchant having a selection ratio between $Al_xGa_{1-x}As$ and GaAs so as to leave the $Al_xGa_{1-x}As$ layer 201 et seq. Successively, the $Al_xGa_{1-x}As$ layer 201 is removed with an etchant capable of etching the $Al_xGa_{1-x}As$ layer only, so that a wafer having the high-quality monocrystal GaAs layer 202 is formed on the insulator as shown in FIG. 2D.

In this Preparation Example 2, when the GaAs layer containing defects which is grown on Si is removed, the $Al_xGa_{1-x}As$, layer having a different composition, functions as an etch-stop layer. Therefore, there is an advantage that the thin GaAs monocrystal layer on the insulating layer can be uniformly obtained all over the wafer. In the above-mentioned preparation example, it is described that the $Al_xGa_{1-x}As$ layer 201 is grown after the formation of the GaAs layer 104, but the GaAs layer 104 is not always necessary, so long as the high-quality $Al_xGa_{1-x}As$ layer is formed on the GaAs layer.

The following methods 1 to 5 are concerned with different techniques for forming the GaAs monocrystal thin film on the Si monocrystal thin film, and procedures other than here mentioned are the same as described above and so they will be omitted.

Method 1: Five pairs of $Al_xGa_{1-x}As$ ($0.4\leq x\leq0.8$) and GaAs having a layer thickness of 100 Å are alternately grown at 800° C.

Method 2: Five pairs of $Al_xGa_{1-x}As$ ($0.4\leq x\leq0.8$) having a layer thickness of 1,000 Å and GaAs having a layer thickness of 100 Å are alternately grown at 800° C.

Method 3: GaAs is grown as much as 1,000 Å at 700° C., and after annealing at 800° C. for 5 minutes, the temperature is lowered to 300° C. and it is then raised to 800° C. again. A film having a thickness of 1,000 Å is grown at 700° C. again. This operation cycle is repeated to form five pairs of the layers.

Method 4: $Al_xGa_{1-x}As$ ($0.4\leq x\leq0.8$) having a layer thickness of 100 Å is grown at 800° C., and GaAs having a thickness of 1,000 Å is then grown at 750° C. The temperature is lowered to 300° C. and then raised to 800° C. again. This operation cycle is repeated to form five pairs of the layers.

Method 5: 2 step growth (growth is carried out at a low temperature and then at a high temperature) by hf heated horizontal MOCVD.

> Gas sources  TMG (trimethylgallium)
> TMA (trimethylaluminum)
> $AsH_3$
> Flow rate of $H_2$: 1/min.

Method 6: MBE
  Growth of 300-Å-thick GaAs at 350° C. (low rate: 0.7 μmh$^{-1}$), and
  afterward, growth of 1 to 2-μm-GaAs (rate: 1.2 μmh$^{-1}$).

Now, a film formation method which is different from the procedure of the above-mentioned Si monocrystal thin film will be described in detail in reference to FIGS. 3A and 3B.

Figure 3A:
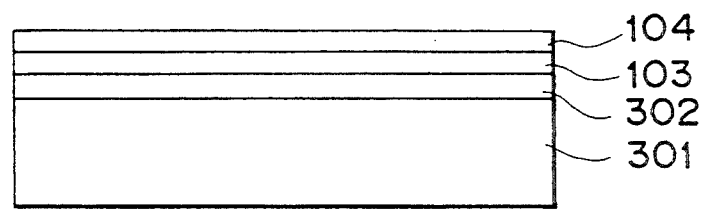

In the first place, as shown in FIG. 3A, a Si monocrystal layer 302 having a lower impurity concentration is formed by an epitaxial growth method which is one of various thin film growing methods. Alternatively, protons are implanted in the surface of a p-type Si monocrystal substrate 301 to form an n-type monocrystal layer which corresponds to the above-mentioned Si monocrystal layer 302. Afterward, GaAs layers 103 and 104 are formed on the Si monocrystal layer 302 in accordance with the procedure described in Preparation Examples 1 to 4. In this case, the epitaxial layer and the ion-implanted layer are not always necessary.

Figure 3B:
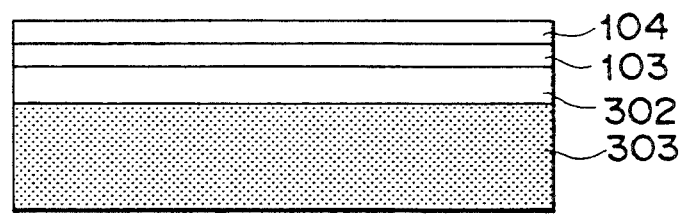

Next, as shown in FIG. 3B, the p-type Si monocrystal substrate 301 is converted into a porous Si substrate 303 from its back surface by subjecting the substrate 301 to an anodization process using an HF solution. The density of this porous Si substrate 303 can be adjusted in the range of 1.1–0.6 g/cm$^3$ by changing the concentration of the HF solution to 50–20% as compared to Si density of 2.33 g/cm$^3$. This porous layer is formed on the p-type substrate as described above.

Another substrate is prepared and then bonded as described above, thereby forming a semiconductor wafer.

This method concerns to an example in which the n-type layer is formed on the p-type substrate prior to the porous structure formation step, and the p-type substrate only is selectively made porous by anodization.

Furthermore, even if the GaAs is replaced with a III–V group semiconductor such as AlGaAs or InGaAs, a good semiconductor wafer can be similarly prepared.

Figure 1B:
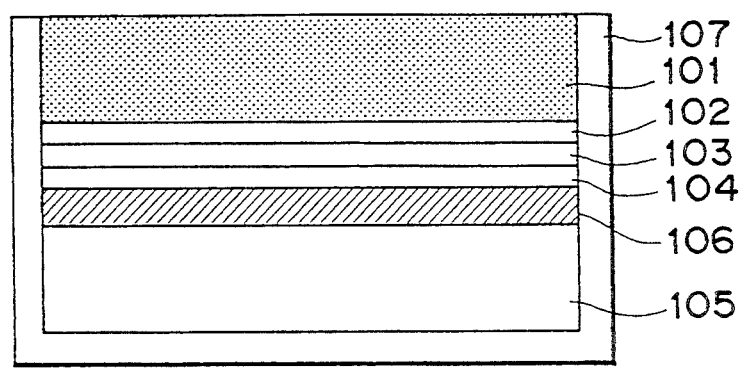
Figure 1C:
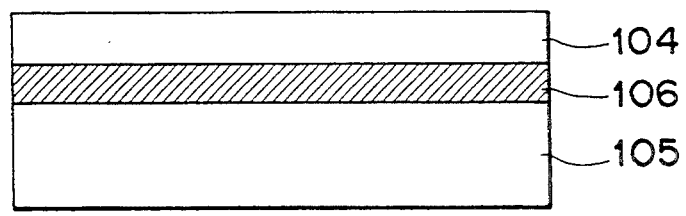

Next, as shown in FIG. 1B, a Si$_3$N$_4$ layer 107 is deposited as an etching prevention film so as to cover all of the two bonded silicon wafers. Afterward, the Si$_3$N$_4$ layer only on the porous Si substrate in FIG. 3 is removed. As another etching prevention film, Apiezon Wax may be used in place of Si$_3$N$_4$.

In addition, after an insulating layer is formed on the surface of the GaAs layer, this insulating layer may be bonded to a substrate whose surface is provided with an insulating layer.

Figure 4:
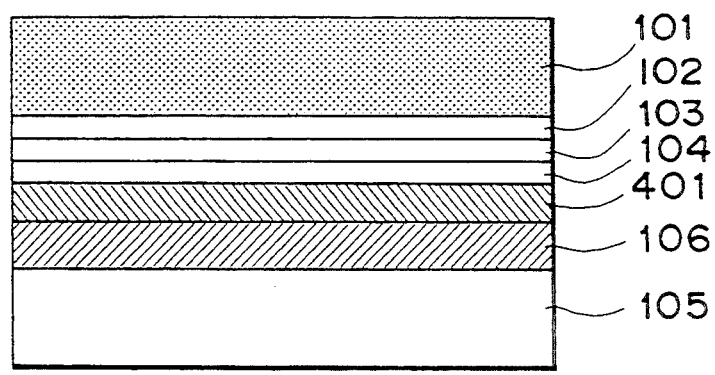

As shown in FIG. 4, another Si substrate 105 is prepared, and a SiO$_2$ layer 106 is then formed on the surface of the substrate 105. This Si substrate 105, having the SiO$_2$ layer 106 on its surface is then bonded to the surface of an insulating layer 401 formed on a GaAs monocrystal layer 104 on the porous Si substrate 101 (the insulating layer 401 comprises a single layer or a multi-layer structure of SiO$_2$, SiN, Al$_x$N$_{1-x}$ or SiO$_x$N$_{1-x}$). This bonding step is carried out by first bringing the washed surfaces into close contact with each other, and then heating them in a nitrogen atmosphere or an argon atmosphere which is an inert gas atmosphere. In this connection, the SiO$_2$ layer 106 is formed in order to lower the interfacial level of the GaAs layer 104 which is a final active layer.

After the bonding, unnecessary layers are removed in the above-mentioned etching step.

In the present invention, when the Si substrate 105 which finally becomes the substrate of the wafer is replaced with glass or the like (in this case, the SiO$_2$-layer 106 is unnecessary), a semiconductor wafer dielectrically isolated with the light-transmissive insulating material can be obtained.

Furthermore, in forming the porous Si substrate 101, the porous structure formation is halfway stopped so as to make only one surface porous, and a monocrystal thin film is prepared using this porous surface. In removing the porous Si substrate 101, the removal is first made by mechanical polishing such as grinding or etching to expose the porous region, and the porous Si is then etched as described above to complete the removal of substrate.

In the case that such a process is employed, the time required for the porous structure formation can be curtailed, and the time taken to remove the porous Si substrate by etching can be also shortened, which leads to the high efficiency of the substrate formation.

Embodiment 2

Figure 5A:
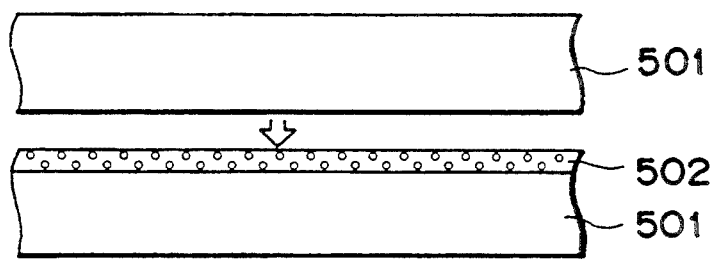
Figure 5B:
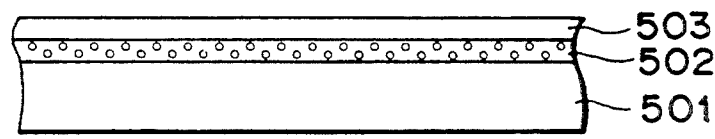
Figure 5C:
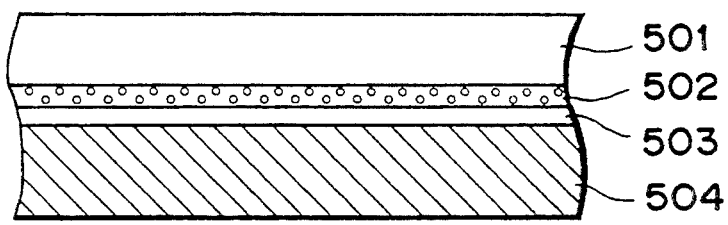

As shown in FIG. 5A, a Si monocrystal substrate 501 is first prepared, and the surface of this substrate 501 is made porous 502 and an oxide film is formed on the inside walls of pores in the porous Si layer. Furthermore, a monocrystal compound semiconductor layer 503 is formed on the porous Si [FIG. 5B]. As shown in FIG. 5C, another Si substrate 504 is brought into close contact with the monocrystal compound semiconductor layer 503 at room temperature, followed by anodization, pressurizing, a heat treatment, or a combination thereof, to bond them to each other, whereby the Si substrate 504 is firmly bonded to the monocrystal layer 503.

Figure 5D:
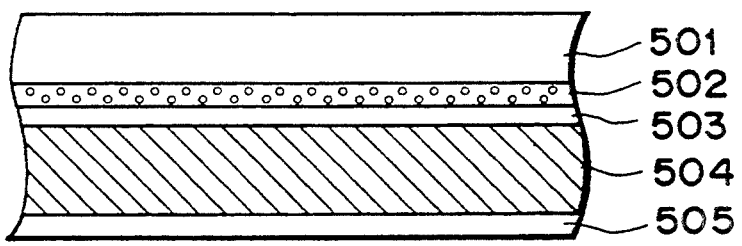
Figure 5E:
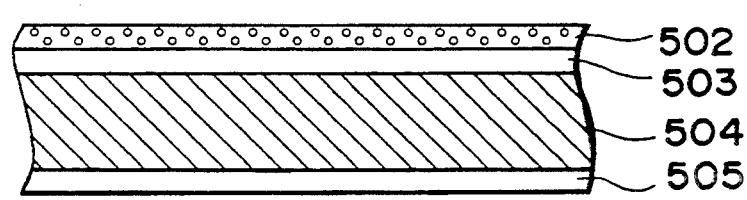

Next, the Si substrate side only of the bonded substrates is covered with a mask 505 having etching resistance [FIG. 5D], and the Si monocrystal substrate 501 is removed by etching, utilizing the porous Si layer 502 as an etch-stop layer [FIG. 5E]. This first selective etching can be achieved by using an etching solution having a higher etching rate for Si than for SiO$_2$, for example, hydrofluoric nitric acid type,
ethylenediamine + pyrocatechol + water, or
KOH type.

Furthermore, the porous Si 502 only is chemically etched with an etching solution having a high Si etching rate for the compound semiconductor, so that the thinned monocrystal compound semiconductor layer 503 remains on the Si substrate 504.

Figure 5F:
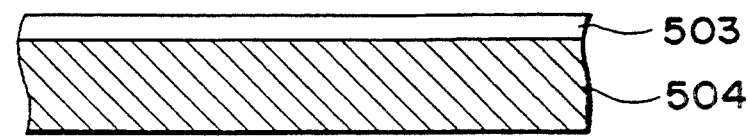

Finally, as shown in FIG. 5F, the monocrystal compound semiconductor 503 is formed on the Si substrate 504. Since the thus obtained semiconductor substrate has a uniform and flat monocrystal compound semiconductor layer thereon having a large area, it can be suitably used as a compound semiconductor substrate.

Next, reference will be made to an embodiment shown in FIGS. 6A to 6F in which an insulating layer is interposed between the monocrystal layer 503 and the Si substrate 504 shown in FIG. 5 in order to bond them. In FIG. 6, the same members as in FIG. 5 are represented by the same symbols.

In FIGS. 6A to 6F, the Si substrate 504 and the monocrystal compound semiconductor layer 503 are bonded to each other with the interposition of an insulating layer 515. This insulating layer 515 can be formed on at least one of the monocrystal compound semiconductor layer 503 and the Si substrate 504, or alternatively it can be interposed between the layers 503 and 504.

Figure 6A:
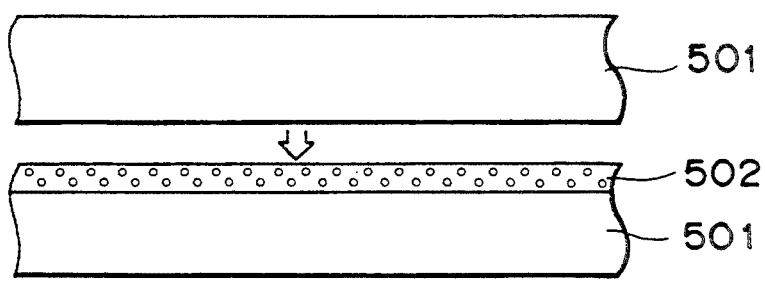
Figure 6B:
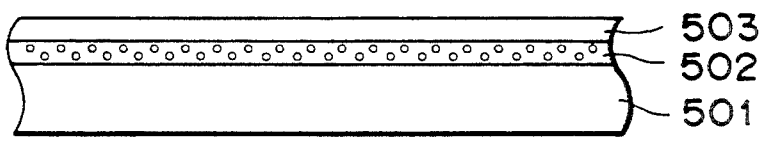
Figure 6C:
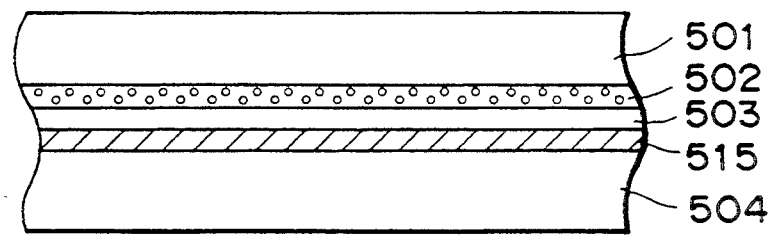
Figure 6D:
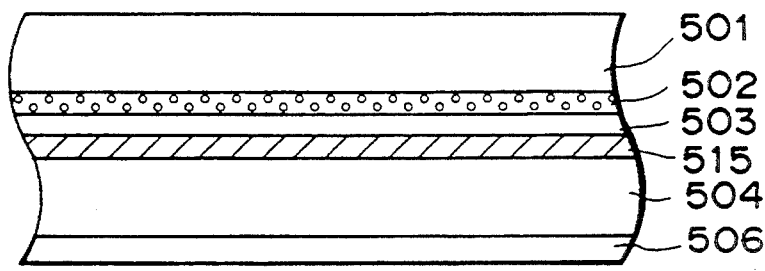
Figure 6E:
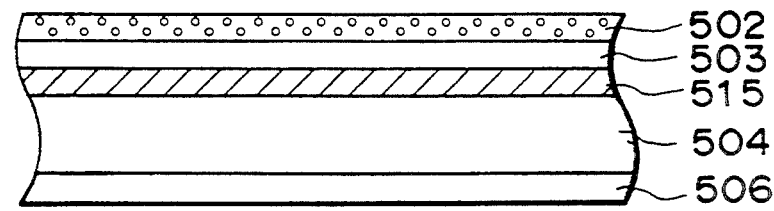

Next, the Si substrate side only of the bonded substrates is covered with a mask 506 having etching resistance [FIG. 6D], and Si monocrystal substrate 501 is removed by etching, utilizing the porous Si layer 502 as an etch-stop layer [FIG. 5E]. This first selective etching can be achieved as described above.

Furthermore, the porous Si layer 502 only is chemically etched with an etching solution having a high Si etching rate for the compound semiconductor, so that the thinned monocrystal compound semiconductor layer 503 remains on the insulating substrates 515 and 504.

Figure 6F:
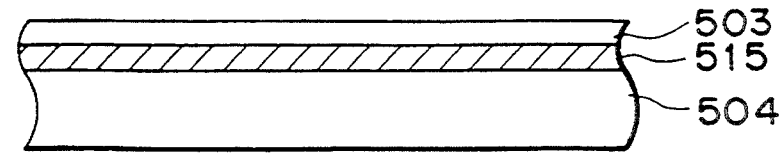
Figure 7A:
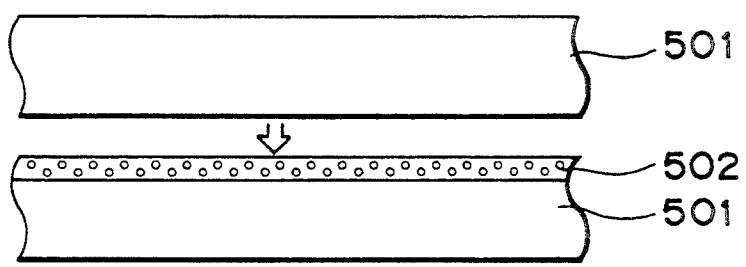
Figure 7B:
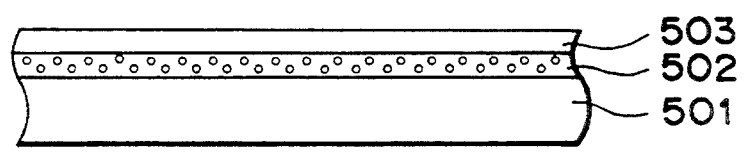
Figure 7C:
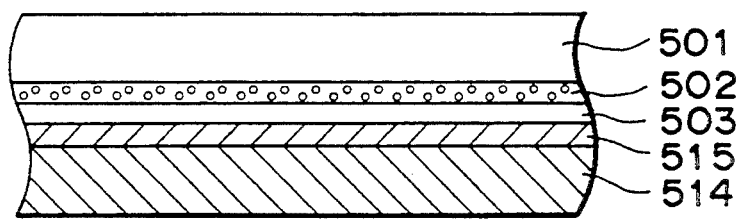
Figure 7D:
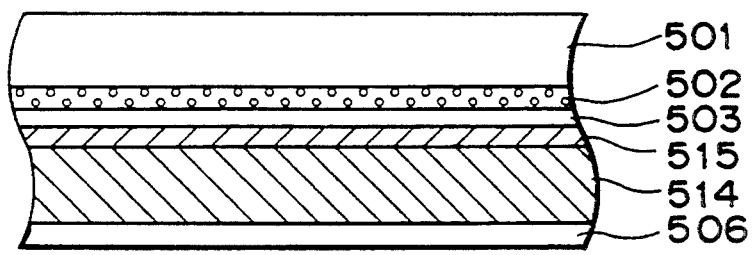
Figure 7E:
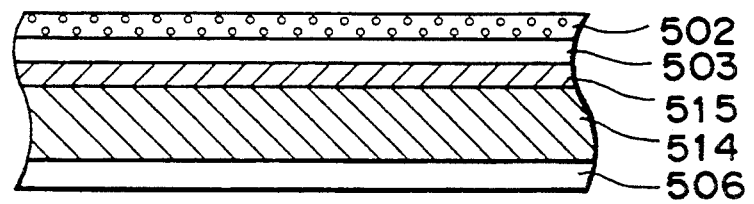
Figure 7F:
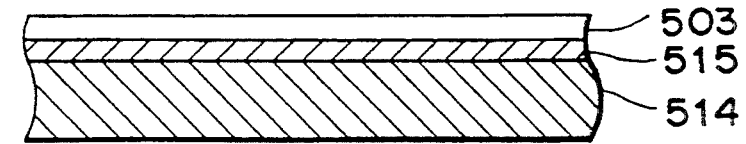
Figure 8A:
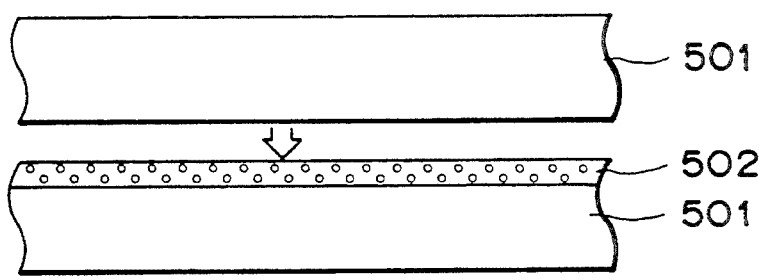
Figure 8B:
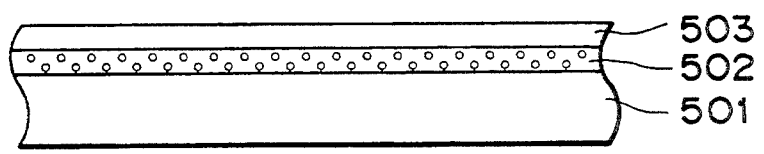
Figure 8C:
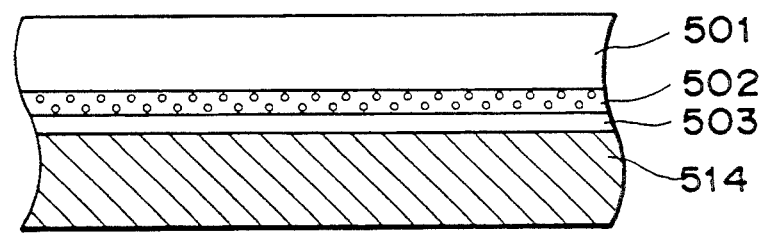
Figure 8D:
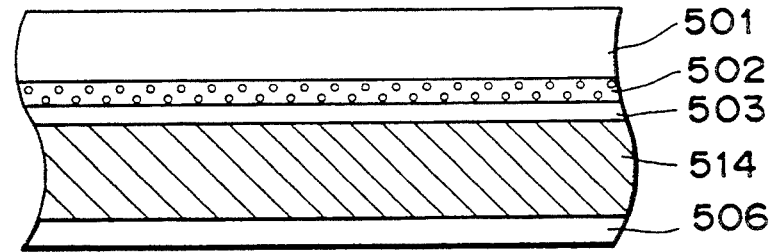
Figure 8E:
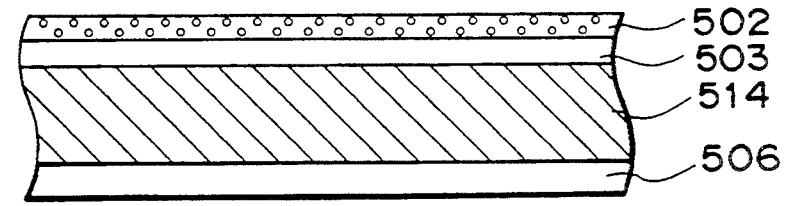
Figure 8F:
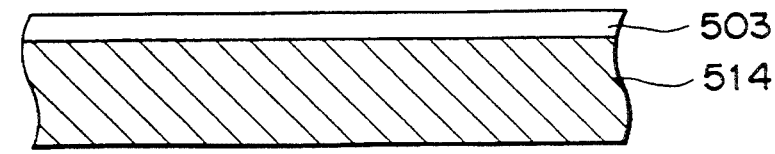
Figure 9A:
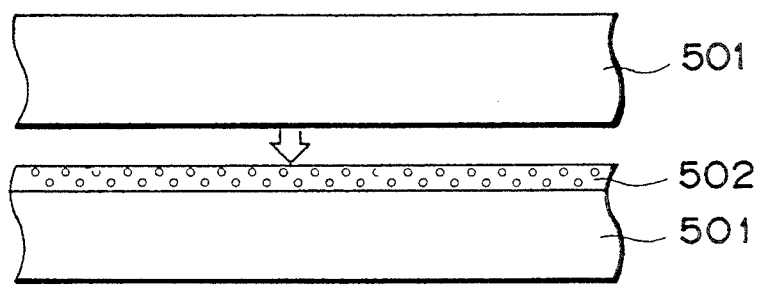
Figure 9B:
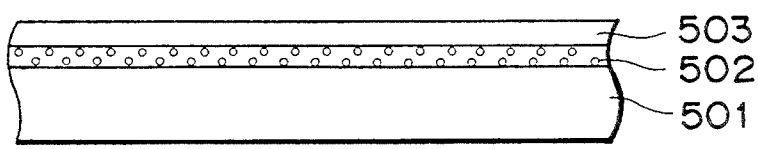
Figure 9C:
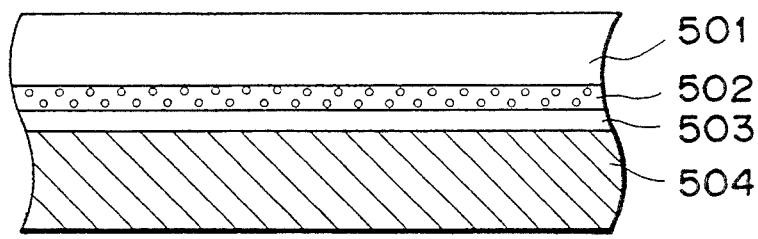
Figure 9D:
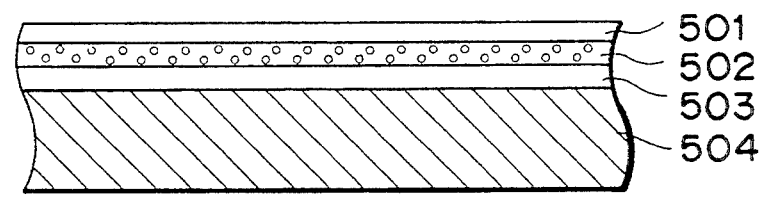
Figure 9E:
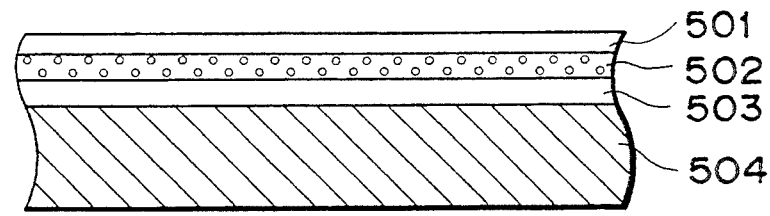
Figure 9F:
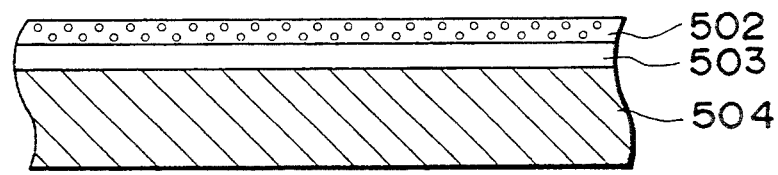
Figure 9G:
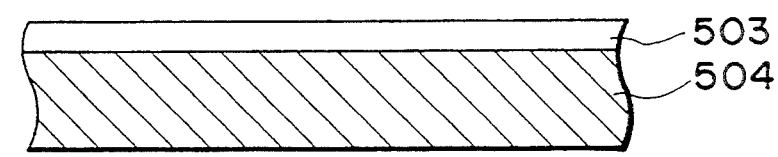
Figure 10A:
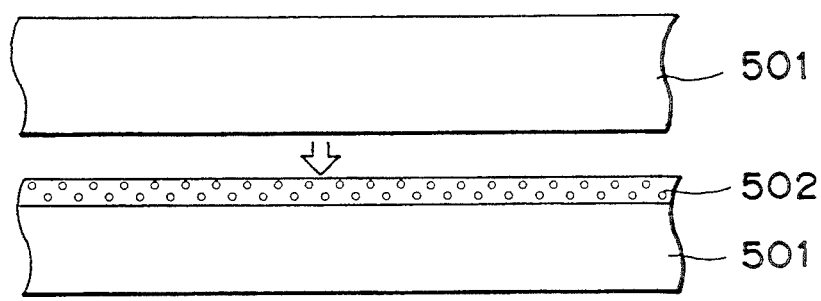
Figure 10B:
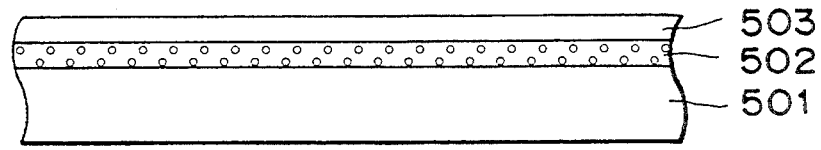
Figure 10C:
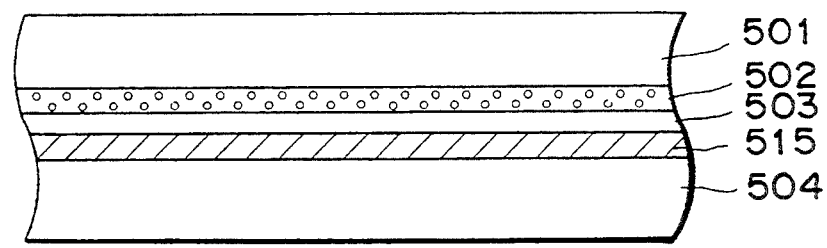
Figure 10D:
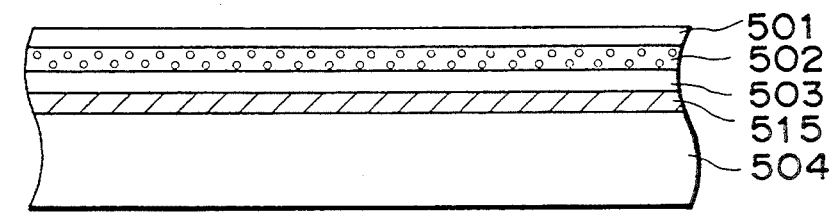
Figure 10E:
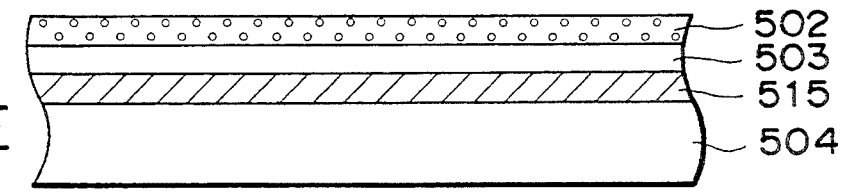
Figure 10F:
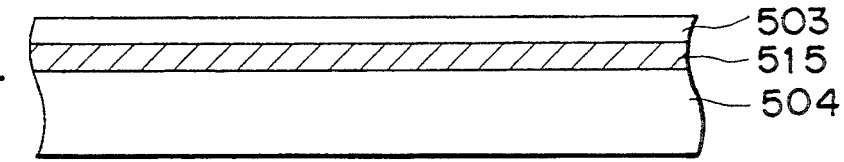
Figure 11A:
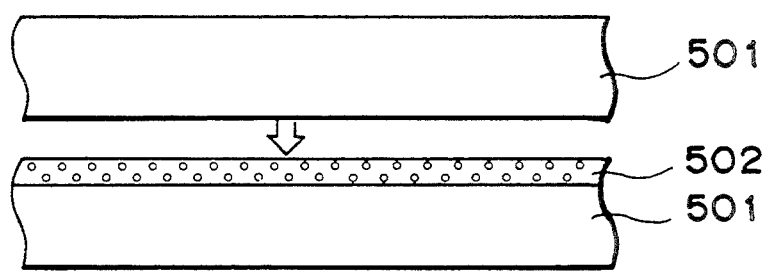
Figure 11B:
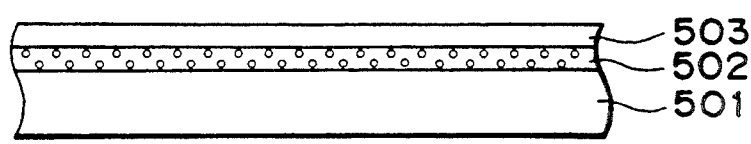
Figure 11C:
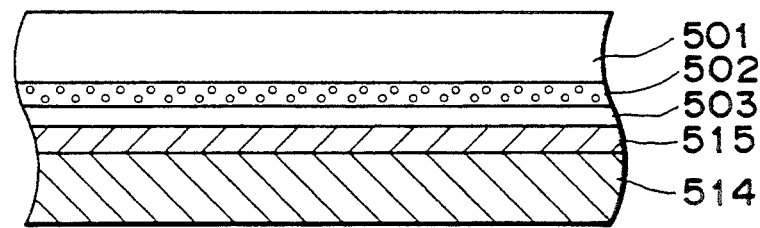
Figure 11D:
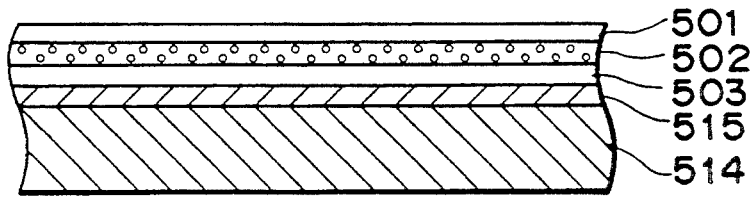
Figure 11E:
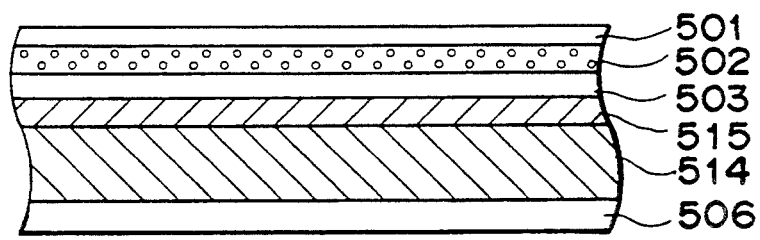
Figure 11F:
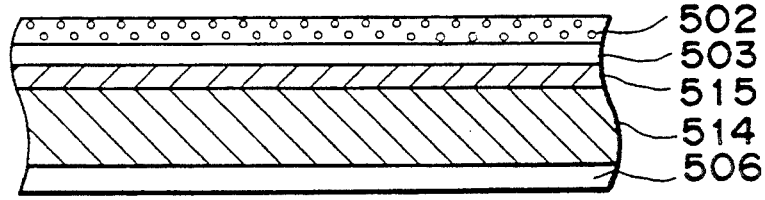
Figure 11G:
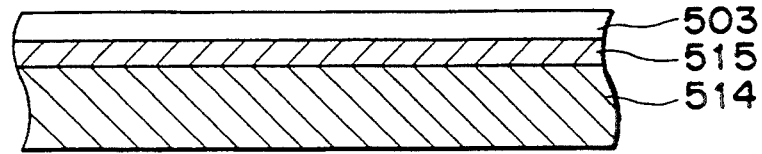
Figure 12A:
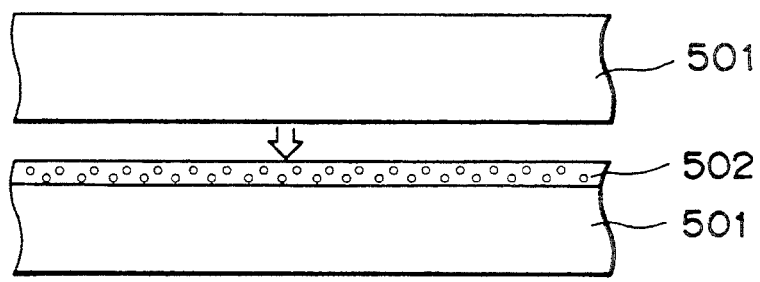
Figure 12B:
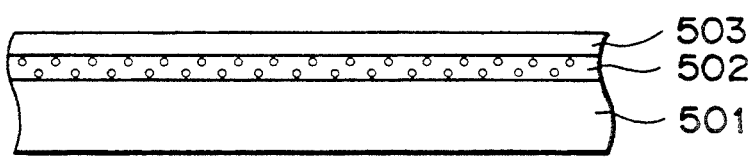
Figure 12C:
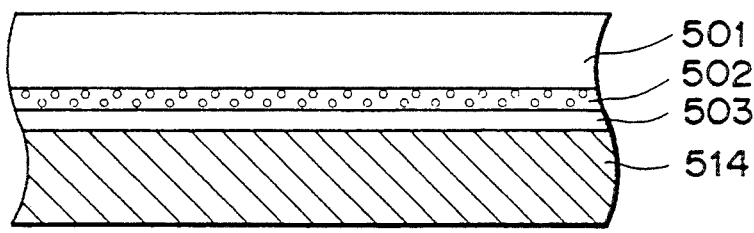
Figure 12D:
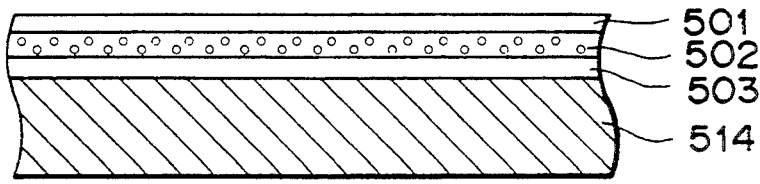
Figure 12E:
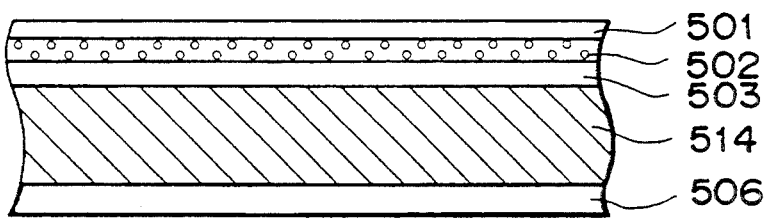
Figure 12F:
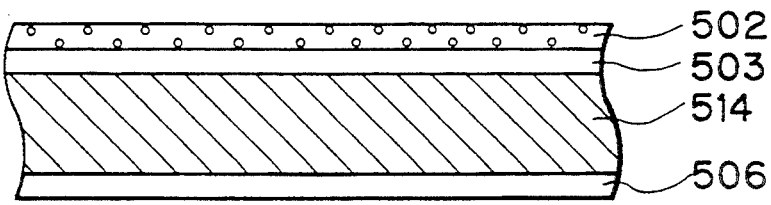
Figure 12G:
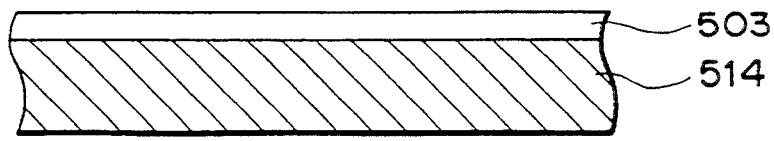
Figure 13A:
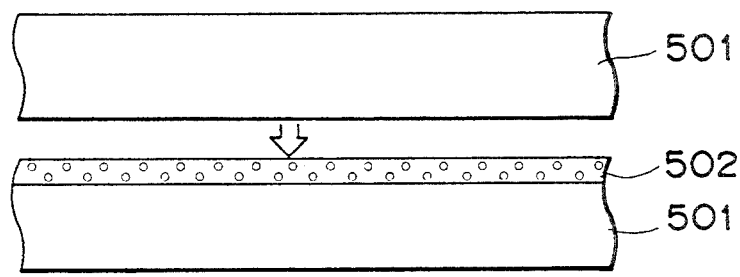
Figure 13B:
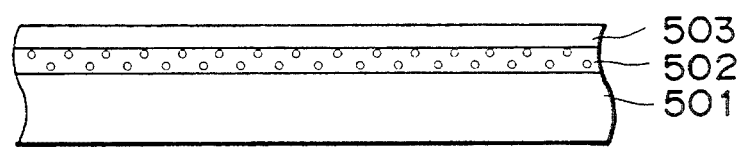
Figure 13C:
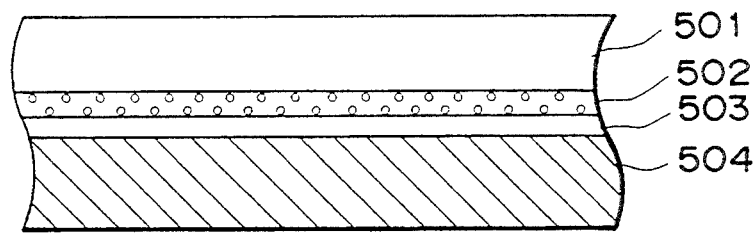
Figure 13D:
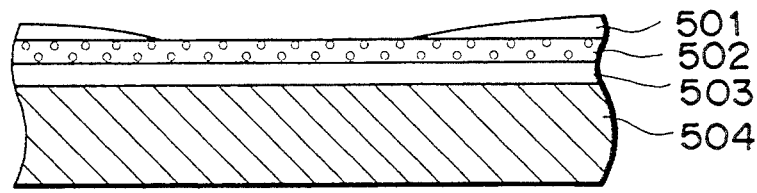
Figure 13E:
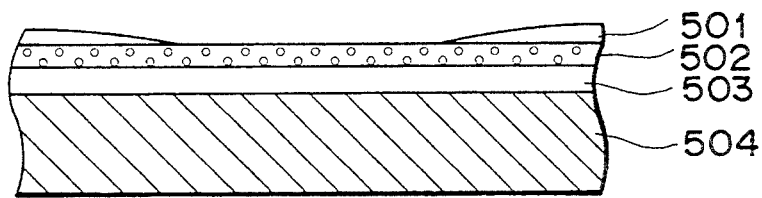
Figure 13F:
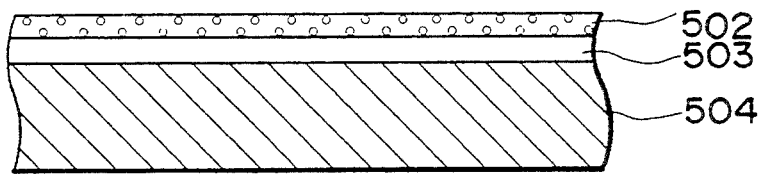
Figure 13G:
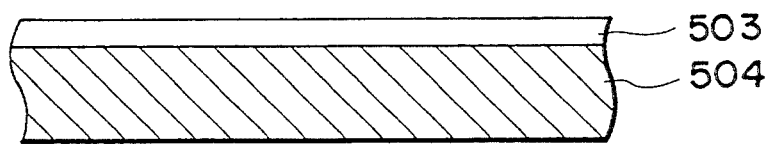
Figure 14A:
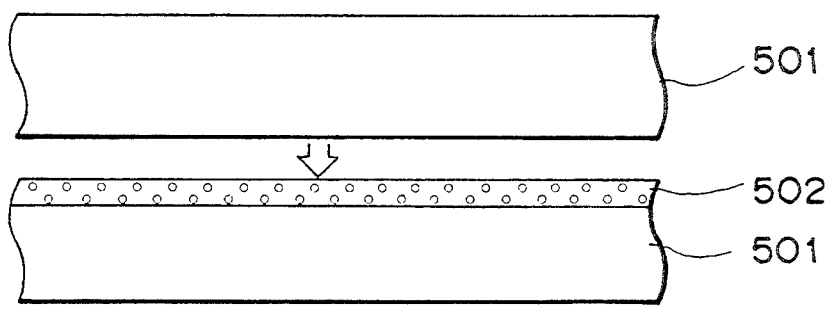
Figure 14B:
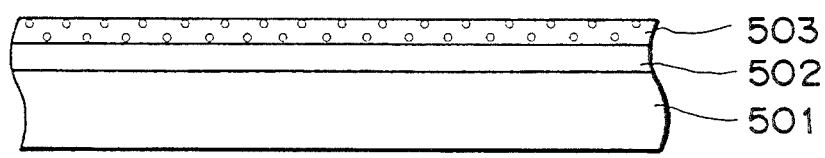
Figure 14C:
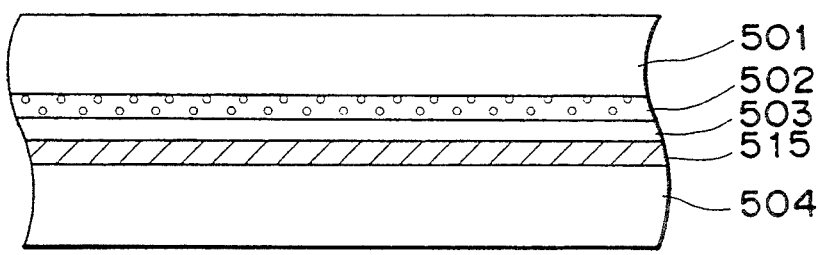
Figure 14D:
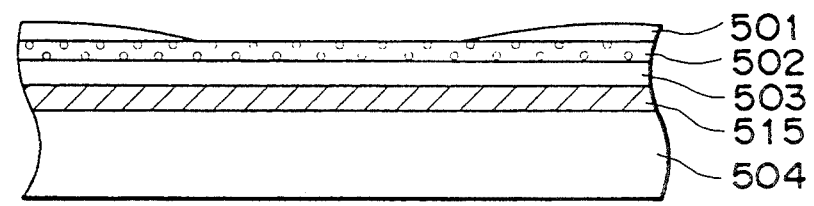
Figure 14D:
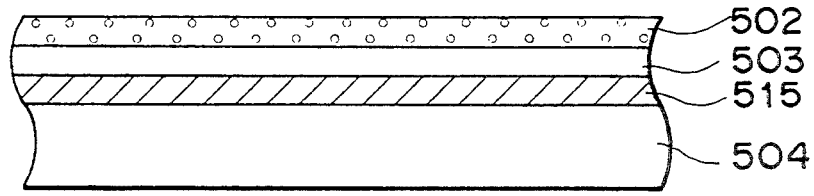
Figure 14F:
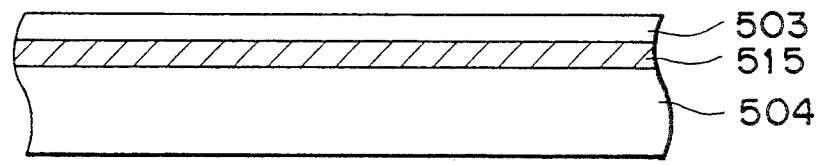
Figure 15A:
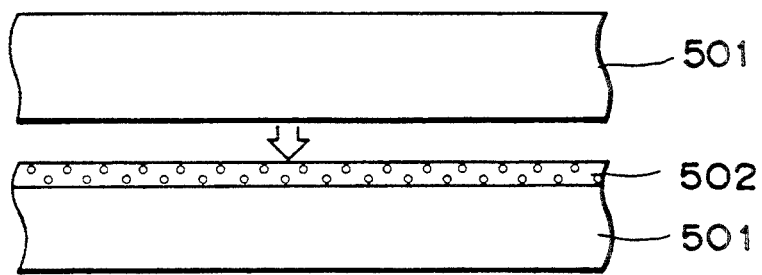
Figure 15B:
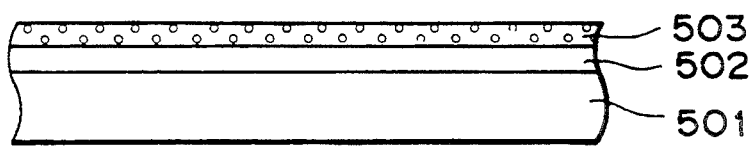
Figure 15C:
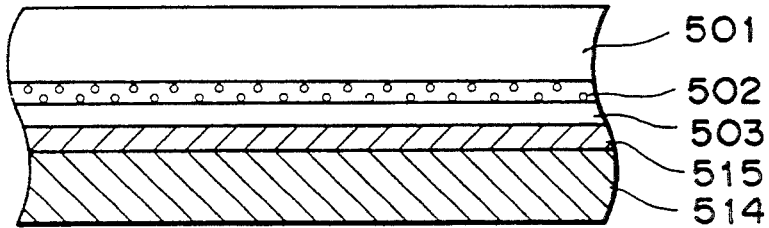
Figure 15D:
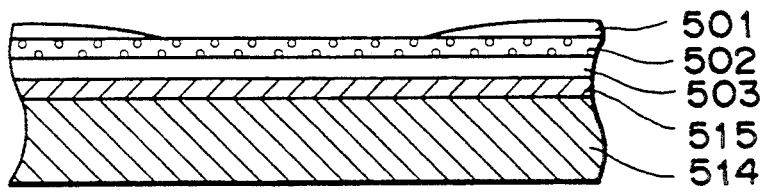
Figure 15E:
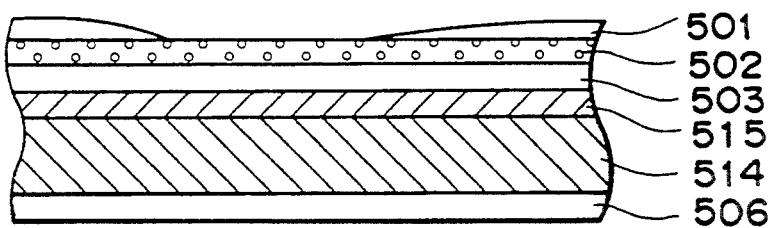
Figure 15F:
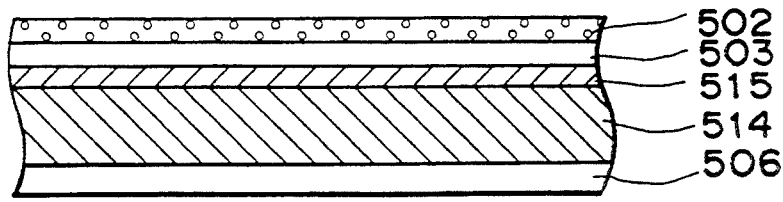
Figure 15G:
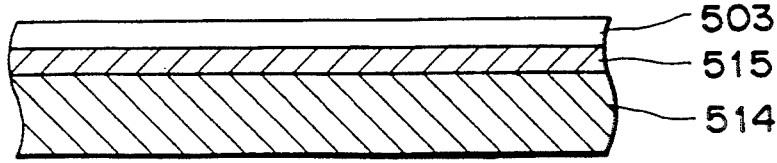

In FIG. 6F, the semiconductor substrate with the mask removed is shown which has been obtained in this embodiment. In this constitution, the monocrystal compound semiconductor layer 503 is formed on the insulating substrates 515 and 504. The thus obtained semiconductor substrate can be suitably used as a compound Semiconductor substrate or as a dielectrically isolated electronic element.

Next, reference will be made to an embodiment shown in FIGS. 7A to 7F and 8A to 8F in which a Si substrate 504 shown in FIGS. 5A to 5F is replaced with a light-transmissive substrate. In FIGS. 7A to 7F and 8A to 8F, reference numeral 514 is a light-transmissive substrate, and the same members as in FIGS. 5A to 5F and 6A to 6F are represented by the same symbols. A difference between a process shown in FIGS. 7A to 7F and a process shown in FIGS. 8A to 8F is that an insulating layer 515 is either present or absent.

In the processes shown in FIGS. 5 to 9, after the bonding of the substrates, the Si monocrystal substrate 501 can be removed by polishing or grinding until the porous Si layer 502 is nearly exposed [FIGS. 9D, 10D, 11D and 12D], and the first etching can be then carried out. It is also possible to polish or grind the Si monocrystal substrate 501 until the porous Si layer 502 is exposed [FIGS. 13D, 14D, 15D and 16D].

It is well known that the oxidation of the inside walls of the porous Si is effective to inhibit the structure change of the porous Si by a heat treatment, but in this embodiment, in addition thereto, the oxidation is also effective to improve the selective ratio of the etching in the first step. Since the inside surfaces of the porous Si are covered with an oxide film, the porous Si layer functions as a sufficient etch-stop layer in the selective etching of bulk Si in the first stage, when an etching solution having a high etching rate to Si than to $SiO_2$ is used.

The second etching in this embodiment can be achieved by chemically etching porous Si only with an etching solution having a high Si etching rate to the compound semiconductor.

In this embodiment, there is used the Si monocrystal substrate which has excellent economy and extremely excellent crystallinity and which is uniform and flat over a large area, and the substrate is etched so as to leave the compound semiconductor active layer formed on the surface of the substrate, whereby the monocrystal compound semiconductor layer having remarkably few defects can be obtained on another Si substrate.

Furthermore, in the present invention, the monocrystal compound semiconductor layer having good crystallinity can be formed on porous Si, and this semiconductor layer can be transferred onto the Si substrate or the insulating substrate having a large area. In consequence, the difference between the lattice constant and the thermal expansion coefficient which is the problem in the conventional technique can be sufficiently inhibited, and in consequence, a compound semiconductor layer having good crystallinity can be formed on the Si substrate or the insulating substrate.

Now, the present invention will be described in detail in reference to examples, but the scope of the present invention should not be limited to these examples.

EXAMPLE 1

A p-type (100) monocrystal Si substrate (a Si wafer) having a diameter of 3 inches and a thickness of 200 $\mu$m was subjected to anodization in a 50 wt. % HF solution. In this case, current density was 100 $mA/cm^2$. A porous structure formation (porousifying) rate in this case was 8.4 $\mu$m/min., and all of the p-type (100) Si substrate having a thickness of 200 $\mu$m was porousified in 24 minutes.

On the p-type (100) porous Si substrate, a Si epitaxial layer having a thickness of 0.5 $\mu$m was grown by a MBE (molecular beam epitaxy) method. Deposition conditions were as follows:
Temperature: 700° C.
Pressure: $1 \times 10^{-9}$ Torr
Growth rate: 0.1 nm/sec.

Next, a GaAs semiconductor layer having a thickness of 2.2 $\mu$m was formed on the surface of this epitaxial layer, and afterward, another Si substrate on which a 5,000-Å-thick $SiO_2$ layer and an $SiO_xN_{1-x}$ thin film were formed was superposed upon the above-mentioned GaAs semiconductor layer. They were then heated at 800° C. for 0.5 hour in a nitrogen atmosphere to firmly bond the two Si substrates to each other. Next, the porous Si substrate was removed by etching with a hydrofluoric nitric acetic acid solution (1:3:8). In this case, an x value of $SiO_xN_{1-x}$ was selected so as to be fit for the thermal expansion coefficient of GaAs.

As described above, the etching rate of the usual Si monocrystal with the hydrofluoric nitric acetic acid solution is a little under about 1 $\mu$m per minute (the hydrofluoric nitric acetic acid solution 1:3:8), but the etching rate of the porous layer is about 100 times as much as that of the Si monocrystal. Thus, the porous Si substrate having a thickness of 200 $\mu$m was removed in 2 minutes. Furthermore, the Si monocrystal layer and a part of the GaAs layer were removed to form the GaAs monocrystal layer having a thickness of 1-2 $\mu$m on the insulating layer.

EXAMPLE 2

A p-type (100) monocrystal Si substrate having a diameter of 4 inches and a thickness of 500 $\mu$m was subjected to anodization in a 50 wt. % HF solution. In this case, current density was 100 $mA/cm^2$. A porous structure formation rate in this case was 8.4 $\mu$m/min., and all of the p-type (100) Si substrate having a thickness of 500 $\mu$m was made porous in 60 minutes.

On the p-type (100) porous Si substrate, a Si epitaxial layer having a thickness of 0.5 $\mu$m was grown by a plasma CVD method. Deposition conditions were as follows:
Gas: $SiH_4$
High frequency power: 100 W
Temperature: 800° C.
Pressure: $1 \times 10^{-2}$ Torr
Growth rate: 2.5 nm/sec.

Next, a GaAs semiconductor layer having a thickness of 3 $\mu$m was formed on the surface of this epitaxial layer, and afterward, another Si substrate on which a 5,000-Å-thick $SiO_2$ layer and an $Al_xN_{1-x}$ thin film were formed was superposed upon the above-mentioned GaAs semiconductor layer. They were then heated at 700° C. for 0.5 hour in a nitrogen atmosphere to firmly bond the two Si substrates to each other. Next, the porous Si substrate was removed by etching with a hydrofluoric nitric acetic acid solution (1:3:8).

As described above, the etching rate of the usual Si monocrystal with the hydrofluoric nitric acetic acid solution is a little under about 1 $\mu$m per minute (the hydrofluoric nitric acetic acid solution 1:3:8), but the etching rate of the porous layer is about 100 times as much as that of the Si monocrystal. Thus, the porous Si substrate having a thickness of 500 μm was removed in 5 minutes.

The thickness of the thus obtained GaAs monocrystal layer was inspected by the use of a Scanning Ellipsometer. In the concrete, the measurement was made by scanning the whole surface of the 4-inch wafer. As a result, it was apparent that a difference between a maximum value and a minimum value of the thickness of the monocrystal layer in the surface of the 4-inch wafer was controlled to 7% or less with respect to the maximum value of the thickness.

As a result of the surface observation of the above-mentioned monocrystal layer by a transmission electron microscope, it was confirmed that a transition defect density was controlled to $1 \times 10^3/cm^2$ or less, and additional crystal defects were not generated in the GaAs monocrystal layer formation step, which meant that good crystallinity was maintained.

EXAMPLE 3

A p-type (100) monocrystal Si substrate (an Si wafer) having a diameter of 3 inches and a thickness of 200 μm was subjected to anodization in a 50 wt. % HF solution. In this case, current density was 100 mA/cm². A porous structure formation rate in this case was 8.4 μm/min., and all of the p-type (100) Si substrate having a thickness of 200 μm was made porous in 24 minutes.

On the p-type (100) porous Si substrate, a Si epitaxial layer having a thickness of 0.5 μm was grown by a bias sputter method. Deposition conditions were as follows:
RF frequency: 100 MHz
High frequency power: 600 W
Temperature: 300° C.
Ar gas pressure: $8 \times 10^{-3}$ Torr
Growth time: 60 minutes
Target DC bias: −200 V
Substrate DC bias: +5 V Next, a GaAs semiconductor layer having a thickness of 2.2 μm was formed on the surface of this epitaxial layer, and afterward, another Si substrate on which a 5,000-Å-thick $SiO_2$ layer was formed was superposed upon the surface of the above-mentioned GaAs semiconductor layer. They were then heated at 800° C. for 0.5 hour in a nitrogen atmosphere to firmly bond the two Si substrates to each other. Next, the porous Si substrate was removed by etching with a hydrofluoric nitric acetic acid solution (1:3:8).

As described above, the etching rate of the usual Si monocrystal with the hydrofluoric nitric acetic acid solution is a little under about 1 μm per minute (the hydrofluoric nitric acetic acid solution 1:3:8), but the etching rate of the porous layer is about 100 times as much as that of the Si monocrystal. Thus, the porous Si substrate having a thickness of 200 μm was removed in 2 minutes.

Furthermore, the Si monocrystal layer and a part of the GaAs layer were removed to form the GaAs monocrystal layer having a thickness of 1-2 μm on the insulating layer.

EXAMPLE 4

A p-type (100) monocrystal Si substrate having a diameter of 3 inches and a thickness of 200 μm was subjected to anodization in a 50 wt. % HF solution. In this case, current density was 100 mA/cm². A porous structure formation rate in this case was 8.4 μm/min., and all of the p-type (100) Si substrate having a thickness of 200 μm was made porous in 24 minutes.

On the p-type (100) porous Si substrate, a Si epitaxial layer having a thickness of 0.5 μm was Grown by a liquid Growth method. Deposition conditions were as follows:
Solvent: Sn
Growth temperature: 900° C.
Growth atmosphere: $H_2$
Growth time: 10 minutes Next, a GaAs semiconductor layer having a thickness of 2.2 μm was formed on the surface of this epitaxial layer, and afterward, another Si substrate on which a 5,000-Å-thick $SiO_2$ layer and a laminated film of a SiON film and an AlN film were formed was superposed upon the surface of the above-mentioned GaAs semiconductor layer. They were then heated at 800° C. for 0.5 hour in a nitrogen atmosphere to firmly bond the two Si substrates to each other. Next, the porous Si substrate was removed by etching with a hydrofluoric nitric acetic acid solution (1:3:8). In this case, the porous Si substrate having a thickness of 200 μm was removed in 2 minutes.

Furthermore, the Si monocrystal layer and a part of the GaAs layer were removed to form the GaAs monocrystal layer having a thickness of 1-2 μm on the $SiO_2$ layer.

EXAMPLE 5

A p-type (100) monocrystal Si substrate having a diameter of 3 inches and a thickness of 200 μm was subjected to anodization in a 50 wt. % HF solution. In this case, current density was 100 mA/cm². A porous structure formation rate in this case was 8.4 μm/min., and all of the p-type (100) Si substrate having a thickness of 200 μm was made porous in 24 minutes.

On the p-type (100) porous Si substrate, an Si epitaxial layer having a thickness of 0.5 μm was grown by a low pressure CVD method. Deposition conditions were as follows:
Source gas: $SiH_4$
Carrier gas: $H_2$
Temperature: 850° C.
Pressure: $1 \times 10^{-2}$ Torr
Growth rate: 3.3 nm/sec.

Next, another Si substrate on which a 5,000-Å-thick $SiO_2$ layer was formed was superposed upon the surface of this epitaxial layer, and they were then heated at 800° C. for 0.5 hour in a nitrogen atmosphere to firmly bond the two Si substrates to each other. Next, the porous Si substrate was removed by etching with a hydrofluoric nitric acetic acid solution (1:3:8). In this case, the porous Si substrate having a thickness of 200 μm was removed in 2 minutes.

Furthermore, the Si monocrystal layer and a part of the GaAs layer were removed to form the GaAs monocrystal layer having a thickness of 1-2 μm on the $SiO_2$ layer.

When $SiH_2Cl_2$ was used as the source gas, it was necessary to raise the epitaxial growth temperature of Si as much as several tens degrees, but accelerated etching properties which were characteristic of the porous substrate could be maintained.

EXAMPLE 6

On a p-type (100) monocrystal Si substrate having a diameter of 3 inches and a thickness of 200 μm, an Si epitaxial layer having a thickness of 1 μm was grown by a CVD method. Deposition conditions were as follows:
Reaction gas flow rate: SiH$_4$Cl$_2$ (1,000 SCCM)
H$_2$: 230 l/min.
Temperature: 1,080° C.
Pressure: 80 Torr
Time: 2 minutes This substrate was then subjected to anodization in a 50 wt. % HF solution. In this case, current density was 100 mA/cm$^2$. A porous structure formation rate in this case was 8.4 μm/min., and all of the p-type (100) Si substrate having a thickness of 200 μm was made porous in 24 minutes. In this anodization, the p-type (100) Si substrate only was made porous, and the Si epitaxial layer did not change. Next, a GaAs semiconductor layer having a thickness of 2.2 μm was formed on the surface of this epitaxial layer. Afterward, another Si substrate on which a 5,000-Å-thick SiO$_2$ layer and a SiON layer were formed was superposed upon the surface of the above-mentioned GaAs semiconductor layer, and they were then heated at 800° C. for 0.5 hour in a nitrogen atmosphere to firmly bond the two Si substrates to each other. Next, the porous Si substrate was removed by etching with a hydrofluoric nitric acetic acid solution (1:3:8). In this case, the porous Si substrate having a thickness of 200 μm was removed in 2 minutes.

Furthermore, the Si monocrystal layer and a part of the GaAs layer were removed to form the GaAs monocrystal layer having a thickness of 1-2 μm on the insulating layer.

The thickness of the thus obtained GaAs monocrystal layer was inspected by the use of a Scanning Ellipsometer. As a result, it was apparent that the difference between a maximum value and a minimum value of the thickness of the monocrystal layer in the surface of the 3-inch wafer was controlled to 5% or less with respect to the maximum value of the thickness.

As a result of the surface observation of the monocrystal layer by a transmission electron microscope, it was confirmed that a transition defect density was controlled to $1 \times 10^3$/cm$^2$ or less, and additional crystal defects were not generated in the monocrystal layer formation step, which meant that good crystallinity was maintained.

EXAMPLE 7

On a p-type (100) monocrystal Si substrate having a diameter of 3 inches and a thickness of 200 μm, n Si epitaxial layer having a thickness of 0.5 μm was grown by a CVD method. Deposition conditions were as follows:
Reaction gas flow rate: SiH$_4$Cl$_2$ (1,000 sccm)
H$_2$: 230 l/min.
Temperature: 1,080° C.
Pressure: 80 Torr
Time: 1 minute This substrate was then subjected to anodization in a 50 wt. % HF solution. In this case, current density was 100 mA/cm$^2$. A porous structure formation rate in this case was 8.4 μm/min., and all of the p-type (100) Si substrate having a thickness of 200 μm was made porous in 24 minutes. In this anodization, the p-type (100) Si substrate only was made porous, and the Si epitaxial layer did not change. Next, a GaAs semiconductor layer having a thickness of 2.2 μm was formed on the surface of this epitaxial layer. Afterward, another Si substrate on which a 5,000-Å-thick SiO$_2$ layer and an AlN layer were formed was superposed upon the surface of the above-mentioned GaAs semiconductor layer, and they were then heated at 800° C. for 0.5 hour in a nitrogen atmosphere to firmly bond the two Si substrates to each other. Next, the porous Si substrate was removed by etching with a hydrofluoric nitric acetic acid solution (1:3:8). In this case, the porous Si substrate having a thickness of 200 μm was removed in 2 minutes.

Furthermore, the Si monocrystal layer and a part of the GaAs layer were removed to form the GaAs monocrystal layer having a thickness of 1-2 μm on the insulating layer.

As a result of section observation by a transmission electron microscope, it was confirmed that additional crystal defects were not generated in the GaAs monocrystal layer, and good crystallinity was maintained.

EXAMPLE 8

Protons were implanted in the surface of a p-type (100) Si substrate having a diameter of 3 inches and a thickness of 200 μm to form an n-type Si layer having a thickness of 1 μm. The dose of the implanted H$^+$ was $5 \times 10^{15}$ ions/cm$^2$. This substrate was then subjected to anodization in a 50 wt. % HF solution. In this case, current density was 100 mA/cm$^2$. A porous structure formation rate in this case was 8.4 μm/min., and all of the p-type (100) Si substrate having a thickness of 200 μm was made porous in 24 minutes. As described above, in this anodization, the p-type (100) Si substrate only was made porous, and the n-type Si layer did not change. Next, a GaAs semiconductor layer having a thickness of 2.2 μm was formed on the surface of this n-type Si layer. Afterward, another Si substrate on which a 5,000-Å-thick SiO$_2$ layer and an SiON layer were formed was superposed upon the surface of the above-mentioned GaAs semiconductor layer, and they were then heated at 800° C. for 0.5 hour in a nitrogen atmosphere to firmly bond the two Si substrates to each other. Next, the porous Si substrate was removed by etching with a hydrofluoric nitric acetic acid solution (1:3:8). In this case, the porous Si substrate having a thickness of 200 μm was removed in 2 minutes.

Furthermore, the Si monocrystal layer and a part of the GaAs layer were removed to form the GaAs monocrystal layer having a thickness of 1-2 μm on the insulating layer.

As a result of section observation by a transmission electron microscope, it was confirmed that additional crystal defects were not generated in the GaAs monocrystal layer, and good crystallinity was maintained.

EXAMPLE 9

A p-type (100) monocrystal Si substrate having a diameter of 3 inches and a thickness of 200 μm was subjected to anodization in a 50 wt. % HF solution. In this case, current density was 100 mA/cm$^2$. A porous structure formation rate in this case was 8.4 μm/min., and all of the p-type (100) Si substrate having a thickness of 200 μm was made porous in 24 minutes.

On the p-type (100) porous Si substrate, an Si epitaxial layer having a thickness of 0.5 μm was grown by an MBE (molecular beam epitaxy) method. Deposition conditions were as follows:
Temperature: 700° C.
Pressure: $1 \times 10^{-9}$ Torr
Growth rate: 0.1 nm/sec.

Next, a GaAs semiconductor layer having a thickness of 2.2 μm was formed on the surface of this epitaxial layer, and afterward, another Si substrate on which a 5,000-Å-thick SiO$_2$ layer and a SiON layer were formed was superposed upon the above-mentioned GaAs semiconductor layer. They were then heated at 800° C. for 0.5 hour in a nitrogen atmosphere to firmly bond the two Si substrates to each other. Next, the two bonded Si substrates were covered with Si$_3$N$_4$ as thick as 0.1 μm by a low pressure CVD method. Afterward, the nitride film only on the porous substrate was removed by reactive ion etching. Next, the porous Si substrate was removed by etching with a hydrofluoric nitric acetic acid solution (1:3:8). In this case, the porous Si substrate having a thickness of 200 μm was removed in 2 minutes. After the removal of Si$_3$N$_4$, the Si monocrystal layer and a part of the GaAs layer were further removed to form the GaAs monocrystal layer having a thickness of 1–2 μm on the insulating layer.

As a result of section observation by a transmission electron microscope, it was confirmed that additional crystal defects were not generated in the GaAs monocrystal layer, and good crystallinity was maintained.

EXAMPLE 10

A p-type (100) monocrystal Si substrate having a diameter of 3 inches and a thickness of 200 μm was subjected to anodization in a 50 wt. % HF solution. In this case, current density was 100 mA/cm$^2$. A porous structure formation rate in this case was 8.4 μm/min., and all of the p-type (100) Si substrate having a thickness of 200 μm was made porous in 24 minutes.

On the p-type (100) porous Si substrate, a Si epitaxial layer having a thickness of 0.5 μm was grown by a plasma CVD method. Deposition conditions were as follows:

Gas: SiH$_4$
High frequency power: 100 W
Temperature: 800° C.
Pressure: $1 \times 10^{-2}$ Torr
Growth rate: 2.5 nm/sec.

Next, a GaAs semiconductor layer having a thickness of 2.2 μm was formed on the surface of this epitaxial layer, and afterward, another Si substrate on which a 5,000-Å-thick SiO$_2$ layer and an SiON layer were formed was superposed upon the above-mentioned GaAs semiconductor layer. They were then heated at 800° C. for 0.5 hour in a nitrogen atmosphere to firmly bond the two Si substrates to each other. Next, two the bonded Si substrates were covered with Si$_3$N$_4$ as thick as 0.1 μm by a low pressure CVD method. Afterward, the nitride film only on the porous substrate was removed by reactive ion etching. Next, the porous Si substrate was removed by etching with a hydrofluoric nitric acetic acid solution (1:3:8). In this case, the porous Si substrate having a thickness of 200 μm was removed in 2 minutes. After the removal of the Si$_3$N$_4$ layer, the Si monocrystal layer and a part of the GaAs layer were further removed to form the GaAs monocrystal layer having a thickness of 1–2 μm on the insulating layer.

The thickness of the thus obtained GaAs monocrystal layer was inspected by the use of a Scanning Ellipsometer. As a result, it was apparent that the difference between the maximum value and the minimum value of the thickness of the monocrystal layer in the surface of the 3-inch wafer was controlled to 5% or less with respect to the maximum value of the thickness.

As a result of observation by defect-actualized etching using Sirtle etching, it was confirmed that a transition defect density was controlled to $1 \times 10^3$/cm$^2$ or less, and additional crystal defects were not generated in the monocrystal layer formation step, which meant that good crystallinity was maintained.

EXAMPLE 11

A p-type (100) monocrystal Si substrate having a diameter of 3 inches and a thickness of 200 μm was subjected to anodization in a 50 wt. % HF solution. In this case, current density was 100 mA/cm$^2$. A porous structure formation rate in this case was 8.4 μm/min., and all of the p-type (100) Si substrate having a thickness of 200 μm was made porous in 24 minutes.

On the p-type (100) porous Si substrate, an Si epitaxial layer having a thickness of 0.5 μm was grown by a bias sputter method. Deposition conditions were as follows:

RF frequency: 100 MHz
High frequency power: 600 W
Temperature: 300° C.
Ar gas pressure: $8 \times 10^{-3}$ Torr
Growth time: 60 minutes
Target DC bias: −200 V
Substrate DC bias: +5 V Next, a GaAs semiconductor layer having a thickness of 2.2 μm was formed on the surface of this epitaxial layer, and afterward, another Si substrate on which a 5,000-Å-thick SiO$_2$ layer and an AlN layer were formed was superposed upon the above-mentioned GaAs semiconductor layer. They were then heated at 800° C. for 0.5 hour in a nitrogen atmosphere to firmly bond the two Si substrates to each other. Next, the two bonded Si substrates were covered with Si$_3$N$_4$ as thick as 0.1 μm by a low pressure CVD method. Afterward, the nitride film only on the porous substrate was removed by reactive ion etching. Next, the porous Si substrate was removed by etching with a hydrofluoric nitric acetic acid solution (1:3:8). In this case, the porous Si substrate having a thickness of 200 μm was removed in 2 minutes. After the removal of the Si$_3$N$_4$ layer, the Si monocrystal layer and a part of the GaAs layer were further removed to form the GaAs monocrystal layer having a thickness of 1–2 μm on the insulating layer.

Furthermore, when Apiezon Wax was used in place of the Si$_3$N$_4$ layer, a similar effect was present, and the Si substrate only which was made porous was completely removed.

EXAMPLE 12

A p-type (100) monocrystal Si substrate having a diameter of 3 inches and a thickness of 200 μm was subjected to anodization in a 50 wt. % HF solution. In this case, current density was 100 mA/cm$^2$. A porous structure formation rate in this case was 8.4 μm/min., and all of the p-type (100) Si substrate having a thickness of 200 μm was made porous in 24 minutes.

On the p-type (100) porous Si substrate, an Si epitaxial layer having a thickness of 0.5 μm was grown by a liquid growth method. Deposition conditions were as follows:

Solvent: Sn
Growth temperature: 900° C.
Growth atmosphere: H$_2$
Growth time: 10 minutes
Target DC bias: −200 V Substrate DC bias: +5 V Next, a GaAs semiconductor layer having a thickness of 2.2 μm was formed on the surface of this epitaxial layer, and afterward, another Si substrate on which a 5,000-Å-thick $SiO_2$ layer was formed was superposed upon the above-mentioned GaAs semiconductor layer. They were then heated at 800° C. for 0.5 hour in a nitrogen atmosphere to firmly bond the two Si substrates to each other. Next, the bonded two Si substrates were covered with $Si_3N_4$ as thick as 0.1 μm by a low pressure CVD method. Afterward, the nitride film only on the porous substrate was removed by reactive ion etching. Next, the porous Si substrate was removed by etching with a hydrofluoric nitric acetic acid solution (1:3:8). In this case, the porous Si substrate having a thickness of 200 μm was removed in 2 minutes. After the removal of the $Si_3N_4$ layer, the Si monocrystal layer and a part of the GaAs layer were further removed to form the GaAs monocrystal layer having a thickness of 1-2 μm on the insulating layer.

Furthermore, when Apiezon Wax was used in place of the $Si_3N_4$ layer, a similar effect was present, and the Si substrate only which was made porous was completely removed.

EXAMPLE 13

A p-type (100) monocrystal Si substrate having a diameter of 3 inches and a thickness of 200 μm was subjected to anodization in a 50 wt. % HF solution. In this case, current density was 100 mA/cm². A porous structure formation rate in this case was 8.4 μm/min., and all of the p-type (100) Si substrate having a thickness of 200 μm was made porous in 24 minutes.

On the p-type (100) porous Si substrate, a Si epitaxial layer having a thickness of 0.5 μm was grown by a low pressure CVD method. Deposition conditions were as follows:
 Source gas: $SiH_4$
 Carrier gas: $H_2$
 Temperature: 850° C.
 Pressure: $1 \times 10^{-2}$ Torr
 Growth rate: 3.3 nm/sec.

Next, a GaAs semiconductor layer having a thickness of 2.2 μm was formed on the surface of this epitaxial layer, and afterward, another Si substrate on which a 10,000-Å-thick $SiO_2$ layer and an AlN layer were formed was superposed upon the above-mentioned GaAs semiconductor layer. They were then heated at 800° C. for 0.5 hour in a nitrogen atmosphere to firmly bond the two Si substrates to each other. Next, the two bonded Si substrates were covered with $Si_3N_4$ as thick as 0.1 μm by a low pressure CVD method. Afterward, the nitride film only on the porous substrate was removed by reactive ion etching. Next, the porous Si substrate was removed by etching with a hydrofluoric nitric acetic acid solution (1:3:8). In this case, the porous Si substrate having a thickness of 200 μm was removed in 2 minutes. After the removal of the $Si_3N_4$ layer, the Si monocrystal layer and a part of the GaAs layer were further removed to form the GaAs monocrystal layer having a thickness of 1-2 μm on the insulating layer.

When $SiH_2Cl_2$ was used as the source gas, it was necessary to raise the epitaxial growth temperature of Si as much as several tens of degrees, but accelerated etching properties which were characteristic of the porous substrate could be maintained.

EXAMPLE 14

On a p-type (100) monocrystal Si substrate having a diameter of 3 inches and a thickness of 200 μm, an Si epitaxial layer having a thickness of 1 μm was grown by a CVD method. Deposition conditions were as follows:
 Reaction gas flow rate: $SiH_4Cl_2$ (1,000 sccm)
 $H_2$: 230 l/min.
 Temperature: 1,080° C.
 Pressure: 80 Torr
 Time: 2 minutes This substrate was then subjected to anodization in a 50 wt. % HF solution. In this case, current density was 100 mA/cm². A porous structure formation rate in this case was 8.4 μm/min., and all of the p-type (100) Si substrate having a thickness of 200 μm was made porous in 24 minutes. In this anodization, the p-type (100) Si substrate only was made porous, and the Si epitaxial layer did not change. Next, a GaAs semiconductor layer having a thickness of 2.2 μm was formed on the surface of this epitaxial layer. Afterward, another Si substrate on which a 9,000-Å-thick $SiO_2$ layer and a SiON layer were formed was superposed upon the surface of the above-mentioned GaAs semiconductor layer, and they were then heated at 800° C. for 0.5 hour in a nitrogen atmosphere to firmly bond the two Si substrates to each other. The thus bonded two Si substrates were covered with $Si_3N_4$ as thick as 0.1 μm by a low pressure CVD method. Afterward, the nitride film only on the porous substrate was removed by reactive ion etching. Next, the porous Si substrate was removed by etching with a hydrofluoric nitric acetic acid solution (1:3:8). In this case, the porous Si substrate having a thickness of 200 μm was removed in 2 minutes.

After the removal of $Si_3N_4$, the Si monocrystal layer and a part of the GaAs layer were further removed to form the GaAs monocrystal layer having a thickness of 1-2 μm on the insulating layer.

The thickness of the thus obtained GaAs monocrystal layer was inspected by the use of a Scanning Ellipsometer. As a result, it was apparent that the difference between the maximum value and the minimum value of the thickness of the monocrystal layer in the surface of the 3-inch wafer was controlled to 5% or less with respect to the maximum value of the thickness.

As a result of the surface observation of the monocrystal layer by a transmission electron microscope, it was confirmed that a transition defect density was controlled to $1 \times 10^3$/cm² or less, and additional crystal defects were not generated in the monocrystal layer formation step, which meant good crystallinity was maintained.

EXAMPLE 15

On a p-type (100) monocrystal Si substrate having a diameter of 3 inches and a thickness of 200 μm, an Si epitaxial layer having a thickness of 0.5 μm was grown by a CVD method. Deposition conditions were as follows:
 Reaction gas flow rate: $SiH_4Cl_2$ (1,000 sccm)
 $H_2$: 230 l/min.
 Temperature: 1,080° C.
 Pressure: 80 Torr
 Time: 1 minute This substrate was then subjected to anodization in a 50 wt. % HF solution. In this case, current density was 100 mA/cm². A porous structure formation rate in this case was 8.4 μm/min., and all of the p-type (100) Si substrate having a thickness of 200 μm was made porous in 24 minutes. In this anodization, the p-type (100) Si substrate only was made porous, and the Si epitaxial layer did not change.

Next, a GaAs semiconductor layer having a thickness of 2.2 μm was formed on the surface of this epitaxial layer. Afterward, another Si substrate on which a 8,000-Å-thick $SiO_2$ layer and an SiON layer were formed was superposed upon the surface of the above-mentioned GaAs semiconductor layer, and they were then heated at 800° C. for 0.5 hour in a nitrogen atmosphere to firmly bond the two Si substrates to each other. The thus bonded two Si substrates were then covered with $Si_3N_4$ as thick as 0.1 μm by a low pressure CVD method. Afterward, the nitride film only on the porous substrate was removed by reactive ion etching. Next, the porous Si substrate was removed by etching with a hydrofluoric nitric acetic acid solution (1:3:8). In this case, the porous Si substrate having a thickness of 200 μm was removed in 2 minutes. After the removal of the $Si_3N_4$ layer, the Si monocrystal layer and a part of the GaAs layer were further removed to form the GaAs monocrystal layer having a thickness of 1-2 μm on the insulating layer. As a result of section observation by a transmission electron microscope, it was confirmed that additional crystal defects were not Generated in the GaAs monocrystal layer, and Good crystallinity was maintained.

EXAMPLE 16

Protons were implanted in the surface of a p-type (100) Si substrate having a diameter of 3 inches and a thickness of 200 μm to form an n-type Si layer having a thickness of 1 μm. The dose of the implanted $H^+$ was $5 \times 10^{15}$ ions/cm². This substrate was then subjected to anodization in a 50 wt. % HF solution. In this case, current density was 100 mA/cm². A porous structure formation rate in this case was 8.4 μm/min., and all of the p-type (100) Si substrate having a thickness of 200 μm was made porous in 24 minutes. In this anodization, the p-type (100) Si substrate only was made porous, and the n-type Si layer did not change. Next, on the surface of this n-type Si layer, a GaAs semiconductor layer having a thickness of 2.2 μm was formed. Afterward, another Si substrate on which a 8,000-Å-thick $SiO_2$ layer and a SiON layer were formed was superposed upon the surface of the GaAs semiconductor layer, and they were then heated at 800° C. for 0.5 hour in an oxygen atmosphere to firmly bond the two Si substrates to each other. The thus bonded two Si substrates were then covered with $Si_3N_4$ as thick as 0.1 μm by a low pressure CVD method. Afterward, the nitride film only on the porous substrate was removed by reactive ion etching. Next, the porous Si substrate was removed by etching with a hydrofluoric nitric acetic acid solution (1:3:8). In this case, the porous Si substrate having a thickness of 200 μm was removed in 2 minutes. After the removal of the $Si_3N_4$ layer, the Si monocrystal layer and a part of the GaAs layer were further removed to form the GaAs monocrystal layer having a thickness of 1-2 μm on the insulating layer. As a result of section observation by a transmission electron microscope, it was confirmed that additional crystal defects were not generated in the GaAs monocrystal layer, and good crystallinity was maintained.

EXAMPLE 17

A p-type (100) monocrystal Si substrate having a diameter of 3 inches and a thickness of 200 μm was subjected to anodization in a 50 wt. % HF solution. In this case, current density was 100 mA/cm². A porous structure formation rate in this case was 8.4 μm/min., and all of the p-type (100) Si substrate having a thickness of 200 μm was made porous in 24 minutes.

On the p-type (100) porous Si substrate, an Si epitaxial layer having a thickness of 0.5 μm was grown by an MBE (molecular beam epitaxy) method. Deposition conditions were as follows:
Temperature: 700° C.
Pressure: $1 \times 10^{-9}$ Torr
Growth rate: 0.1 nm/sec.

Next, on the surface of this epitaxial layer a GaAs semiconductor layer having a thickness of 2.2 μm and then a SiON layer having a thickness of 1,000 Å were formed. Afterward, another Si substrate on which a 8,000-Å-thick $SiO_2$ layer and an AlN layer were formed was superposed upon the surface of the above-mentioned SiON layer, and they were then heated at 800° C. for 0.5 hour in a nitrogen atmosphere to firmly bond of both the substrates to each other. The thus bonded two Si substrates were then covered with $Si_3N_4$ as thick as 0.1 μm by a low pressure CVD method. Afterward, the nitride film only on the porous substrate was removed by reactive ion etching. Next, the porous Si substrate was removed by etching with a hydrofluoric nitric acetic acid solution (1:3:8). In this case, the porous Si substrate having a thickness of 200 μm was removed in 2 minutes. After the removal of the $Si_3N_4$ layer, the Si monocrystal layer and a part of the GaAs layer were further removed to form the GaAs monocrystal layer having a thickness of 1-2 μm on the SiON layer. As a result of section observation by a transmission electron microscope, it was confirmed that additional crystal defects were not generated in the GaAs monocrystal layer, and good crystallinity was maintained.

EXAMPLE 18

A p-type (100) monocrystal Si substrate having a diameter of 3 inches and a thickness of 200 μm was subjected to anodization in a 50 wt. % HF solution. In this case, current density was 100 mA/cm². A porous structure formation rate in this case was 8.4 μm/min., and all of the p-type (100) Si substrate having a thickness of 200 μm was made porous in 24 minutes. On the p-type (100) porous Si substrate, a Si epitaxial layer having a thickness of 5 μm was grown by a plasma CVD method. Deposition conditions were as follows:
Gas: $SiH_4$
High frequency power: 100 W
Temperature: 800° C.
Pressure: $1 \times 10^{-2}$ Torr
Growth rate: 2.5 nm/sec.

Next, on the surface of this epitaxial layer, there were formed a GaAs semiconductor layer having a thickness of 2.2 μm and then a SiON layer having a thickness of 1,000 Å. Afterward, another Si substrate on which a 5,000-Å-thick $SiO_2$ layer was formed was superposed upon the surface of the above-mentioned SiON layer, and they were then heated at 800° C. for 0.5 hour in a nitrogen atmosphere to firmly bond both the substrates to each other. The thus bonded two Si substrates were then covered with $Si_3N_4$ as thick as 0.1 μm by a low pressure CVD method. Afterward, the nitride film only on the porous substrate was removed by reactive ion etching. Next, the porous Si substrate was removed by etching with a KOH solution (6M). In this case, the porous Si substrate having a thickness of 200 μm was removed in 2 minutes. After the removal of the Si$_3$N$_4$ layer, the Si monocrystal layer and a part of the GaAs layer were further removed to form the GaAs monocrystal layer having a thickness of 1-2 μm on the insulating layer.

The thickness of the thus obtained GaAs monocrystal layer was inspected by the use of a Scanning Ellipsometer. As a result, it was apparent that the difference between the maximum value and the minimum value of the thickness of the monocrystal layer in the surface of the 3-inch wafer was controlled to 5% or less with respect to the maximum value of the thickness.

As a result of the surface observation of the monocrystal layer by a transmission electron microscope, it was confirmed that a transition defect density was controlled to $1 \times 10^3$/cm$^2$ or less, and additional crystal defects were not generated in the monocrystal layer formation step, which meant that good crystallinity was maintained.

EXAMPLE 19

A p-type (100) monocrystal Si substrate having a diameter of 3 inches and a thickness of 200 μm was subjected to anodization in a 50 wt. % HF solution. In this case, current density was 100 mA/cm$^2$. A porous structure formation rate in this case was 8.4 μm/min., and all of the p-type (100) Si substrate having a thickness of 200 μm was made porous in 24 minutes. On the p-type (100) porous Si substrate, an Si epitaxial layer having a thickness of 1 μm was grown by a bias sputter method. Deposition conditions were as follows:

RF frequency: 100 MHz
High frequency power: 600 W
Temperature: 300° C.
Ar gas pressure: $8 \times 10^{-3}$ Torr
Growth time: 120 minutes
Target DC bias: −200 V
Substrate DC bias: +5 V Next, on the surface of this epitaxial layer, there were formed a GaAs semiconductor layer having a thickness of 2.2 μm and then a SiON layer having a thickness of 1,000 Å. Afterward, another Si substrate on which a 5,000-Å-thick SiO$_2$ layer and a SiON layer were formed was superposed upon the surface of the above-mentioned SiO$_2$ layer, and they were then heated at 800° C. for 0.5 hour in a nitrogen atmosphere to firmly bond both the substrates to each other. The thus bonded two Si substrates were then covered with Si$_3$N$_4$ as thick as 0.1 μm by a low pressure CVD method. Afterward, the nitride film only on the porous substrate was removed by reactive ion etching. Next, the porous Si substrate was removed by etching with a hydrofluoric nitric acetic acid solution (1:3:8). In this case, the porous Si substrate having a thickness of 200 μm was removed in 2 minutes. After the removal of the Si$_3$N$_4$ layer, the Si monocrystal layer and a part of the GaAs layer were further removed to form the GaAs monocrystal layer having a thickness of 1-2 μm on the insulating layer.

Furthermore, when Apiezon Wax was used in place of the Si$_3$N$_4$ layer, a similar effect was present, and the Si substrate only which was made porous was completely removed.

EXAMPLE 20

A p-type (100) monocrystal Si substrate having a diameter of 3 inches and a thickness of 200 μm was subjected to anodization in a 50 wt. % HF solution. In this case, current density was 100 mA/cm$^2$. A porous structure formation rate in this case was 8.4 μm/min., and all of the p-type (100) Si substrate having a thickness of 200 μm was made porous in 24 minutes. On the p-type (100) porous Si substrate, a Si epitaxial layer having a thickness of 5 μm was grown by a liquid growth method. Deposition conditions were as follows:

Solvent: Sn
Growth temperature: 900° C.
Growth atmosphere: H$_2$
Growth time: 10 minutes Next, on the surface of this epitaxial layer, there were formed a GaAs semiconductor layer having a thickness of 2.2 μm and then a SiON layer having a thickness of 1,000 Å. Afterward, another Si substrate on which a 5,000-Å-thick SiO$_2$ layer and an SiON layer were formed was superposed upon the surface of the above-mentioned SiO$_2$ layer, and they were then heated at 700° C. for 0.5 hour to firmly bond both the substrates to each other. The thus bonded two Si substrates were then covered with Si$_3$N$_4$ as thick as 0.1 μm by a low pressure CVD method. Afterward, the nitride film only on the porous substrate was removed by reactive ion etching. Next, the porous Si substrate was removed by etching with a hydrofluoric nitric acetic acid solution (1:3:8). In this case, the porous Si substrate having a thickness of 200 μm was removed in 2 minutes. After the removal of the Si$_3$N$_4$ layer, the Si monocrystal layer and a part of the GaAs layer were further removed to form the GaAs monocrystal layer having a thickness of 1-2 μm on the insulating layer. Furthermore, when Apiezon Wax was used in place of the Si$_3$N$_4$ layer, a similar effect was present, and the Si substrate only which was made porous was completely removed.

The thickness of the thus obtained GaAs monocrystal layer was inspected by the use of a Scanning Ellipsometer. As a result, it was apparent that the difference between the maximum value and the minimum value of the thickness of the monocrystal layer in the surface of the 3-inch wafer was controlled to 5% or less with respect to the maximum value of the thickness.

As a result of the surface observation of the monocrystal layer by a transmission electron microscope, it was confirmed that a transition defect density was controlled to $1 \times 10^3$/cm$^2$ or less, and additional crystal defects were not generated in the monocrystal layer formation step, which meant that good crystallinity was maintained.

EXAMPLE 21

A p-type (100) monocrystal Si substrate having a diameter of 3 inches and a thickness of 200 μm was subjected to anodization in a 50 wt. % HF solution. In this case, current density was 100 mA/cm$^2$. A porous structure formation rate in this case was 8.4 μm/min., and all of the p-type (100) Si substrate having a thickness of 200 μm was made porous in 24 minutes. On the p-type (100) porous Si substrate, an Si epitaxial layer having a thickness of 1.0 μm was grown at a low temperature by a low pressure CVD method. Deposition conditions were as follows:

Source gas: SiH$_4$

Carrier gas: H$_2$
Temperature: 850° C.
Pressure: 1×10$^{-2}$ Torr
Growth rate: 3.3 nm/sec.

Next, on the surface of this epitaxial layer there were formed a GaAs semiconductor layer having a thickness of 2.2 μm and then a SiON layer having a thickness of 1,000 Å. Afterward, another Si substrate on which a 5,000-Å-thick SiO$_2$ layer and a SiON layer were formed was brought into close contact with the above-mentioned SiO$_2$ layer, and they were then heated at 700° C. for 0.5 hour to firmly bond both the substrates to each other. The thus bonded two Si substrates were then covered with Si$_3$N$_4$ as thick as 0.1 μm by a low pressure CVD method. Afterward, the nitride film only on the porous substrate was removed by reactive ion etching. Next, the porous Si substrate was removed by etching with a hydrofluoric nitric acetic acid solution (1:3:8). In this case, the porous Si substrate having a thickness of 200 μm was removed in 2 minutes. After the removal of the Si$_3$N$_4$ layer, the Si monocrystal layer and a part of the GaAs layer were further removed to form the GaAs monocrystal layer having a thickness of 1-2 μm on the insulating layer.

When SiH$_2$Cl$_2$ was used as the source gas, it was necessary to raise the epitaxial growth temperature of Si as much as several tens degrees, but accelerated etching properties which were characteristic of the porous substrate could be maintained.

EXAMPLE 22

On a p-type (100) monocrystal Si substrate having a diameter of 3 inches and a thickness of 200 μm, an Si epitaxial layer having a thickness of 1 μm was grown by a CVD method. Deposition conditions were as follows:
Reaction gas flow rate: SiH$_4$Cl$_2$ (1,000 SCCM)
H$_2$: 230 l/min.
Temperature: 1,080° C.
Pressure: 80 Torr
Time: 2 minutes This substrate was then subjected to anodization in a 50 wt. % HF solution. In this case, current density was 100 mA/cm$^2$. A porous structure formation rate in this case was 8.4 μm/min., and all of the p-type (100) Si substrate having a thickness of 200 μm was made porous in 24 minutes. In this anodization, the p-type (100) Si substrate only was made porous, and the Si epitaxial layer did not change. Next, on the surface of this epitaxial layer, there were formed a GaAs semiconductor layer having a thickness of 2.2 μm and then a SiON layer. Afterward, another Si substrate on which a 8,000-Å-thick SiO$_2$ layer and a SiON layer were formed was superposed upon the surface of the above-mentioned SiO$_2$ layer, and they were then heated at 800° C. for 0.5 hour in a nitrogen atmosphere to firmly bond the two Si substrates to each other. The thus bonded two Si substrates were covered with Si$_3$N$_4$ as thick as 0.1 μm by a low pressure CVD method. Afterward, the nitride film only on the porous substrate was removed by reactive ion etching. Next, the porous Si substrate was removed by etching with a hydrofluoric nitric acetic acid solution (1:3:8). In this case, the porous Si substrate having a thickness of 200 μm was removed in 2 minutes. After the removal of Si$_3$N$_4$, the Si monocrystal layer and a part of the GaAs layer were further removed to form the GaAs monocrystal layer having a thickness of 1-2 μm on the insulating layer.

As a result of section observation by a transmission electron microscope, it was confirmed that additional crystal defects were not generated in the GaAs monocrystal layer, and good crystallinity was maintained.

EXAMPLE 23

On a p-type (100) monocrystal Si substrate having a diameter of 4 inches and a thickness of 500 μm, an Si epitaxial layer having a thickness of 0.5 μm was grown by a CVD method. Deposition conditions were as follows:
Reaction gas flow rate: SiH$_4$Cl$_2$ (1,000 SCCM)
H$_2$: 230 l/min.
Temperature: 1,080° C.
Pressure: 80 Torr
Time: 1 minute This substrate was then subjected to anodization in a 50 wt. % HF solution. In this case, current density was 100 mA/cm$^2$. A porous structure formation rate in this case was 8.4 μm/min., and all of the p-type (100) Si substrate having a thickness of 500 μm was made porous. In this anodization, the p-type (100) Si substrate only was made porous, and the Si epitaxial layer did not change.

Next, on the surface of this epitaxial layer, there were formed a GaAs semiconductor layer having a thickness of 2.2 μm and then an SiON layer having a thickness of 1,000 Å. Afterward, another Si substrate on which a 8,000-Å-thick SiO$_2$ layer and an SiON layer were formed was brought into close contact with the above-mentioned SiO$_2$ layer, and they were then heated at 700° C. for 0.5 hour to firmly bond the two Si substrates to each other. The thus bonded two Si substrates were covered with Si$_3$N$_4$ as thick as 0.1 μm by a low pressure CVD method, and the nitride film only on the porous substrate was removed by reactive ion etching. Next, the porous Si substrate was removed by etching with a hydrofluoric nitric acetic acid solution (1:3:8). In this case, the porous Si substrate having a thickness of 500 μm was removed in 7 minutes. After the removal of Si$_3$N$_4$, the Si monocrystal layer and a part of the GaAs layer were further removed to form the GaAs monocrystal layer having a thickness of 1-2 μm on the insulating layer.

The thickness of the thus obtained GaAs monocrystal layer was inspected by the use of a Scanning Ellipsometer. As a result, it was apparent that a difference between a maximum value and a minimum value of the thickness of the monocrystal layer in the surface of the 3-inch wafer was controlled to 5% or less with respect to the maximum value of the thickness.

As a result of the surface observation of the monocrystal layer by a transmission electron microscope, it was confirmed that a transition defect density was controlled to 1×10$^3$/cm$^2$ or less, and additional crystal defects were not generated in the monocrystal layer formation step, which meant that good crystallinity was maintained.

EXAMPLE 24

Protons were implanted in the surface of a p-type (100) Si substrate having a diameter of 3 inches and a thickness of 200 μm to form an n-type Si layer having a thickness of 1 μm. The dose of the implanted H+ was 5×10$^{15}$ ions/cm$^2$. This substrate was then subjected to anodization in a 50 wt. % HF solution. In this case, current density was 100 mA/cm$^2$. A porous structure formation rate in this case was 8.4 μm/min., and all of the p-type (100) Si substrate having a thickness of 200 μm was made porous in 24 minutes. In this anodization, the p-type (100) Si substrate only was made porous, and the n-type Si layer did not change. Next, on the surface of this epitaxial layer, there were formed a GaAs semiconductor layer having a thickness of 2.2 μm and then a SiON layer having a thickness of 1,000 Å. Afterward, another Si substrate on which a 8,000-Å-thick SiO$_2$ layer and a SiON layer were formed was brought into close contact with the above-mentioned SiO$_2$ layer, and they were then heated at 700° C. for 0.5 hour to firmly bond the two Si substrates to each other. The thus bonded two Si substrates were then covered with Si$_3$N$_4$ as thick as 0.1 μm by a low pressure CVD method. Afterward, the nitride film only on the porous substrate was removed by reactive ion etching. Next, the porous Si substrate was removed by etching with a hydrofluoric nitric acetic acid solution (1:3:8). In this case, the porous Si substrate having a thickness of 200 μm was removed in 2 minutes. After the removal of the Si$_3$N$_4$ layer, the Si monocrystal layer and a part of the GaAs layer were further removed to form the GaAs monocrystal layer having a thickness of 1-2 μm on the insulating layer. As a result of section observation by a transmission electron microscope, it was confirmed that additional crystal defects were not generated in the GaAs monocrystal layer, and good crystallinity was maintained.

EXAMPLE 25

A p-type (100) monocrystal Si substrate having a diameter of 3 inches and a thickness of 200 μm was subjected to anodization in a 50 wt. % HF solution. In this case, current density was 100 mA/cm$^2$. A porous structure formation rate in this case was 8.4 μm/min., and all of the p-type (100) Si substrate having a thickness of 200 μm was made porous in 24 minutes.

On the p-type (100) porous Si substrate, a Si epitaxial layer having a thickness of 0.5 μm was grown by an MBE (molecular beam epitaxy) method. Deposition conditions were as follows:

Temperature: 700° C.
Pressure: 1×10$^{-9}$ Torr
Growth rate: 0.1 nm/sec.

Next, on the surface of this epitaxial layer, a GaAs semiconductor layer having a thickness of 2.2 μm and then an Al$_x$N$_{1-x}$ layer having a thickness of 1,000 Å were formed. Afterward, another Si substrate on which a 8,000-Å-thick SiO$_2$ layer and an Al$_x$N$_{1-x}$ layer were formed was superposed upon the above-mentioned SiO$_2$ layer, and they were then heated at 800° C. for 0.5 hour in a nitrogen atmosphere to firmly bond both the substrates to each other. Next, the porous Si substrate was removed by etching with a hydrofluoric nitric acetic acid solution (1:3:8). In this case, the porous Si substrate having a thickness of 200 μm was removed in 2 minutes.

Afterward, the Si monocrystal layer and a part of the GaAs layer were further removed to form the GaAs monocrystal layer having a thickness of 1-2 μm. As a result of section observation by a transmission electron microscope, it was confirmed that additional crystal defects were not generated in the GaAs monocrystal layer, and good crystallinity was maintained.

EXAMPLE 26

A p-type (100) monocrystal Si substrate having a diameter of 3 inches and a thickness of 200 μm was subjected to anodization in a 50 wt. % HF solution. In this case, current density was 100 mA/cm$^2$. A porous structure formation rate in this case was 8.4 μm/min., and all of the p-type (100) Si substrate having a thickness of 200 μm was made porous in 24 minutes. On the p-type (100) porous Si substrate, an Si epitaxial layer having a thickness of 5 μm was grown by a plasma CVD method. Deposition conditions were as follows:

Gas: SiH$_4$
High frequency power: 100 W
Temperature: 800° C.
Pressure: 1×10$^{-2}$ Torr
Growth rate: 2.5 nm/sec.

Next, on the surface of this epitaxial layer, a GaAs semiconductor layer having a thickness of 2.2 μm and then an Al$_x$N$_{1-x}$ layer having a thickness of 1,000 Å were formed. Afterward, another Si substrate on which a 8,000-Å-thick SiO$_2$ layer and an Al$_x$N$_{1-x}$ layer were formed was superposed upon the above-mentioned SiO$_2$ layer, and they were then heated at 800° C. for 0.5 hour in a nitrogen atmosphere to firmly bond both the substrates to each other. Next, the porous Si substrate was removed by etching with a 6M KOH solution.

As described above, the etching rate of the usual Si monocrystal with the 6M KOH solution is a little under about 1 μm per minute, but the etching rate of the porous layer is about 100 times as much as that of the Si monocrystal. Thus, the porous Si substrate having a thickness of 200 μm was removed in 2 minutes.

Furthermore, the Si monocrystal layer and a part of the GaAs layer were removed to form the GaAs monocrystal layer having a thickness of 1-2 μm on the insulating layer.

EXAMPLE 27

A p-type (100) monocrystal Si substrate having a diameter of 5 inches and a thickness of 600 μm was subjected to anodization in a 50 wt. % HF solution. In this case, current density was 100 mA/cm$^2$. A porous structure formation rate in this case was 8.4 μm/min., and all of the p-type (100) Si substrate having a thickness of 600 μm was made porous in 70 minutes. On the p-type (100) porous Si substrate, a Si epitaxial layer having a thickness of 1 μm was grown by a bias sputter method. Deposition conditions were as follows:

RF frequency: 100 MHz
High frequency power: 600 W
Temperature: 300° C.
Ar gas pressure: 8×10$^{-3}$ Torr
Growth time: 120 minutes
Target DC bias: −200 V
Substrate DC bias: +5 V Next, on the surface of this epitaxial layer, there were formed a GaAs semiconductor layer having a thickness of 2.2 μm and then a SiN layer having a thickness of 1,000 Å. Afterward, another Si substrate on which a 8,000-Å-thick SiO$_2$ layer and a SiON layer were formed was superposed upon the surface of the above-mentioned SiN layer, and they were then heated at 800° C. for 0.5 hour in a nitrogen atmosphere to firmly bond both the substrates to each other. Next, the porous Si substrate was removed by etching with a hydrofluoric nitric acetic acid solution (1:3:8). In this case, the porous Si substrate having a thickness of 600 μm was removed in 7 minutes.

Afterward, the Si monocrystal layer and a part of the GaAs layer were further removed to form the GaAs monocrystal layer having a thickness of 1-2 μm on the insulating layer.

The thickness of the thus obtained GaAs monocrystal layer was inspected by the use of a Scanning Ellipsometer. As a result, it was apparent that a difference between a maximum value and a minimum value of the thickness of the monocrystal layer in the surface of the 3-inch wafer was controlled to 5% or less with respect to the maximum value of the thickness.

As a result of the surface observation of the monocrystal layer by a transmission electron microscope, it was confirmed that a transition defect density was controlled to $1 \times 10^3$/cm² or less, and additional crystal defects were not generated in the monocrystal layer formation step, which meant that good crystallinity was maintained.

EXAMPLE 28

A p-type (100) monocrystal Si substrate having a diameter of 3 inches and a thickness of 200 μm was subjected to anodization in a 50 wt. % HF solution. In this case, current density was 100 mA/cm². A porous structure formation rate in this case was 8.4 μm/min., and all of the p-type (100) Si substrate having a thickness of 200 μm was made porous in 24 minutes. On the p-type (100) porous Si substrate, a Si epitaxial layer having a thickness of 5 μm was grown by a liquid growth method. Deposition conditions were as follows:
  Solvent: Sn
  Growth temperature: 900° C.
  Growth atmosphere: $H_2$
  Growth time: 10 minutes Next, on the surface of this epitaxial layer, a GaAs semiconductor layer having a thickness of 2.2 μm and then an $Al_xN_{1-x}$ layer having a thickness of 1,000 Å were formed. Afterward, another Si substrate on which a 8,000-Å-thick $SiO_2$ layer and an $Al_xN_{1-x}$ layer were formed was brought into close contact with the above-mentioned porous substrate, and they were then heated at 700° C. for 0.5 hour to firmly bond the two Si substrates to each other. Next, the porous Si substrate was removed by etching with a hydrofluoric nitric acetic acid solution (1:3:8). In this case, the porous Si substrate having a thickness of 200 μm was removed in 2 minutes.

Afterward, the Si monocrystal layer and a part of the GaAs layer were further removed to form the GaAs monocrystal layer having a thickness of 1-2 μm on the insulating layer.

EXAMPLE 29

A p-type (100) monocrystal Si substrate having a diameter of 3 inches and a thickness of 200 μm was subjected to anodization in a 50 wt. % HF solution. In this case, current density was 100 mA/cm². A porous structure formation rate in this case was 8.4 μm/min., and all of the p-type (100) Si substrate having a thickness of 200 μm was made porous in 24 minutes. On the p-type (100) porous Si substrate, a Si epitaxial layer having a thickness of 0.1 μm was grown by a low pressure CVD method. Deposition conditions were as follows:
  Source gas: $SiH_4$
  Carrier gas: $H_2$
  Temperature: 850 ° C.
  Pressure: $1 \times 10^{-2}$ Torr
  Growth rate: 3.3 nm/sec.

Next, on the surface of this epitaxial layer, there were formed a GaAs semiconductor layer having a thickness of 2.2 μm and then a SiON layer having a thickness of 1,000 Å. Afterward, another Si substrate on which a 8,000-Å-thick $SiO_2$ layer and a SiON layer were formed was brought into close contact with the above-mentioned SiON layer, and they were then heated at 700° C. for 0.5 hour to firmly bond the two Si substrates to each other. Next, the porous Si substrate was removed by etching with a hydrofluoric nitric acetic acid solution (1:3:8). In this case, the porous Si substrate having a thickness of 200 μm was removed in 2 minutes.

Afterward, the Si monocrystal layer and a part of the GaAs layer were further removed to form the GaAs monocrystal layer having a thickness of 1-2 μm on the insulating layer. When $SiH_2Cl_2$ was used as the source gas, it was necessary to raise the epitaxial growth temperature of Si as much as several tens degrees, but accelerated etching properties which were characteristic of the porous substrate could be maintained.

EXAMPLE 30

On a p-type (100) monocrystal Si substrate having a diameter of 3 inches and a thickness of 200 μm, an Si epitaxial layer having a thickness of 1 μm was grown by a CVD method. Deposition conditions were as follows:
  Reaction gas flow rate: $SiH_4Cl_2$ (1,000 SCCM)
  $H_2$: 230 l/min.
  Temperature: 1,080° C.
  Pressure: 80 Torr
  Time: 2 minutes This substrate was then subjected to anodization in a 50 wt. % HF solution. In this case, current density was 100 mA/cm². A porous structure formation rate in this case was 8.4 μm/min., and all of the p-type (100) Si substrate having a thickness of 200 μm was made porous. In this anodization, the p-type (100) Si substrate only was made porous, and the Si epitaxial layer did not change. Next, on the surface of this epitaxial layer, there was formed a GaAs semiconductor layer having a thickness of 2.2 μm. Afterward, another Si substrate on which a 8,000-Å-thick $SiO_2$ layer and an SiON layer were formed was superposed upon the surface of the above-mentioned GaAs semiconductor layer, and they were then heated at 800° C. for 0.5 hour in a nitrogen atmosphere to firmly bond the two Si substrates to each other. Next, the porous Si substrate was removed by etching with a hydrofluoric nitric acetic acid solution (1:3:8). In this case, the porous Si substrate having a thickness of 200 μm was removed in 2 minutes.

Afterward, the Si monocrystal layer and a part of the GaAs layer were further removed to form the GaAs monocrystal layer having a thickness of 1-2 μm on the insulating layer. As a result of section observation by a transmission electron microscope, it was confirmed that additional crystal defects were not generated in the GaAs monocrystal layer, and good crystallinity was maintained.

EXAMPLE 31

On a p-type (100) monocrystal Si substrate having a diameter of 3 inches and a thickness of 200 μm, an Si epitaxial layer having a thickness of 0.5 μm was grown by a CVD method. Deposition conditions were as follows:
  Reaction gas flow rate: $SiH_4Cl_2$ (1,000 SCCM)
  $H_2$: 230 l/min.
  Temperature: 1,080° C.
  Pressure: 80 Torr Time: 1 minute This substrate was then subjected to anodization in a 50 wt. % HF solution. In this case, current density was 100 mA/cm$^2$. A porous structure formation rate in this case was 8.4 μm/min., and all of the p-type (100) Si substrate having a thickness of 500 μm was made porous in 24 minutes. In this anodization, the p-type (100) Si substrate only was made porous, and the Si epitaxial layer did not change.

Next, on the surface of this epitaxial layer, there were formed a GaAs semiconductor layer having a thickness of 2.2 μm and then a SiON layer having a thickness of 1,000 Å. Afterward, another Si substrate on which a 8,000-Å-thick SiO$_2$ layer was formed was brought into close contact with the above-mentioned SiON layer, and they were then heated at 700° C. for 0.5 hour to firmly bond the two Si substrates to each other. Next, the porous Si substrate was removed by etching with a hydrofluoric nitric acetic acid solution (1:3:8). In this case, the porous Si substrate having a thickness of 200 μm was removed in 2 minutes.

Afterward, the Si monocrystal layer and a part of the GaAs layer were further removed to form the GaAs monocrystal layer having a thickness of 1–2 μm on the SiON layer. As a result of section observation by a transmission electron microscope, it was confirmed that additional crystal defects were not Generated in the GaAs monocrystal layer, and Good crystallinity was maintained.

EXAMPLE 32

Protons were implanted in the surface of a p-type (100) Si substrate having a diameter of 3 inches and a thickness of 200 μm to form an n-type Si layer having a thickness of 1 μm. The dose of the implanted H$^+$ was 5×10$^{15}$ ions/cm$^2$. This substrate was then subjected to anodization in a 50 wt. % HF solution. In this case, current density was 100 mA/cm$^2$. A porous structure formation rate in this case was 8.4 μm/min., and all of the p-type (100) Si substrate having a thickness of 200 μm was made porous in 24 minutes. In this anodization, the p-type (100) Si substrate only was made porous, and the n-type Si layer did not change. Next, on the surface of this epitaxial layer, there were formed a GaAs semiconductor layer having a thickness of 2.2 μm and then a SiON layer having a thickness of 1,000 Å. Afterward, another Si substrate on which a 5,000-Å-thick SiON layer was formed was brought into close contact with the above-mentioned oxidized layer, and they were then heated at 700° C. for 0.5 hour to firmly bond the two Si substrates to each other. Next, the porous Si substrate was removed by etching with a hydrofluoric nitric acetic acid solution (1:3:8). In this case, the porous Si substrate having a thickness of 200 μm was removed in 2 minutes.

Afterward, the Si monocrystal layer and a part of the GaAs layer were further removed to form the GaAs monocrystal layer having a thickness of 1–2 μm on the insulating layer.

The thickness of the thus obtained GaAs monocrystal layer was inspected by the use of a Scanning Ellipsometer. As a result, it was apparent that a difference between a maximum value and a minimum value of the thickness of the monocrystal layer in the surface of the 3-inch wafer was controlled to 5% or less with respect to the maximum value of the thickness.

As a result of the surface observation of the monocrystal layer by a transmission electron microscope, it was confirmed that a transition defect density was controlled to 1×10$^3$/cm$^2$ or less, and additional crystal defects were not generated in the monocrystal layer formation step, which meant that good crystallinity was maintained.

EXAMPLE 33

A p-type (100) monocrystal Si substrate having a diameter of 3 inches and a thickness of 200 μm was subjected to anodization in a 50 wt. % HF solution. In this case, current density was 100 mA/cm$^2$. A porous structure formation rate in this case was 8.4 μm/min., and all of the p-type (100) Si substrate having a thickness of 200 μm was made porous in 24 minutes.

On the p-type (100) porous Si substrate, an Si epitaxial layer having a thickness of 0.5 μm was grown by an MBE method. Deposition conditions were as follows:
Temperature: 700° C.
Pressure: 1×10$^{-9}$ Torr
Growth rate: 0.1 nm/sec.

Next, on the surface of this epitaxial layer, a GaAs semiconductor layer having a thickness of 2.2 μm was formed. Afterward, a substrate such as optically polished quartz on which SiON was laminated, zinc borosilicate glass or borosilicate glass was superposed upon the above-mentioned GaAs semiconductor layer, and they were then heated at 500°–600° C. for 0.5 hour in a nitrogen atmosphere to firmly bond the two substrates to each other. The thus bonded two Si substrates were then covered with Si$_3$N$_4$ as thick as 0.1 μm by a low pressure CVD method. Afterward, the nitride film only on the porous substrate was removed by reactive ion etching. Next, the porous Si substrate was removed by etching with a hydrofluoric nitric acetic acid solution (1:3:8). In this case, the porous Si substrate having a thickness of 200 μm was removed in 2 minutes.

Afterward, the Si$_3$N$_4$ layer, the Si monocrystal layer and a part of the GaAs layer were further removed to form the GaAs monocrystal layer having a thickness of 2 μm.

As a result of section observation by a transmission electron microscope, it was confirmed that additional crystal defects were not generated in the GaAs monocrystal layer and good crystallinity was maintained.

EXAMPLE 34

A p-type (100) monocrystal Si substrate having a diameter of 3 inches and a thickness of 200 μm was subjected to anodization in a 50 wt. % HF solution. In this case, current density was 100 mA/cm$^2$. A porous structure formation rate in this case was 8.4 μm/min., and all of the p-type (100) Si substrate having a thickness of 200 μm was made porous in 24 minutes.

On the p-type (100) porous Si substrate, an Si epitaxial layer having a thickness of 5 μm was grown by a plasma CVD method. Deposition conditions were as follows:
Gas: SiH$_4$
High frequency power: 100 W
Temperature: 800° C.
Pressure: 1×10$^{-2}$ Torr
Growth rate: 2.5 nm/sec.

Next, on the surface of this epitaxial layer, a GaAs semiconductor layer having a thickness of 5.1 μm was formed. Afterward, an optically polished glass substrate having a softening point of about 500° C. was superposed upon the above-mentioned GaAs semiconductor layer, and they were then heated at 450° C. for 0.5 hour in a nitrogen atmosphere to firmly bond both the substrates to each other. The thus bonded two Si substrates were then covered with $Si_3N_4$ as thick as 0.1 μm by a low pressure CVD method. Afterward, the nitride film only on the porous substrate was removed by reactive ion etching. Next, the porous Si substrate was removed by etching with a 6M KOH solution, and in this case, the porous Si substrate having a thickness of 200 μm was removed in 2 minutes. Furthermore, the $Si_3N_4$ layer, the Si monocrystal layer and a part of the GaAs layer were removed, whereby the GaAs monocrystal layer having a thickness of 5 μm could be formed on the glass substrate having the low softening point.

EXAMPLE 35

A p-type (100) monocrystal Si substrate having a diameter of 3 inches and a thickness of 200 μm was subjected to anodization in a 50 wt. % HF solution. In this case, current density was 100 mA/$cm^2$. A porous structure formation rate in this case was 8.4 μm/min., and all of the p-type (100) Si substrate having a thickness of 200 μm was made porous in 24 minutes.

On the p-type (100) porous Si substrate, an Si epitaxial layer having a thickness of 1.0 μm was grown by a bias sputter method. Deposition conditions were as follows:

RF frequency: 100 MHz
High frequency power: 600 W
Temperature: 300° C.
Ar gas pressure: $8 \times 10^{-3}$ Torr
Growth time: 120 minutes
Target DC bias: −200 V
Substrate DC bias: +5 V Next, a GaAs semiconductor layer having a thickness of 2.2 μm was formed on the surface of this epitaxial layer. Afterward, an optically polished glass substrate having a softening point of about 500° C. was superposed upon the above-mentioned GaAs semiconductor layer, and they were then heated at 450° C. for 0.5 hour in a nitrogen atmosphere to firmly bond both the substrates to each other. Here, an $Al_xN_{1-x}$ film, an $SiO_yN_{1-y}$ film or another film having about the same thermal expansion coefficient as in GaAs may be bonded to the surface of the glass. The thus bonded two Si substrates were then covered with $Si_3N_4$ as thick as 0.1 μm by a low pressure CVD method. Afterward, the nitride film only on the porous substrate was removed by reactive ion etching. Next, the porous Si substrate was removed by etching with a hydrofluoric nitric acetic acid solution (1:3:8), and in this case, the porous Si substrate having a thickness of 200 μm was removed in 2 minutes. Furthermore, the $Si_3N_4$ layer, the Si monocrystal layer and a part of the GaAs layer were removed, whereby the GaAs monocrystal layer having a thickness of 1.0 μm could be formed on the glass substrate having the low softening point. Moreover, when Apiezon Wax was used in place of the $Si_3N_4$ layer, a similar effect was present, and the Si substrate only which was made porous could be removed.

EXAMPLE 36

A p-type (100) monocrystal Si substrate having a diameter of 3 inches and a thickness of 200 μm was subjected to anodization in a 50 wt. % HF solution. In this case, current density was 100 mA/$cm^2$. A porous structure formation rate in this case was 8.4 μm/min., and all of the p-type (100) Si substrate having a thickness of 200 μm was made porous in 24 minutes.

On the p-type (100) porous Si substrate, an Si epitaxial layer having a thickness of 10 μm was grown by a liquid growth method. Deposition conditions were as follows:

Solvent: Sn
Growth temperature: 900° C.
Growth atmosphere: $H_2$
Growth time: 20 minutes Next, a GaAs semiconductor layer having a thickness of 1.2 μm was formed on the surface of this epitaxial layer. Afterward, an optically polished glass substrate having a softening point of about 800° C. was superposed upon the above-mentioned GaAs semiconductor layer, and they were then heated at 750° C. for 0.5 hour in a nitrogen atmosphere to firmly bond both the substrates to each other. The thus bonded two Si substrates were then covered with $Si_3N_4$ as thick as 0.1 μm by a low pressure CVD method. Afterward, the nitride film only on the porous substrate was removed by reactive ion etching. Next, the porous Si substrate was removed by etching with a hydrofluoric nitric acetic acid solution (1:3:8), and in this case, the porous Si substrate having a thickness of 200 μm was removed in 2 minutes. Furthermore, the $Si_3N_4$ layer, the Si monocrystal layer and a part of the GaAs layer were removed, whereby the GaAs monocrystal layer having a thickness of 10 μm could be formed on the glass substrate. Moreover, when Apiezon Wax was used in place of the $Si_3N_4$ layer, a similar effect was present, and the Si substrate only which was made porous could be completely removed.

EXAMPLE 37

A p-type (100) monocrystal Si substrate having a diameter of 3 inches and a thickness of 200 μm was subjected to anodization in a 50 wt. % HF solution. In this case, current density was 100 mA/$cm^2$. A porous structure formation rate in this case was 8.4 μm/min., and all of the p-type (100) Si substrate having a thickness of 200 μm was made porous in 24 minutes.

On the p-type (100) porous Si substrate, an Si epitaxial layer having a thickness of 0.1 μm was grown by a low pressure CVD method. Deposition conditions were as follows:

Source gas: $SiH_4$ (800 SCCM)
Carrier gas: $H_2$
Temperature: 850° C.
Pressure: $1 \times 10^{-2}$ Torr
Growth rate: 3.3 nm/sec.

Next, a GaAs semiconductor layer having a thickness of 1.1 μm was formed on the surface of this epitaxial layer. Afterward, an optically polished fused silica glass substrate was superposed upon the above-mentioned GaAs semiconductor layer, and they were then heated at 800° C. for 0.5 hour in a nitrogen atmosphere to firmly bond the two substrates to each other. Here, a laminate of a SiON film or an AlN film may be bonded to the quartz glass substrate in order to fit a thermal expansion coefficient to that of GaAs.

The thus bonded two Si substrates were then covered with $Si_3N_4$ as thick as 0.1 μm by a low pressure CVD method. Afterward, the nitride film only on the porous substrate was removed by reactive ion etching. Next, the porous Si substrate was removed by etching with a hydrofluoric nitric acetic acid solution (1:3:8), and in this case, the porous Si substrate having a thickness of 200 μm was removed in 2 minutes. Furthermore, the Si₃N₄ layer, the Si monocrystal layer and a part of the GaAs layer were removed, whereby the GaAs monocrystal layer having a thickness of 1.0 μm could be formed on the quartz glass substrate.

When SiH₂Cl₂ was used as the source gas, it was necessary to raise the epitaxial growth temperature of Si as much as several tens degrees, but accelerated etching properties which were characteristic of the porous substrate could be maintained.

EXAMPLE 38

On a p-type (100) monocrystal Si substrate having a diameter of 4 inches and a thickness of 300 μm, an Si epitaxial layer having a thickness of 1 μm was grown by a CVD method. Deposition conditions were as follows:

Reaction gas flow rate: SiH₄Cl₂ (1,000 SCCM)
H₂: 230 l/min.
Temperature: 1,080° C.
Pressure: 80 Torr
Time: 2 minutes This substrate was then subjected to anodization in a 50 wt. % HF solution. In this case, current density was 100 mA/cm². A porous structure formation rate in this case was 8.4 μm/min., and all of the p-type (100) Si substrate having a thickness of 300 μm was made porous in 36 minutes. In this anodization, the p-type (100) Si substrate only was made porous, and the Si epitaxial layer did not change. Next, a GaAs semiconductor layer having a thickness of 1.1 μm was formed on the surface of this epitaxial layer. Afterward, an optically polished fused silica glass substrate was superposed upon the above-mentioned GaAs semiconductor layer, and they were then heated at 800° C. for 0.5 hour in a nitrogen atmosphere to firmly bond the two substrates to each other. The thus bonded two Si substrates were then covered with Si₃N₄ as thick as 0.1 μm by a low pressure CVD method. Afterward, the nitride film only on the porous substrate was removed by reactive ion etching. Next, the porous Si substrate was removed by etching with a hydrofluoric nitric acetic acid solution (1:3:8), and in this case, the porous Si substrate having a thickness of 300 μm was removed in 4 minutes. Furthermore, the Si₃N₄ layer, the Si monocrystal layer and a part of the GaAs layer were removed, whereby the GaAs monocrystal layer having a thickness of 1 μm could be formed on the quartz glass substrate. As a result of section observation by a transmission electron microscope, it was confirmed that additional crystal defects were not generated in the GaAs monocrystal layer and good crystallinity was maintained.

EXAMPLE 39

On a p-type (100) monocrystal Si substrate having a diameter of 3 inches and a thickness of 200 μm, an Si epitaxial layer having a thickness of 0.5 μm was grown by a CVD method. Deposition conditions were as follows:

Reaction gas flow rate: SiH₂Cl₂ (1,000 SCCM)
H₂: 230 l/min.
Temperature: 1,080° C.
Pressure: 80 Torr
Time: 1 minute This substrate was then subjected to anodization in a 50 wt. % HF solution. In this case, current density was 100 mA/cm². A porous structure formation rate in this case was 8.4 μm/min., and all of the p-type (100) Si substrate having a thickness of 200 μm was made porous in 24 minutes. In this anodization, the p-type (100) Si substrate only was made porous, and the Si epitaxial layer did not change.

Next, a GaAs semiconductor layer having a thickness of 0.9 μm was formed on the surface of this epitaxial layer. Afterward, an optically polished fused silica glass substrate was superposed upon the above-mentioned GaAs semiconductor layer, and they were then heated at 800° C. for 0.5 hour in a nitrogen atmosphere to firmly bond the two substrates to each other. The thus bonded two Si substrates were then covered with Si₃N₄ as thick as 0.1 μm by a low pressure CVD method. Afterward, the nitride film only on the porous substrate was removed by reactive ion etching. Next, the porous Si substrate was removed by etching with a hydrofluoric nitric acetic acid solution (1:3:8), and in this case, the porous Si substrate having a thickness of 200 μm was removed in 2 minutes. Furthermore, the Si₃N₄ layer, the Si monocrystal layer and a part of the GaAs layer were removed, whereby the GaAs monocrystal layer having a thickness of 0.5 μm could be formed on the glass substrate. As a result of section observation by a transmission electron microscope, it was confirmed that additional crystal defects were not generated in the GaAs monocrystal layer and good crystallinity was maintained.

EXAMPLE 40

Protons were implanted in the surface of a p-type (100) Si substrate having a diameter of 4 inches and a thickness of 300 μm to form an n-type Si layer having a thickness of 1 μm. The dose of the implanted H⁺ was $5 \times 10^{15}$ ions/cm². This substrate was then subjected to anodization in a 50 wt. % HF solution. In this case, current density was 100 mA/cm². A porous structure formation rate in this case was 8.4 μm/min., and all of the p-type (100) Si substrate having a thickness of 299 μm was made porous in 37 minutes. In this anodization, the p-type (100) Si substrate only was made porous, and the n-type Si layer did not change. Next, a GaAs semiconductor layer having a thickness of 1.1 μm was formed on the surface of this n-type Si layer. Afterward, an optically polished fused silica glass substrate was superposed upon the above-mentioned GaAs semiconductor layer, and they were then heated at 800° C. for 0.5 hour in a nitrogen atmosphere to firmly bond the two substrates to each other.

The thus bonded two Si substrates were then covered with Si₃N₄ as thick as 0.1 μm by a low pressure CVD method. Afterward, the nitride film only on the porous substrate was removed by reactive ion etching. Next, the porous Si substrate was removed by etching with a hydrofluoric nitric acetic acid solution, and in this case, the porous Si substrate having a thickness of 299 μm was removed in 2 minutes. Furthermore, the Si₃N₄ layer, the Si monocrystal layer and a part of the GaAs layer were removed, whereby the GaAs monocrystal layer having a thickness of 1.0 μm could be formed on the glass substrate.

The thickness of the thus obtained GaAs monocrystal layer was inspected by the use of a Scanning Ellipsometer. As a result, it was apparent that a difference between a maximum value and a minimum value of the thickness of the monocrystal layer in the surface of a 4-inch wafer was controlled to 6% or less with respect to the maximum value of the thickness.

As a result of the surface observation of the monocrystal layer by a transmission electron microscope, it was confirmed that a transition defect density was controlled to $1 \times 10^3/cm^2$ or less, and additional crystal defects were not generated in the monocrystal layer formation step, which meant that good crystallinity was maintained. In short, according to the present invention, there can be provided a method for forming a semiconductor substrate which is excellent in productivity, uniformity, controllability and economy, in manufacturing a GaAs crystal layer having such an excellent crystallinity as to be comparable to a monocrystal wafer even on a light-transmissive substrate typified by glass. Furthermore, according to the present invention, there can be provided a method for forming semiconductor substrates applicable in a wide range by the utilization of advantages of conventional SOI devices.

EXAMPLE 41

A p-type (100) monocrystal Si substrate having a diameter of 3 inches and a thickness of 200 μm was subjected to anodization in a 50 wt. % HF solution. In this case, current density was 100 mA/cm². A porous structure formation rate in this case was 8.4 μm/min., and all of the p-type (100) Si substrate having a thickness of 200 μm was made porous in 24 minutes.

On the p-type (100) porous Si substrate, an Si epitaxial layer having a thickness of 0.5 μm was grown by an MBE method. Deposition conditions were as follows:
Temperature: 700° C.
Pressure: $1 \times 10^{-9}$ Torr
Growth rate: 0.1 nm/sec.

Next, a GaAs semiconductor layer having a thickness of 0.6 μm was formed on the surface of this epitaxial layer. Afterward, an optically polished fused silica glass substrate was superposed upon the above-mentioned GaAs semiconductor layer, and they were then heated at 800° C. for 0.5 hour in a nitrogen atmosphere to firmly bond the two substrates to each other. Next, the porous Si substrate was removed by etching with a hydrofluoric nitric acetic acid solution, and in this case, the porous Si substrate having a thickness of 200 μm was removed in 2 minutes. Furthermore, the Si monocrystal layer and a part of the GaAs layer were removed, whereby the GaAs monocrystal layer having a thickness of 0.5 μm could be formed on the glass substrate. As a result of section observation by a transmission electron microscope, it was confirmed that additional crystal defects were not generated in the GaAs monocrystal layer and good crystallinity was maintained.

EXAMPLE 42

A p-type (100) monocrystal Si substrate having a diameter of 3 inches and a thickness of 200 μm was subjected to anodization in a 50 wt. % HF solution. In this case, current density was 100 mA/cm². A porous structure formation rate in this case was 8.4 μm/min., and all of the p-type (100) Si substrate having a thickness of 200 μm was made porous in 24 minutes. On the p-type (100) porous Si substrate, an Si epitaxial layer having a thickness of 5 μm was grown by a plasma CVD method. Deposition conditions were as follows:
Gas: $SiH_4$
High frequency power: 100 W
Temperature: 800° C.
Pressure: $1 \times 10^{-2}$ Torr
Growth rate: 2.5 nm/sec.

Next, on the surface of this epitaxial layer, a GaAs semiconductor layer having a thickness of 5.1 μm was formed. Afterward, an optically polished glass substrate having a softening point of about 500° C. was superposed upon the above-mentioned GaAs semiconductor layer, and they were then heated at 450° C. for 0.5 hour in a nitrogen atmosphere to firmly bond the two substrates to each other. Next, the porous Si substrate was removed by etching with a 6M KOH solution, and in this case, the porous Si substrate having a thickness of 200 μm was removed in 2 minutes. Furthermore, the Si monocrystal layer and a part of the GaAs layer were removed, whereby the GaAs monocrystal layer having a thickness of 5 μm could be formed on the glass substrate having the low softening point.

EXAMPLE 43

A p-type (100) monocrystal Si substrate having a diameter of 3 inches and a thickness of 200 μm was subjected to anodization in a 50 wt. % HF solution. In this case, current density was 100 mA/cm². A porous structure formation rate in this case was 8.4 μm/min., and all of the p-type (100) Si substrate having a thickness of 200 μm was made porous in 24 minutes.

On the p-type (100) porous Si substrate, a Si epitaxial layer having a thickness of 1.0 μm was grown by a bias sputter method. Deposition conditions were as follows:
RF frequency: 100 MHz
High frequency power: 600 W
Temperature: 300° C.
Ar gas pressure: $8 \times 10^{-3}$ Torr
Growth time: 120 minutes
Target DC bias: −200 V
Substrate DC bias: +5 V Next, a GaAs semiconductor layer having a thickness of 1.1 μm was formed on the surface of this epitaxial layer. Afterward, an optically polished glass substrate having a softening point of about 500° C. was superposed upon the above-mentioned GaAs semiconductor layer, and they were then heated at 450° C. for 0.5 hour in a nitrogen atmosphere to firmly bond the two substrates to each other. Next, the porous Si substrate was removed by etching with a 7M NaOH solution.

As described above, the etching rate of the usual Si monocrystal with the 7M NaOH solution is a little under about 1 μm per minute, but the etching rate of the porous layer is about 100 times as much as that of the Si monocrystal. Thus, the porous Si substrate having a thickness of 200 μm was removed in 2 minutes, whereby the GaAs monocrystal layer having a thickness of 1.0 μm could be formed on the glass substrate having the low softening point.

The thickness of the thus obtained GaAs monocrystal layer was inspected by the use of a Scanning Ellipsometer. As a result, it was apparent that a difference between a maximum value and a minimum value of the thickness of the monocrystal layer in the surface of the 3-inch wafer was controlled to 5% or less with respect to the maximum value of the thickness.

As a result of the surface observation of the monocrystal layer by a transmission electron microscope, it was confirmed that a transition defect density was controlled to $1 \times 10^3/cm^2$ or less, and additional crystal defects were not generated in the monocrystal layer formation step, which meant that good crystallinity was maintained.

EXAMPLE 44

A p-type (100) monocrystal Si substrate having a diameter of 3 inches and a thickness of 200 μm was subjected to anodization in a 50 wt. % HF solution. In this case, current density was 100 mA/cm$^2$. A porous structure formation rate in this case was 8.4 μm/min., and all of the p-type (100) Si substrate having a thickness of 200 μm was made porous in 24 minutes.

On the p-type (100) porous Si substrate, a Si epitaxial layer having a thickness of 10 μm was grown by a liquid growth method. Deposition conditions were as follows:
Solvent: Sn
Growth temperature: 900° C.
Growth atmosphere: H$_2$
Growth time: 20 minutes Next, on the surface of this epitaxial layer, a GaAs semiconductor layer having a thickness of 10.1 μm was formed. Afterward, an optically polished glass substrate having a softening point of about 800° C. was superposed upon the above-mentioned GaAs semiconductor layer, and they were then heated at 750° C. for 0.5 hour in a nitrogen atmosphere to firmly bond the two substrates to each other. Next, the porous Si substrate was removed by etching with a hydrofluoric nitric acetic acid solution, and in this case, the porous Si substrate having a thickness of 200 μm was removed in 2 minutes. Furthermore, the Si monocrystal layer and a part of the GaAs layer were removed, whereby the GaAs monocrystal layer having a thickness of 10 μm could be formed on the glass substrate.

EXAMPLE 45

A p-type (100) monocrystal Si substrate having a diameter of 3 inches and a thickness of 200 μm was subjected to anodization in a 50 wt. % HF solution. In this case, current density was 100 mA/cm$^2$. A porous structure formation rate in this case was 8.4 μm/min., and all of the p-type (100) Si substrate having a thickness of 200 μm was made porous in 24 minutes.

On the p-type (100) porous Si substrate, a Si epitaxial layer having a thickness of 1.0 μm was grown by a low pressure CVD method. Deposition conditions were as follows:
Source gas: SiH$_4$ (800 SCCM)
Carrier gas: H$_2$ (150 l/min.)
Temperature: 850° C.
Pressure: $1 \times 10^{-2}$ Torr
Growth rate: 3.3 nm/sec.

Next, a GaAs semiconductor layer having a thickness of 1.1 μm was formed on the surface of this epitaxial layer. Afterward, an optically polished fused silica glass substrate was superposed upon the above-mentioned GaAs semiconductor layer, and they were then heated at 800° C. for 0.5 hour in a nitrogen atmosphere to firmly bond the two substrates to each other. Next, the porous Si substrate was removed by etching with a hydrofluoric nitric acetic acid solution, and in this case, the porous Si substrate having a thickness of 200 μm was removed in 2 minutes. Furthermore, the Si monocrystal layer and a part of the GaAs semiconductor layer were removed, whereby the GaAs monocrystal layer having a thickness of 1.0 μm could be formed on the quartz glass substrate.

When SiH$_2$Cl$_2$ was used as the source gas, it was necessary to raise the epitaxial growth temperature of Si as much as several tens degrees, but accelerated etching properties which were characteristic of the porous substrate could be maintained.

EXAMPLE 46

On a p-type (100) monocrystal Si substrate having a diameter of 4 inches and a thickness of 300 μm, an Si epitaxial layer having a thickness of 1 μm was grown by a CVD method. Deposition conditions were as follows:
Reaction gas flow rate: SiH$_4$Cl$_2$ (1,000 SCCM)
H$_2$: 230 l/min.
Temperature: 1,080° C.
Pressure: 80 Torr
Time: 2 minutes This substrate was then subjected to anodization in a 50 wt. % HF solution. In this case, current density was 100 mA/cm$^2$. A porous structure formation rate in this case was 8.4 μm/min., and all of the p-type (100) Si substrate having a thickness of 300 μm was made porous in 37 minutes. In this anodization, the p-type (100) Si substrate only was made porous, and the Si epitaxial layer did not change. Next, a GaAs semiconductor layer having a thickness of 1.1 μm was formed on the surface of this epitaxial layer. Afterward, an optically polished fused silica glass substrate was superposed upon the above-mentioned GaAs semiconductor layer, and they were then heated at 800° C. for 0.5 hour in a nitrogen atmosphere to firmly bond the two substrates to each other. Next, the porous Si substrate was removed by etching with a hydrofluoric nitric acetic acid solution (1:3:8), and in this case, the porous Si substrate having a thickness of 300 μm was removed in 4 minutes. Furthermore, the Si monocrystal layer and a part of the GaAs semiconductor layer were removed, whereby the GaAs monocrystal layer having a thickness of 1 μm could be formed on the quartz glass substrate.

The thickness of the thus obtained GaAs monocrystal layer was inspected by the use of a Scanning Ellipsometer. As a result, it was apparent that a difference between a maximum value and a minimum value of the thickness of the monocrystal layer in the surface of the 4-inch wafer was controlled to 7% or less with respect to the maximum value of the thickness.

As a result of the surface observation of the monocrystal layer by a transmission electron microscope, it was confirmed that a transition defect density was controlled to $1 \times 10^3$/cm$^2$ or less, and additional crystal defects were not generated in the monocrystal layer formation step, which meant that good crystallinity was maintained.

EXAMPLE 47

On a p-type (100) monocrystal Si substrate having a diameter of 3 inches and a thickness of 200 μm, an Si epitaxial layer having a thickness of 0.5 μm was grown by a CVD method. Deposition conditions were as follows:
Reaction gas flow rate: SiH$_2$Cl$_2$ (1,000 SCCM)
H$_2$: 230 l/min.
Temperature: 1,080° C.
Pressure: 80 Torr
Time: 1 minute This substrate was then subjected to anodization in a 50 wt. % HF solution. In this case, current density was 100 mA/cm$^2$. A porous structure formation rate in this case was 8.4 μm/min., and all of the p-type (100) Si substrate having a thickness of 200 μm was made porous in 24 minutes. In this anodization, the p-type (100) Si substrate only was made porous, and the Si epitaxial layer did not change. Next, a GaAs semiconductor layer having a thickness of 0.7 μm was formed on the surface of this epitaxial layer. Afterward, an optically polished fused silica glass substrate was superposed upon the above-mentioned GaAs semiconductor layer, and they were then heated at 800° C. for 0.5 hour in a nitrogen atmosphere to firmly bond the two substrates to each other. Next, the porous Si substrate was removed by etching with a hydrofluoric nitric acetic acid solution, and in this case, the porous Si substrate having a thickness of 200 μm was removed in 2 minutes. Furthermore, the Si monocrystal layer and a part of the GaAs layer were removed, whereby the GaAs monocrystal layer having a thickness of 0.5 μm could be formed on the glass substrate. As a result of section observation by a transmission electron microscope, it was confirmed that additional crystal defects were not generated in the GaAs monocrystal layer and good crystallinity was maintained.

EXAMPLE 48

Protons were implanted in the surface of a p-type (100) Si substrate having a diameter of 3 inches and a thickness of 200 μm to form an n-type Si layer having a thickness of 1 μm. The dose of the implanted H+ was $5 \times 10^{15}$ ions/cm$^2$. This substrate was then subjected to anodization in a 50 wt. % HF solution. In this case, current density was 100 mA/cm$^2$. A porous structure formation rate in this case was 8.4 μm/min., and all of the p-type (100) Si substrate having a thickness of 199 μm was made porous in 24 minutes. In this anodization, the p-type (100) Si substrate only was made porous, and the n-type Si layer did not change. Next, a GaAs semiconductor layer having a thickness of 1.2 μm was formed on the surface of this epitaxial layer. Afterward, an optically polished fused silica glass substrate was superposed upon the above-mentioned GaAs semiconductor layer, and they were then heated at 800° C. for 0.5 hour in a nitrogen atmosphere to firmly bond the two substrates to each other. Next, the porous Si substrate was removed by etching with a hydrofluoric nitric acetic acid solution (1:3:8), and in this case, the porous Si substrate having a thickness of 200 μm was removed in 2 minutes. Furthermore, the Si monocrystal layer and a part of the GaAs layer were removed, whereby the GaAs monocrystal layer having a thickness of 1.0 μm could be formed on the glass substrate. As a result of section observation by a transmission electron microscope, it was confirmed that additional crystal defects were not generated in the GaAs monocrystal layer, and good crystallinity was maintained.

EXAMPLE 49

A p-type (100) monocrystal Si substrate having a diameter of 6 inches and a thickness of 600 μm was subjected to anodization in a 50 wt. % HF solution. In this case, current density was 10 mA/cm$^2$. The surface of the substrate was made porous in 10 minutes to from a porous layer having a thickness of 20 μm. On the p-type (100) porous Si substrate, an Si epitaxial layer having a thickness of 0.5 μm was grown by a low pressure CVD method. Deposition conditions were as follows:

Gas: SiH$_2$Cl$_2$ (0.6 1/min.), H$_2$ (100 1/min.)
Temperature: 850° C.
Pressure: 50 Torr
Growth rate: 0.1 μm/min.

Next, a GaAs semiconductor layer having a thickness of 2.2 μm was formed on the surface of this epitaxial layer, and thermal oxidation was carried out as thick as 50 nm. Afterward, another Si substrate having a 0.8-μm-thick oxidized layer thereon was superposed upon the thus obtained thermally oxidized film, and they were then heated at 900° C. for 1.5 hours to firmly bond the two substrates to each other.

Afterward, the silicon substrate was ground and polished as deep as 580 μm from its back surface to expose the porous layer.

The bonded two Si substrates were then covered with Si$_3$N$_4$ as thick as 0.1 μm by a plasma CVD method. Next, the nitride film only on the porous substrate was removed by reactive ion etching.

Afterward, the bonded substrates were selectively etched with a hydrofluoric nitric acetic acid solution. After 15 minutes, the monocrystal Si layer only remained without etching, and the porous Si layer was selectively etched and completely removed. In this case, the monocrystal Si layer functioned as an etch-stop material.

The etching rate of the non-porous Si monocrystal with the etching solution was extremely low, and the depth of the etched monocrystal is about 40 Å even after 15 minutes. An etching selection ratio of the non-porous layer to the porous layer was very high, and the etched amount in the non-porous Si layer was so small as to be practically negligible. After the removal of the Si$_3$N$_4$ layer, the Si monocrystal layer and a part of the GaAs layer were further removed, whereby the GaAs monocrystal layer having a thickness of 1-2 μm could be formed on the SiO$_2$ substrate 24.

Moreover, when Apiezon Wax or Electron Wax was used in place of the Si$_3$N$_4$ layer, a similar effect was present, and the Si substrate only which was made porous could be completely removed.

The thickness of the thus obtained GaAs monocrystal layer was inspected by the use of a Scanning Ellipsometer. As a result, it was apparent that the difference between the maximum value and the minimum value of the thickness of the monocrystal layer in the surface of the 6-inch wafer was controlled to 10% or less with respect to the maximum value of the thickness.

As a result of the surface observation of the monocrystal layer by a transmission electron microscope, it was confirmed that a transition defect density was controlled to $1 \times 10^3$/cm$^2$ or less, and additional crystal defects were not Generated in the monocrystal layer formation step, which meant that Good crystallinity was maintained.

EXAMPLE 50

A first p-type or n-type (100) monocrystal Si substrate having a thickness of 625 μm, a diameter of 6 inches and a specific resistance of 0.01 Ω.cm was subjected to anodization in an HF solution.

Anodization conditions were as follows:
Current density: 5 mA.cm$^{<2}$
Anodization solution: HF:H$_2$O:C$_2$H$_5$OH=1:1:1
Time: 12 minutes
Thickness of porous Si: 10 μm
Porosity: 45%

This substrate was oxidized at 400° C. for 1 hour in an oxygen atmosphere, and owing to this oxidation, the inside walls of pores in the porous Si were covered with thermally oxidized films. On this porous Si, a monocrystal GaAs layer having a thickness of 1 μm was epitaxially Grown by an MOCVD (metal organic chemical vapor deposition) method. Growth conditions were as follows:
  Source gas: TMG/AsH$_3$/H$_2$
  Gas pressure: 80 Torr
  Temperature: 700° C.

The first substrate was superposed upon a second Si substrate so that the surface the GaAs layer of the first substrate was brought into contact with the surface of the second substrate, and they were then subjected to a heat treatment at 900° C. for 1 hour to firmly bond both the substrates to each other.

Next, the second Si substrate only of the bonded substrates was covered with Si$_3$N$_4$, and the first Si substrate was then etched with a 66HNO$_3$+24HF solution so as to remain as much as 10 μm. Afterward, the monocrystal Si substrate having a thickness of 10 μm was selectively etched with 1HF+20HNO$_3$+20CH$_3$COOH under the function of the porous Si layer in which the inside walls of the pores were oxidized, as an etch-stop layer. After 10 minutes, the first Si substrate was all etched, so that the porous Si layer was exposed.

Afterward, the oxide films on the pore inside walls in the porous Si layer were removed with hydrofluoric acid, and the porous Si was then etched at 110° C. with ethylenediamine+pyrocatechol+water (in a ratio of 17 ml:3 g:8 ml). After 1 minute, monocrystal GaAs remained without etching, but the porous Si substrate was selectively etched and completely removed under the function of monocrystal GaAs as an etch-stop material.

An etching rate of monocrystal GaAs with the etching solution was so extremely low as to be practically negligible, and thus the reduction of its thickness was slight.

That is, after the Si$_3$N$_4$ layer on the back surface was removed, the monocrystal GaAs layer having a thickness of 1 μm could be formed on the Si substrate. The selective etching of the porous Si did not affect the monocrystal GaAs layer at all.

As a result of section observation by a transmission electron microscope, it was confirmed that additional crystal defects were not generated in the GaAs layer and good crystallinity was maintained.

EXAMPLE 51

A first p-type or n-type (100) monocrystal Si substrate having a thickness of 625 μm, a diameter of 5 inches and a specific resistance of 0.01 Ω.cm was subjected to anodization in an HF solution.
  Anodization conditions were as follows:
  Current density: 10 mA.cm$^{-2}$
  Anodization solution: HF:H$_2$O:C$_2$H$_5$OH=1:1:1
  Time: 24 minutes
  Thickness of porous Si: 20 μm
  Porosity: 47%

This substrate was oxidized at 400° C. for 2 hours in an oxygen atmosphere, and owing to this oxidation, the inside walls of pores in the porous Si were covered with thermally oxidized films. On this porous Si, a monocrystal AlGaAs layer having a thickness of 0.5 μm was epitaxially grown by an MBE (molecular beam epitaxy) method.

The first substrate was superposed upon a second Si substrate so that the AlGaAs layer of the first substrate was brought into contact with the surface of the second substrate, and they were then subjected to a heat treatment at 800° C. for 2 hours to firmly bond both the substrates to each other.

Next, the second Si substrate only of the bonded substrates was covered with Si$_3$N$_4$, and the first Si substrate was then etched at 110° C. with ethylenediamine+pyrocatechol+water (in a ratio of 17 ml:3 g:8 ml) so as to remain as much as 10 μm. Afterward, the monocrystal Si substrate having a thickness of 10 μm was selectively etched with 1HF+40HNO$_3$+40CH$_3$COOH under the function of the porous Si layer in which the inside walls of the pores were oxidized, as an etch-stop layer. After 20 minutes, the first Si substrate was all etched, so that the porous Si layer was exposed.

Afterward, the porous Si layer was etched with a hydrofluoric acid solution. After 2 minutes, monocrystal AlGaAs remained without etching, but the porous Si substrate was selectively etched and completely removed under the function of monocrystal AlGaAs as an etch-stop material.

An etching rate of monocrystal AlGaAs with the etching solution was so extremely low as to be practically negligible, and thus the reduction of its thickness was slight.

That is, after the Si$_3$N$_4$ layer on the back surface was removed, the monocrystal AlGaAs layer having a thickness of 1 μm could be formed on the Si substrate. The selective etching of the porous Si did not affect the monocrystal AlGaAs layer at all.

As a result of section observation by a transmission electron microscope, it was confirmed that additional crystal defects were not generated in the AlGaAs layer and good crystallinity was maintained.

EXAMPLE 52

A first p-type or n-type (100) monocrystal Si substrate having a thickness of 625 μm, a diameter of 6 inches and a specific resistance of 0.01 Ω.cm was subjected to anodization in an HF solution.
  Anodization conditions were as follows:
  Current density: 5 mA.cm$^{-2}$
  Anodization solution: HF:H$_2$O:C$_2$H$_5$OH=1:1:1
  Time: 24 minutes
  Thickness of porous Si: 20 μm
  Porosity: 45%

This substrate was oxidized at 400° C. for 2 hours in an oxygen atmosphere, and owing to this oxidation, the inside walls of pores in the porous Si were covered with thermally oxidized films. On this porous Si, a monocrystal GaP layer having a thickness of 2 μm was epitaxially grown by a liquid growth method.

The first substrate was superposed upon a second Si substrate so that the GaP layer of the first substrate was brought into contact with the surface of the second substrate, and they were then subjected to an anodic bonding method at room temperature to strongly join both the substrates together. Afterward, they were further subjected to a heat treatment at 700° C. for 2 hours to firmly bond both the substrates to each other.

Next, the second Si substrate only of the bonded substrates was covered with Si$_3$N$_4$, and the first Si substrate was then etched with a 66HNO$_3$+34HF solution so as to remain as much as 10 μm. Afterward, the monocrystal Si substrate having a thickness of 10 μm was selectively etched with 6M KOH under the function of the porous Si layer in which the inside walls of the pores were oxidized, as an etch-stop layer. After 10 minutes, the first Si substrate was all etched, so that the porous Si layer was exposed.

Afterward, the oxide films on the pore inside walls in the porous Si layer were removed with hydrofluoric acid, and the porous Si was then etched at 110° C. with ethylenediamine+pyrocatechol+water (in a ratio of 17 ml:3 g:8 ml). After 2 minutes, monocrystal GaP remained without etching, but the porous Si substrate was selectively etched and completely removed under the function of monocrystal GaP as an etch-stop material.

An etching rate of monocrystal GaP with the etching solution was so extremely low as to be practically negligible, and thus the reduction of its thickness was slight.

That is, after the $Si_3N_4$ layer on the back surface was removed, the monocrystal GaP layer having a thickness of 2 μm could be formed on the Si substrate. The selective etching of the porous Si did not affect the monocrystal GaP layer at all.

As a result of section observation by a transmission electron microscope, it was confirmed that additional crystal defects were not generated in the GaP layer and good crystallinity was maintained.

EXAMPLE 53

A first p-type or n-type (100) monocrystal Si substrate having a thickness of 525 μm, a diameter of 4 inches and a specific resistance of 0.01 Ω.cm was subjected to anodization in an HF solution.

Anodization conditions were as follows:
Current density: 5 mA.cm$^{-2}$
Anodization solution: $HF:H_2O:C_2H_5OH = 1:1:1$
Time: 24 minutes
Thickness of porous Si: 20 μm
Porosity: 45%

This substrate was oxidized at 400° C. for 2 hours in an oxygen atmosphere, and owing to this oxidation, the inside walls of pores in the porous Si were covered with thermally oxidized films. On this porous Si, a monocrystal GaAs layer having a thickness of 1 μm was epitaxially grown by a MOCVD method.

The first substrate was superposed upon a second Si substrate so that the GaAs layer of the first substrate was brought into contact with the surface of the second substrate, and they were then subjected to an anodic bonding method at 800° C. to join both the substrates together. Afterward, they were further subjected to a heat treatment to firmly bond both the substrates to each other.

Next, the first Si substrate was removed by grinding and polishing so as to remain as much as 10 μm, and the monocrystal Si substrate having a thickness of 10 μm was selectively etched at 110° C. with ethylenediamine+pyrocatechol+water (in a ratio of 17 ml:3 g:8 ml) under the function of the porous Si layer in which the inside walls of the pores were oxidized, as an etch-stop layer. After 15 minutes, the first Si substrate was all etched, so that the porous Si layer was exposed.

Afterward, the oxide films on the pore inside walls in the porous Si layer were removed with hydrofluoric acid, and the porous Si was then etched at 110° C. with ethylenediamine+pyrocatechol+water (in a ratio of 17 ml:3 g:8 ml). After 2 minutes, monocrystal GaAs remained without etching, but the porous Si substrate was selectively etched and completely removed under the function of monocrystal GaAs functioned as an etch-stop material.

An etching rate of monocrystal GaAs with the etching solution was so extremely low as to be practically negligible, and thus the reduction of its thickness was slight.

That is, the monocrystal GaAs layer having a thickness of 1 μm could be formed on the Si substrate. The selective etching of the porous Si did not affect the monocrystal GaAs layer at all.

As a result of section observation by a transmission electron microscope, it was confirmed that additional crystal defects were not generated in the GaAs layer and good crystallinity was maintained.

EXAMPLE 54

A first p-type or n-type (100) monocrystal Si substrate having a thickness of 625 μm, a diameter of 5 inches and a specific resistance of 0.01 Ω.cm was subjected to anodization in an HF solution.

Anodization conditions were as follows:
Current density: 5 mA.cm$^{-2}$
Anodization solution: $HF:H_2O:C_2H_5OH = 1:1:1$
Time: 12 minutes
Thickness of porous Si: 10 μm
Porosity: 45%

This substrate was oxidized at 400° C. for 1 hour in an oxygen atmosphere, and owing to this oxidation, the inside walls of pores in the porous Si were covered with thermally oxidized films. On this porous Si, a monocrystal GaAs layer having a thickness of 0.3 μm was epitaxially grown by an MBE method.

Furthermore, an $SiO_2$ layer having a thickness of 500 nm was formed on this epitaxial Si layer by a CVD method.

The first substrate was superposed upon a second Si substrate so that the $SiO_2$ layer of the first substrate was brought into contact with the surface of the second substrate, and they were then subjected to an anodic bonding method at 800° C. to firmly bond both the substrates to each other.

Next, the first Si substrate was removed by grinding and polishing so as to remain as much as 5 μm, and the monocrystal Si substrate having a thickness of 10 μm was selectively etched with $1HF+10HNO_3+10CH_3COOH$ under the function of the porous Si layer in which the inside walls of the pores were oxidized, as an etch-stop layer. After 5 minutes, the first Si substrate was all etched, so that the porous Si layer was exposed.

Afterward, the oxide films on the pore inside walls in the porous Si layer were etched with hydrofluoric acid, and the porous Si was then etched with at 115° C. with ethylenediamine+pyrazine+water (in a ratio of 7.5 ml:2.4 g:2.4 ml). After 1 minute, monocrystal GaAs remained without etching, but the porous Si substrate was selectively etched and completely removed under the function of monocrystal GaAs as an etch-stop material.

An etching rate of monocrystal GaAs with the etching solution was so extremely low as to be practically negligible, and thus the reduction of its thickness was slight.

That is, the monocrystal GaAs layer having a thickness of 1 μm could be formed on the Si substrate. The selective etching of the porous Si did not affect the monocrystal GaAs layer at all.

As a result of section observation by a transmission electron microscope, it was confirmed that additional crystal defects were not generated in the GaAs layer and good crystallinity was maintained.

EXAMPLE 55

A first p-type or n-type (100) monocrystal Si substrate having a thickness of 625 μm, a diameter of 6 inches and a specific resistance of 0.01 Ω.cm was subjected to anodization in an HF solution.

Anodization conditions were as follows:
Current density: b 5 mA.cm$^{-2}$
Anodization solution: HF:H$_2$O:C$_2$H$_5$OH=1:1:1
Time: 12 minutes
Thickness of porous Si: 10 μm
Porosity: 45%

This substrate was oxidized at 400° C. for 1 hour in an oxygen atmosphere, and owing to this oxidation, the inside walls of pores in the porous Si were covered with thermally oxidized films. On this porous Si, a monocrystal GaAs layer having a thickness of 1 μm was epitaxially grown by an MOCVD (metal organic chemical vapor deposition) method. Growth conditions were as follows:

Source gas: TMG/AsH$_3$/H$_2$
Gas pressure: 80 Torr
Temperature: 700° C.

The first substrate was superposed upon a second Si substrate having a thermally oxidized film of 500 nm thick thereon so that the GaAs layer of the first substrate was brought into contact with the SiO$_2$ layer of the second substrate, and they were then subjected to a heat treatment at 900° C. for 1 hour to firmly bond both the substrates to each other. Next, the second Si substrate only of the bonded substrates was covered with Si$_3$N$_4$, and the first Si substrate was then etched with a 66HNO$_3$+34HF solution so as to remain as much as 10 μm. Afterward, the monocrystal Si substrate having a thickness of 10 μm was selectively etched with 1HF+20HNO$_3$+20CH$_3$COOH under the function of the porous Si layer in which the inside walls of the pores were oxidized, as an etch-stop layer. After 10 minutes, the first Si substrate was all etched, so that the porous Si layer was exposed.

Afterward, the oxide films on the pore inside walls in the porous Si layer were removed with hydrofluoric acid, and the porous Si was then etched at 110° C. with ethylenediamine+pyrocatechol+water (in a ratio of 17 ml:3 g:8 ml). After 1 minute, monocrystal GaAs remained without etching, but the porous Si substrate was selectively etched and completely removed under the function of monocrystal GaAs as an etch-stop material.

An etching rate of monocrystal GaAs with the etching solution was so extremely low as to be practically negligible, and thus the reduction of its thickness was slight.

That is, after the Si$_3$N$_4$ layer on the back surface was removed, the monocrystal GaAs layer having a thickness of 1 μm could be formed on the insulating substrate. The selective etching of the porous Si did not affect the monocrystal GaAs layer at all.

As a result of section observation by a transmission electron microscope, it was confirmed that additional crystal defects were not generated in the GaAs layer and good crystallinity was maintained.

EXAMPLE 56

A first p-type or n-type (100) monocrystal Si substrate having a thickness of 625 μm, a diameter of 5 inches and a specific resistance of 0.01 Ω.cm was subjected to anodization in an HF solution.

Anodization conditions were as follows:
Current density: 10 mA.cm$^{-2}$
Anodization solution: HF:H$_2$O:C$_2$H$_5$OH=1:1:1
Time: 24 minutes
Thickness of porous Si: 20 μm
Porosity: 47%

This substrate was oxidized at 400° C. for 2 hours in an oxygen atmosphere, and owing to this oxidation, the inside walls of pores in the porous Si were covered with thermally oxidized films. On this porous Si, a monocrystal AlGaAs layer having a thickness of 0.5 μm was epitaxially grown by an MBE (molecular beam epitaxy) method.

The first substrate was superposed upon a second Si substrate having a thermally oxidized film of 500 nm thick thereon so that the AlGaAs layer of the first substrate was brought into contact with the SiO$_2$ layer of the second substrate, and they were then subjected to a heat treatment at 800° C. for 2 hours to firmly bond both the substrates to each other.

Next, the second Si substrate only of the bonded substrates was covered with Si$_3$N$_4$, and the first Si substrate was then etched at 110° C. with ethylenediamine+pyrocatechol+water (in a ratio of 17 ml:3 g:8 ml) so as to remain as much as 10 μm. Afterward, the monocrystal Si substrate having a thickness of 10 μm was selectively etched with 1HF+40HNO$_3$+40CH$_3$COOH under the function of the porous Si layer in which the inside walls of the pores were oxidized, as an etch-stop layer. After 20 minutes, the first Si substrate was all etched, so that the porous Si layer was exposed.

Afterward, the porous Si layer was etched with a hydrofluoric acid solution. After 2 minutes, monocrystal AlGaAs remained without etching, but the porous Si substrate was selectively etched and completely removed under the function of monocrystal AlGaAs as an etch-stop material.

An etching rate of monocrystal AlGaAs with the etching solution was so extremely low as to be practically negligible, and thus the reduction of its thickness was slight.

That is, after the Si$_3$N$_4$ layer on the back surface was removed, the monocrystal AlGaAs layer having a thickness of 1 μm could be formed on the insulating substrate. The selective etching of the porous Si did not affect the monocrystal AlGaAs layer at all.

As a result of section observation by a transmission electron microscope, it was confirmed that additional crystal defects were not generated in the AlGaAs layer and good crystallinity was maintained.

EXAMPLE 57

A first p-type or n-type (100) monocrystal Si substrate having a thickness of 625 μm, a diameter of 6 inches and a specific resistance of 0.01 Ω.cm was subjected to anodization in an HF solution.

Anodization conditions were as follows:
Current density: 5 mA.cm$^{-2}$
Anodization solution: HF:H$_2$O:C$_2$H$_5$OH=1:1:1
Time: 24 minutes
Thickness of porous Si: 20 μm
Porosity: 45%

This substrate was oxidized at 400° C. for 2 hours in an oxygen atmosphere, and owing to this oxidation, the inside walls of pores in the porous Si were covered with thermally oxidized films. On this porous Si, a monocrystal GaP layer having a thickness of 2 μm was epitaxially grown by a liquid growth method.

The first substrate was superposed upon a second Si substrate having a thermally oxidized film of 500 nm thick thereon so that the GaP layer of the first substrate was brought into contact with the SiO$_2$ layer of the second substrate, and they were then subjected to an anodic bonding method at room temperature to strongly Join both the substrates together. Afterward, they were further subjected to a heat treatment at 700° C. for 2 hours to firmly bond both the substrates to each other.

Next, the second Si substrate only of the bonded substrates was covered with $Si_3N_4$, and the first Si substrate was then etched with a $66HNO_3+34HF$ solution so as to remain as much as 10 μm. Afterward, the monocrystal Si substrate having a thickness of 10 μm was selectively etched with 6M KOH under the function of the porous Si layer in which the inside walls of the pores were oxidized, as an etch-stop layer. After 10 minutes, the first Si substrate was all etched, so that the porous Si layer was exposed.

Afterward, the oxide films on the pore inside walls in the porous Si layer were removed with hydrofluoric acid, and the porous Si was then etched at 110° C. with ethylenediamine+pyrocatechol+water (in a ratio of 17 ml:3 g:8 ml). After 2 minutes, monocrystal GaP remained without etching, but the porous Si substrate was selectively etched and completely removed under the function of monocrystal GaP as an etch-stop material.

An etching rate of monocrystal GaP with the etching solution was so extremely low as to be practically negligible, and thus the reduction of its thickness was slight.

That is, after the $Si_3N_4$ layer on the back surface was removed, the monocrystal GaP layer having a thickness of 2 μm could be formed on the Si substrate. The selective etching of the porous Si did not affect the monocrystal GaP layer at all.

As a result of section observation by a transmission electron microscope, it was confirmed that additional crystal defects were not generated in the GaP layer and good crystallinity was maintained.

EXAMPLE 58

A first p-type or n-type (100) monocrystal Si substrate having a thickness of 525 μm, a diameter of 4 inches and a specific resistance of 0.01 Ω.cm was subjected to anodization in an HF solution.

Anodization conditions were as follows:
Current density: 5 mA.cm$^{-2}$
Anodization solution: $HF:H_2O:C_2H_5OH=1:1:1$
Time: 24 minutes
Thickness of porous Si: 20 μm
Porosity: 45%

This substrate was oxidized at 400° C. for 2 hours in an oxygen atmosphere, and owing to this oxidation, the inside walls of pores in the porous Si were covered with thermally oxidized films. On this porous Si, a monocrystal GaAs layer having a thickness of 1 μm was epitaxially grown by an MOCVD method.

The first substrate was superposed upon a second Si substrate having a thermally oxidized film of 500 nm thick thereon so that the GaAs layer of the first substrate was brought into contact with the $SiO_2$ layer of the second substrate, and they were then subjected to an anodic bonding method at 800° C. to join both the substrates together. Afterward, they were further subjected to a heat treatment to firmly bond both the substrates to each other.

Next, the first Si substrate was removed by grinding and polishing so as to remain as much as 10 μm, and the monocrystal Si substrate having a thickness of 10 μm was selectively etched at 110° C. with ethylenediamine+pyrocatechol+water (in a ratio of 17 ml:3 g:8 ml) under the function of the porous Si layer in which the inside walls of the pores were oxidized, as an etch-stop layer. After 15 minutes, the first Si substrate was all etched, so that the porous Si layer was exposed.

Afterward, the oxide films on the pore inside walls in the porous Si layer were removed with hydrofluoric acid, and the porous Si was then etched at 110° C. with ethylenediamine+pyrocatechol+water (in a ratio of 17 ml:3 g:8 ml). After 2 minutes, the monocrystal GaAs remained without etching, but the porous Si substrate was selectively etched and completely removed under the function of monocrystal GaAs functioned as an etch-stop material.

The etching rate of monocrystal GaAs with the etching solution was so extremely low as to be practicably negligible, and thus the reduction of its thickness was slight.

That is, the monocrystal GaAs layer having a thickness of 1 μm was formed on the insulating substrate. The selective etching of the porous Si did not affect the monocrystal GaAs layer at all.

As a result of section observation by a transmission electron microscope, it was confirmed that additional crystal defects were not generated in the GaAs layer and good crystallinity was maintained.

EXAMPLE 59

A first p-type or n-type (100) monocrystal Si substrate having a thickness of 625 μm, a diameter of 5 inches and a specific resistance of 0.01 Ω.cm was subjected to anodization in an HF solution.

Anodization conditions were as follows:
Current density: 5 mA.cm$^{-2}$
Anodization solution: $HF:H_2O:C_2H_5OH=1:1:1$
Time: 12 minutes
Thickness of porous Si: 10 μm
Porosity: 45%

This substrate was oxidized at 400° C. for 1 hour in an oxygen atmosphere, and owing to this oxidation, the inside walls of pores in the porous Si were covered with thermally oxidized films. On this porous Si, a monocrystal GaAs layer having a thickness of 0.3 μm was epitaxially grown by an MBE method.

Furthermore, an $SiO_2$ layer having a thickness of 500 nm was formed on this epitaxial Si layer by a CVD method.

The first substrate was superposed upon a second Si substrate having an $Si_3N_4$ film of 200 nm thick thereon so that the $SiO_2$ layer of the first substrate was brought into contact with the $Si_3N_4$ layer of the second substrate, and they were then subjected to an anodic bonding method at 800° C. to firmly bond both the substrates to each other.

Next, the first Si substrate was removed by grinding and polishing so as to remain as much as 5 μm, and the monocrystal Si substrate having a thickness of 10 μm was selectively etched with $1HF+10HNO_3+10CH_3COOH$ under the function of the porous Si layer in which the inside walls of the pores were oxidized, as an etch-stop layer. After 5 minutes, the first Si substrate was all etched, so that the porous Si layer was exposed.

Afterward, the oxide films on the pore inside walls in the porous Si layer were removed with hydrofluoric acid, and the porous Si was then etched at 115° C. with ethylenediamine+pyrazine+water (in a ratio of 7.5 ml:2.4 g:2.4 ml). After 1 minute, monocrystal GaAs remained without etching, but the porous Si substrate was selectively etched and completely removed under the function of monocrystal GaAs as an etch-stop material.

An etching rate of monocrystal GaAs with the etching solution was so extremely low as to be practicably negligible, and thus the reduction of its thickness was slight.

That is, the monocrystal GaAs layer having a thickness of 1 μm could be formed on the insulating substrate. The selective etching of the porous Si did not affect the monocrystal GaAs layer at all.

As a result of section observation by a transmission electron microscope, it was confirmed that additional crystal defects were not generated in the GaAs layer and good crystallinity was maintained.

EXAMPLE 60

A first p-type or n-type (100) monocrystal Si substrate having a thickness of 625 μm, a diameter of 6 inches and a specific resistance of 0.01 Ω.cm was subjected to anodization in an HF solution.

Anodization conditions were as follows:
Current density: 5 mA.cm$^{-2}$
Anodization solution: HF:H$_2$O:C$_2$H$_5$OH=1:1:1
Time: 12 minutes
Thickness of porous Si: 10 μm
Porosity: 45%

This substrate was oxidized at 400° C. for 1 hour in an oxygen atmosphere, and owing to this oxidation, the inside walls of pores in the porous Si were covered with thermally oxidized films. On this porous Si, a monocrystal GaAs layer having a thickness of 1 μm was epitaxially grown by an MOCVD (metal organic chemical vapor deposition) method. Growth conditions were as follows:

Source gas: TMG/AsH$_3$/H$_2$
Gas pressure: 80 Torr
Temperature: 700° C.

The first substrate was superposed upon another fused silica substrate so that the GaAs layer of the first substrate was brought into contact with the surface of the silica substrate, and they were then subjected to a heat treatment at 400° C. for 2 hours to firmly bond both the substrates to each other.

Next, the fused silica substrate only of the bonded substrates was covered with Si$_3$N$_4$, and the first Si substrate was then etched with a 66HNO$_3$+24HF solution so as to remain as much as 10 μm. Afterward, the monocrystal Si substrate having a thickness of 10 μm was selectively etched with 1HF+20HNO$_3$+20CH$_3$COOH under the function of the porous Si layer in which the inside of the pores were oxidized, as an etch-stop layer. After 10 minutes, the first Si substrate was all etched, so that the porous Si layer was exposed.

Afterward, the oxide films on the pore inside walls in the porous Si layer were removed with hydrofluoric acid, and the porous Si was then etched at 110° C. with ethylenediamine+pyrocatechol+water (in a ratio of 17 ml:3 g:8 ml). After 1 minute, monocrystal GaAs remained without etching, but the porous Si substrate was selectively etched and completely removed under the function of monocrystal GaAs as an etch-stop material.

An etching rate of monocrystal GaAs with the etching solution was so extremely low as to be practicably negligible, and thus the reduction of its thickness was slight.

After the etching mask on the back surface was removed, a heat treatment was carried out at 900° C. for 30 minutes to reinforce the bonding strength.

That is, the monocrystal GaAs layer having a thickness of 1 μm was formed on the fused silica substrate. The selective etching of the porous Si did not affect the monocrystal GaAs layer at all.

As a result of section observation by a transmission electron microscope, it was confirmed that additional crystal defects were not generated in the GaAs layer and good crystallinity was maintained.

EXAMPLE 61

A first p-type or n-type (100) monocrystal Si substrate having a thickness of 625 μm, a diameter of 5 inches and a specific resistance of 0.01 Ω.cm was subjected to anodization in an HF solution.

Anodization conditions were as follows:
Current density: 10 mA.cm$^{-2}$
Anodization solution: HF:H$_2$O:C$_2$H$_5$OH=1:1:1
Time: 24 minutes
Thickness of porous Si: 20 μm
Porosity: 47%

This substrate was oxidized at 400° C. for 2 hours in an oxygen atmosphere, and owing to this oxidation, the inside walls of pores in the porous Si were covered with thermally oxidized films. On this porous Si, a monocrystal AlGaAs layer having a thickness of 0.5 μm was epitaxially grown by an MBE (molecular beam epitaxy) method.

The first substrate was superposed upon a glass substrate having a softening point of about 800° C. so that the AlGaAs layer of the first substrate was brought into contact with the surface of the glass substrate, and they were then subjected to a heat treatment at 300° C. for 2 hours to firmly bond both the substrates to each other.

Next, the glass substrate only of the bonded substrates was covered with Si$_3$N$_4$, and the first Si substrate was then etched at 110° C. with ethylenediamine+pyrocatechol+water (in a ratio of 17 ml:3 g:8 ml) so as to remain as much as 10 μm. Afterward, the monocrystal Si substrate having a thickness of 10 μm was selectively etched with 1HF+40HNO$_3$+40CH$_3$COOH under the function of the porous Si layer in which the inside walls of the pores were oxidized, as an etch-stop layer. After 20 minutes, the first Si substrate was all etched, so that the porous Si layer was exposed.

Afterward, the porous Si layer was etched with a hydrofluoric acid solution. After 2 minutes, monocrystal AlGaAs remained without etching, but the porous Si substrate was selectively etched and completely removed under the function of monocrystal AlGaAs as an etch-stop material.

An etching rate of monocrystal AlGaAs with the etching solution was so extremely low as to be practicably negligible, and thus the reduction of its thickness was slight.

After the etching mask on the back surface was removed, a heat treatment was carried out at 900° C. for 30 minutes to build up the bonding strength.

That is, the monocrystal AlGaAs layer having a thickness of 1 μm was formed on the glass substrate. The selective etching of the porous Si did not affect the monocrystal AlGaAs layer at all.

As a result of section observation by a transmission electron microscope, it was confirmed that additional crystal defects were not generated in the AlGaAs layer and good crystallinity was maintained.

EXAMPLE 62

A first p-type or n-type (100) monocrystal Si substrate having a thickness of 625 μm, a diameter of 6 inches and a specific resistance of 0.01 Ω.cm was subjected to anodization in an HF solution.

Anodization conditions were as follows:
Current density: 5 mA.cm$^{-2}$
Anodization solution: HF:H$_2$O:C$_2$H$_5$OH=1:1:1
Time: 24 minutes
Thickness of porous Si: 20 μm
Porosity: 45%

This substrate was oxidized at 400° C. for 2 hours in an oxygen atmosphere, and owing to this oxidation, the inside walls of pores in the porous Si were covered with thermally oxidized films. On this porous Si, a monocrystal GaP layer having a thickness of 2 μm was epitaxially grown by a liquid growth method.

The first substrate was superposed upon a glass substrate having a softening point of about 500° C. and having SiO$_2$/Si$_3$N$_4$ thereon so that the GaP layer of the first substrate was brought into contact with the SiO$_2$ surface of the glass substrate, and they were then subjected to an anodic bonding method at room temperature to strongly Join both the substrates together. Afterward, they were further subjected to a heat treatment at 200° C. for 2 hours to firmly bond both the substrates to each other.

Next, the glass substrate only of the bonded substrates was covered with Si$_3$N$_4$, and the first Si substrate was then etched with a 66HNO$_3$+34HF solution so as to remain as much as 10 μm. Afterward, the monocrystal Si substrate having a thickness of 10 μm was selectively etched with 6M KOH under the function of the porous Si layer in which the inside walls of the pores were oxidized, as an etch-stop layer. After 10 minutes, the first Si substrate was all etched, so that the porous Si layer was exposed.

Afterward, the oxide films on the pore inside walls in the porous Si layer were removed with hydrofluoric acid, and the porous Si was then etched at 110° C. with ethylenediamine+pyrocatechol+water (in a ratio of 17 ml:3 g:8 ml). After 2 minutes, monocrystal GaP remained without etching, but the porous Si substrate was selectively etched and completely removed under the function of monocrystal GaP as an etch-stop material.

An etching rate of monocrystal GaP with the etching solution was so extremely low as to be practicably negligible, and thus the reduction of its thickness was slight.

After the etching mask on the back surface was removed, a heat treatment was carried out at 700° C. for 30 minutes to reinforce the bonding strength.

That is, the monocrystal GaP layer having a thickness of 2 μm was formed on the glass substrate. The selective etching of the porous Si did not affect the monocrystal GaP layer at all.

As a result of section observation by a transmission electron microscope, it was confirmed that additional crystal defects were not generated in the GaP layer and good crystallinity was maintained.

EXAMPLE 63

A first p-type or n-type (100) monocrystal Si substrate having a thickness of 525 μm, a diameter of 4 inches and a specific resistance of 0.01 Ω.cm was subjected to anodization in an HF solution.

Anodization conditions were as follows:
Current density: 5 mA.cm$^{-2}$
Anodization solution: HF:H$_2$O:C$_2$H$_5$OH=1:1:1
Time: 24 minutes
Thickness of porous Si: 20 μm
Porosity: 45%

This substrate was oxidized at 400° C. for 2 hours in an oxygen atmosphere, and owing to this oxidation, the inside walls of pores in the porous Si were covered with thermally oxidized films. On this porous Si, a monocrystal GaAs layer having a thickness of 1 μm was epitaxially grown by an MOCVD method.

The first substrate was superposed upon a fused silica substrate so that the GaAs layer of the first substrate was brought into contact with the surface of the silica substrate, and they were then subjected to an anodic bonding method at 400° C. to bond both the substrates to each other.

Next, the first Si substrate was removed by grinding and polishing so as to remain as much as 10 μm, and the fused silica substrate only of the bonded substrates was then covered with Si$_3$N$_4$. Afterward, the monocrystal Si substrate having a thickness of 10 μm was selectively etched at 110° C. with ethylenediamine+pyrocatechol+water (in a ratio of 17 ml:3 g:8 ml) under the function of the porous Si layer in which the inside walls of the pores were oxidized, as an etch-stop layer. After 15 minutes, the first Si substrate was all etched, so that the porous Si layer was exposed.

Afterward, the oxide films on the pore inside walls in the porous Si layer were removed with hydrofluoric acid, and the porous Si was then etched at 110° C. with ethylenediamine+pyrocatechol+water (in a ratio of 17 ml:3 g:8 ml). After 2 minutes, monocrystal GaAs remained without etching, but the porous Si substrate was selectively etched and completely removed under the function of monocrystal GaAs functioned as an etch-stop material.

An etching rate of monocrystal GaAs with the etching solution was so extremely low as to be practicably negligible, and thus the reduction of its thickness was slight.

After the etching mask on the back surface was removed, a heat treatment was carried out at 800° C. for 30 minutes to reinforce the bonding strength.

That is, the monocrystal GaAs layer having a thickness of 1 μm was formed on the fused silica substrate. The selective etching of the porous Si did not affect the monocrystal GaAs layer at all.

As a result of section observation by a transmission electron microscope, it was confirmed that additional crystal defects were not generated in the GaAs layer and good crystallinity was maintained.

EXAMPLE 64

A first p-type or n-type (100) monocrystal Si substrate having a thickness of 625 μm, a diameter of 5 inches and a specific resistance of 0.01 Ω.cm was subjected to anodization in an HF solution.

Anodization conditions were as follows:
Current density: 5 mA.cm$^{-2}$
Anodization solution: HF:H$_2$O:C$_2$H$_5$OH=1:1:1
Time: 12 minutes
Thickness of porous Si: 10 μm
Porosity: 45%

This substrate was oxidized at 400° C. for 1 hour in an oxygen atmosphere, and owing to this oxidation, the inside walls of pores in the porous Si were covered with thermally oxidized films. On this porous Si, a monocrystal GaAs layer having a thickness of 0.3 μm was epitaxially grown by an MBE method.

Furthermore, an SiO$_2$ layer having a thickness of 500 nm was formed on this epitaxial Si layer by a CVD method.

The first substrate was superposed upon a fused silica substrate so that the SiO$_2$ layer of the first substrate was brought into contact with the surface of the silica substrate, and they were then subjected to an anodic bonding method at 300° C. to firmly bond both the substrates to each other.

Next, the first Si substrate was removed by grinding and polishing so as to remain as much as 5 μm, and the fused silica substrate only of the bonded substrates was then covered with Si$_3$N$_4$. Afterward, the monocrystal Si substrate having a thickness of 10 μm was selectively etched with 1HF+10HNO$_3$+10CH$_3$COOH under the function of the porous Si layer in which the inside walls of the pores were oxidized, as an etch-stop layer. After 5 minutes, the first Si substrate was all etched, so that the porous Si layer was exposed.

Afterward, the oxide films on the pore inside walls in the porous Si layer were etched with hydrofluoric acid, and the porous Si was then etched with at 115° C. with ethylenediamine+pyrazine+water (in a ratio of 7.5 ml:2.4 g:2.4 ml). After 1 minute, monocrystal GaAs remained without etching, but the porous Si substrate was selectively etched and completely removed under the function of monocrystal GaAs as an etch-stop material.

An etching rate of monocrystal GaAs with the etching solution was so extremely low as to be practicably negligible, and thus the reduction of its thickness was slight.

After the etching mask on the back surface was removed, a heat treatment was carried out at 900° C. for 30 minutes to reinforced the bonding strength.

That is, after the Si$_3$N$_4$ layer on the back surface was removed, the monocrystal GaAs layer having a thickness of 1 μm could be formed on the fused silica substrate. The selective etching of the porous Si did not affect the monocrystal GaAs layer at all.

As a result of section observation by a transmission electron microscope, it was confirmed that additional crystal defects were not generated in the GaAs layer and good crystallinity was maintained.

What is claimed is:

1. A method for preparing a semiconductor substrate which comprises the steps of forming a monocrystal compound semiconductor thin film on a porous monocrystal semiconductor substrate via a semiconductor monocrystal thin film of the same material as said porous monocrystal, thereby preparing a first member, bonding a second member to said monocrystal compound semiconductor thin film of said first member via an insulating layer having a thermal expansion coefficient in the range of 60%–140% of the thermal expansion coefficient of said monocrystal compound semiconductor, and then removing said porous monocrystal and said monocrystal thin film of the same material as said porous monocrystal by etching.

2. A method for preparing a semiconductor substrate which comprises porousifying a surface layer on at least a surface side of a first Si substrate, oxidizing the inside walls of the pores of the porous Si layer, forming a monocrystal compound semiconductor layer on said porous Si layer, bonding the surface of said monocrystal compound semiconductor layer to a surface of a second substrate other than said first Si substrate, a first etching step of removing said first Si substrate by selective etching after said bonding step, and a second etching step of removing the exposed porous Si layer by selective etching with an etching solution having a high Si etching rate to said compound semiconductor after said first etching step.

3. The method for preparing a semiconductor substrate according to claim 2, wherein said second substrate comprises an Si substrate.

4. The method for preparing a semiconductor substrate according to claim 2, wherein said second substrate is an Si substrate on which an insulating layer is formed.

5. The method for preparing a semiconductor substrate according to claim 2, wherein said second substrate is a light-transmissive substrate.

6. The method for preparing a semiconductor substrate according to claim 2, wherein said oxidizing step of said porous Si layer is carried out by at least one of thermal oxidation, spontaneous oxidation in the atmosphere, and oxidation in a washing step.

7. A method for preparing a semiconductor substrate which comprises the steps of: forming a monocrystal III–V group compound semiconductor thin film on a porous monocrystal semiconductor substrate via a semiconductor monocrystal thin film of the same material of said porous monocrystal, thereby preparing a first member, bonding a second member to said monocrystal III–V group compound semiconductor thin film of said first member via an insulating layer having a thermal expansion coefficient in the range of 60%–140% of the thermal expansion coefficient of said monocrystal III–V group compound semiconductor, and then removing said porous monocrystal and said monocrystal thin film of the same material as said porous monocrystal by etching.

8. A method for preparing a semiconductor substrate which comprises:
   (a) preparing a first Si substrate having a surface which comprises a porous layer;
   (b) forming a monocrystal compound semiconductor layer on said porous layer;
   (c) bonding the surface of said monocrystal compound semiconductor layer to a surface of a second substrate; and
   (d) removing said porous layer from said bonded substrate by etching.

9. The method for preparing a semiconductor substrate according to claim 8, wherein said second substrate comprises a Si substrate.

10. The method for preparing a semiconductor substrate according to claim 8, wherein said second substrate is a Si substrate on which an insulating layer is formed.

11. The method for preparing a semiconductor substrate according to claim 8, wherein said second substrate is a light-transmissive substrate.

12. A method for preparing a semiconductor substrate which comprises:
   (a) preparing a first Si substrate having a surface which comprises a porous layer;
   (b) forming a monocrystal compound semiconductor layer on said porous layer;
   (c) bonding the surface of said monocrystal compound semiconductor layer to a surface of a second substrate with an insulating layer provided therebetween; and (d) removing said porous layer from said bonded substrate by etching.

13. The method for preparing a semiconductor substrate according to claim 12, wherein said second substrate comprises a Si substrate.

14. The method for preparing a semiconductor substrate according to claim 12, wherein said second substrate is a Si substrate on which an insulating layer is formed.

15. The method for preparing a semiconductor substrate according to claim 12, wherein said second substrate is a light-transmissive substrate.

* * * * *

UNITED STATES PATENT AND TRADEMARK OFFICE
CERTIFICATE OF CORRECTION

PATENT NO. : 5,439,843

DATED : August 8, 1995

INVENTOR : KIYOFUMI SAKAGUCHI, ET AL.

It is certified that errors appear in the above-identified patent and that said Letters Patent is hereby corrected as shown below:

On the title page:

[56] References Cited

U.S. Patent Documents, "5,010,033 4/1991 Tokunaga et al." (second occurrence) should be deleted.

COLUMN 1

Line 39, "made about" should be deleted; and

Line 59, "Attempt" should read --Attempts--.

COLUMN 3

Line 33, "a" should be deleted.

COLUMN 5

Line 46, "sented" should read --sented by--.

COLUMN 6

Line 12, "$Al_xGa_{1-x}As,$ layer" should read --$Al_xGa_{1-x}As$ layer,--.

COLUMN 7

Line 20, "to" should be deleted.

COLUMN 12

Line 4, "Grown" should read --grown--;

Line 5, "Growth" should read --growth--; and

UNITED STATES PATENT AND TRADEMARK OFFICE
CERTIFICATE OF CORRECTION

PATENT NO. : 5,439,843

DATED : August 8, 1995

INVENTOR : KIYOFUMI SAKAGUCHI, ET AL.

It is certified that errors appear in the above-identified patent and that said Letters Patent is hereby corrected as shown below:

COLUMN 12, Cont'd.

Line 67, "an" should read --a--.

COLUMN 13

Line 49, "n" should read --a--.

COLUMN 14

Line 62, "an" should read --a--.

COLUMN 16

Line 16, "an" should read --a--; and

Line 59, "an" should read --a--.

COLUMN 19

Line 27, "Generated" should read --generated--; and

Line 28, "Good" should read --good--.

COLUMN 20

Line 17, "layer" should read --layer,--;

Line 24, "of" should be deleted; and

Line 25, "both" should read --both of--.

UNITED STATES PATENT AND TRADEMARK OFFICE
CERTIFICATE OF CORRECTION

PATENT NO. : 5,439,843

DATED : August 8, 1995

INVENTOR : KIYOFUMI SAKAGUCHI, ET AL.

It is certified that errors appear in the above-identified patent and that said Letters Patent is hereby corrected as shown below:

COLUMN 29

Line 27, "Generated" should read --generated--; and

Line 28, "Good" should read --good--.

COLUMN 39

Line 58, "from" should read --form--.

COLUMN 40

Line 49, "Generated" should read --generated--; and

Line 50, "Good" should read --good--.

COLUMN 41

Line 1, "Grown" should read --grown--.

COLUMN 42

Line 55, "Join" should read --join--.

COLUMN 43

Line 63, "functioned" should read --functioning--.

COLUMN 45

Line 4, "b" should be deleted; and

Line 33, ".in" should read --in--.

UNITED STATES PATENT AND TRADEMARK OFFICE
CERTIFICATE OF CORRECTION

PATENT NO. : 5,439,843

DATED : August 8, 1995

INVENTOR : KIYOFUMI SAKAGUCHI, ET AL.

Page 4 of 4

It is certified that errors appear in the above-identified patent and that said Letters Patent is hereby corrected as shown below:

<u>COLUMN 47</u>

Line 3, "Join" should read --join--.

<u>COLUMN 51</u>

Line 25, "Join" should read --join--.

Signed and Sealed this

Nineteenth Day of December, 1995

Attest:

BRUCE LEHMAN

*Attesting Officer*  *Commissioner of Patents and Trademarks*